United States Patent
Ide et al.

(10) Patent No.: US 7,903,492 B2
(45) Date of Patent: *Mar. 8, 2011

(54) SEMICONDUCTOR DEVICE

(75) Inventors: Akira Ide, Tokyo (JP); Yasuhiro Takai, Tokyo (JP); Tomonori Sekiguchi, Tama (JP); Riichiro Takemura, Los Angeles, CA (US); Satoru Akiyama, Sagamihara (JP); Hiroaki Nakaya, Kokubunji (JP)

(73) Assignee: Elpida Memory, Inc., Tokyo (JP)

( * ) Notice: Subject to any disclaimer, the term of this patent is extended or adjusted under 35 U.S.C. 154(b) by 77 days.

This patent is subject to a terminal disclaimer.

(21) Appl. No.: 12/314,860

(22) Filed: Dec. 17, 2008

(65) Prior Publication Data

US 2009/0180341 A1 Jul. 16, 2009

(30) Foreign Application Priority Data

Dec. 18, 2007 (JP) ................................. 2007-326220

(51) Int. Cl.
*G11C 7/00* (2006.01)
(52) U.S. Cl. .................... 365/222; 365/185.25; 365/203; 365/233.11
(58) Field of Classification Search .................. 365/222, 365/185.25, 203, 233.11; 327/276, 153
See application file for complete search history.

(56) References Cited

U.S. PATENT DOCUMENTS

| | | | |
|---|---|---|---|
| 2009/0066390 A1* | 3/2009 | Ide et al. | 327/276 |
| 2009/0102524 A1* | 4/2009 | Ide et al. | 327/153 |

OTHER PUBLICATIONS

K. Gotoh et al., "All-Digital Multi-Phase Delay Locked Loop for Internal Timing Generation in Embedded and/or High-Speed DRAMs," 1997 Symposium on VLSI Circuits Digest of Technical Papers, pp. 107-108.

* cited by examiner

*Primary Examiner* — Hoai V Ho
*Assistant Examiner* — Jason Lappas
(74) *Attorney, Agent, or Firm* — Foley & Lardner LLP

(57) ABSTRACT

Disclosed is a semiconductor device including a first clock generator that generates a first clock signal having a first period from an input clock signal, a second clock generator that generates a second clock signal having a second period from the input clock signal, and a timing generator that receives the first clock signal, the second clock signal, an activation signal from a command decoder and a selection signal for selecting the delay time from a timing register to produce a timing signal delayed as from activation of the activation signal by a delay equal to a sum of a time equal to a preset number m prescribed by the selection signal times the first period and a time equal to another preset number n prescribed by the selection signal times the second period. The timing register holds the values of m and n. These values are set in the timing register in an initialization sequence at the time of a mode register set command. In the operating states, the timing signals are output from the timing generator at a desired timing based on the information stored in the timing register (FIG. 6).

20 Claims, 38 Drawing Sheets

FIG.15A

| tRCD | PDLEQ | PMWL | PSAN |
|---|---|---|---|
| reserved | N/A | N/A | N/A |
| 4 | 1.0 | 1.9 | 4.3 |
| 5 | 1.1 | 2.0 | 4.4 |
| 6 | 1.2 | 2.1 | 4.5 |
| 7 | 1.3 | 2.2 | 4.6 |
| 8 | 1.4 | 2.3 | 4.7 |
| 9 | 1.5 | 2.4 | 4.8 |
| reserved | N/A | N/A | N/A |

FIG.15B

| tRP | PDLEQ | PMWL | PSAN |
|---|---|---|---|
| reserved | N/A | N/A | N/A |
| 4 | 3.1 | 1.1 | 2.3 |
| 5 | 3.2 | 1.2 | 2.4 |
| 6 | 3.3 | 1.3 | 2.5 |
| 7 | 3.4 | 1.4 | 2.6 |
| 8 | 3.5 | 1.5 | 2.7 |
| 9 | 3.6 | 1.6 | 2.8 |
| reserved | N/A | N/A | N/A |

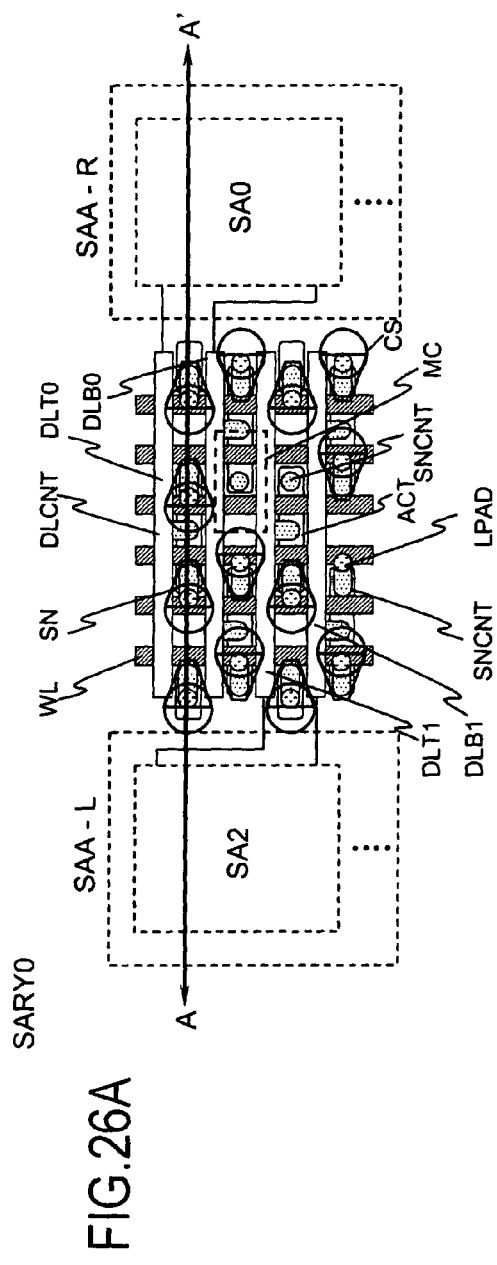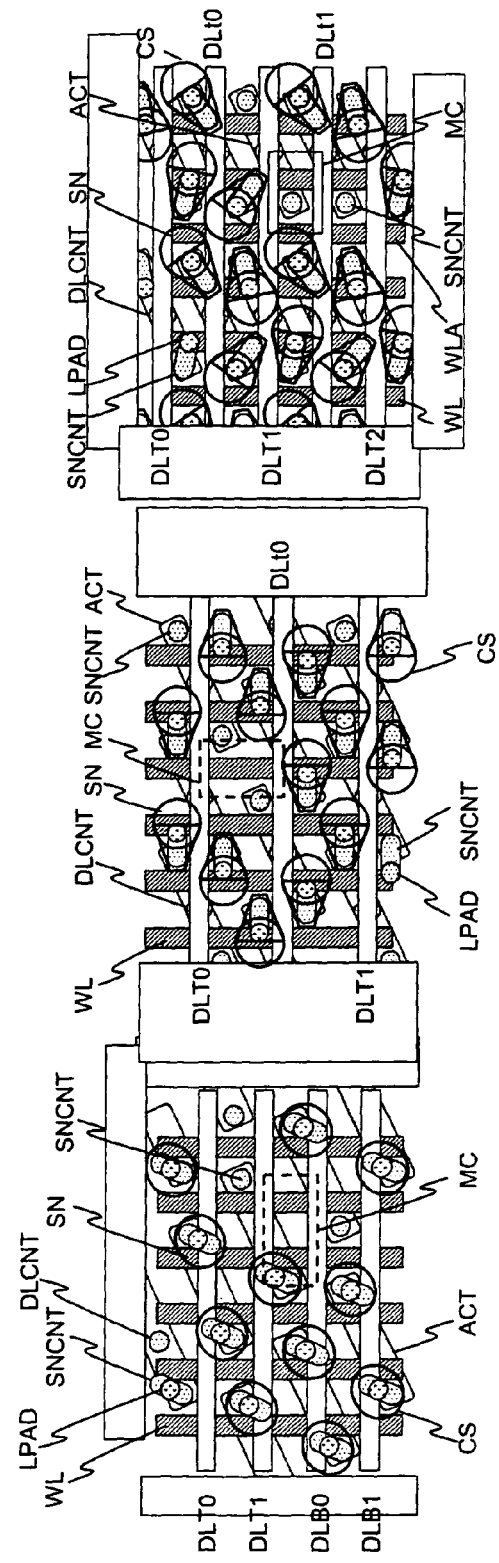
FIG.26A
FIG.26B
FIG.26C
FIG.26D

FIG. 34A RELATED ART Worst case

FIG. 34B RELATED ART Best case

SEMICONDUCTOR DEVICE

REFERENCE TO RELATED APPLICATION

This application is based upon and claims the benefit of the priority of Japanese patent application No. 2007-326220 filed on Dec. 18, 2007, the disclosure of which is incorporated herein in its entirety by reference thereto.

FIELD OF THE INVENTION

This invention relates to a semiconductor device. More particularly, it relates to timing control within a chip of a semiconductor memory of high speed and high integration or a chip of a semiconductor device integrated from a logic circuit and a semiconductor memory.

DESCRIPTION OF RELATED ART

A large number of dynamic random access memories (Dynamic Random Access Memories, abbreviated below to DRAMs), are mounted in a wide variety of electronic equipments. In keeping up with recent needs to low power consumption and to high performance of electronic equipments, there is a strong demand for high performance, such as low power consumption, high operating speed and large capacity of DRAMs mounted on the equipment.

One of means most effective for realization of a high performance DRAM is memory cell miniaturization. The memory cell may be made smaller in size by miniaturization, as a result of which the length of a word line and data line connected to the memory cell may be reduced. That is, parasitic capacitances of the word line and data line may be reduced, thus assuring low voltage operation and low power consumption. Thus, the memory cell miniaturization greatly contributes to the improvement of the DRAM performance.

However, as the memory cell miniaturization advances through 65 nm nodes and 45 nm nodes, a variety of side effects come out, even though the aforementioned merits of higher performance may be achieved. The principal side effect is increased variations of device characteristics incurred by miniaturization. These variations in the device characteristics may be exemplified by variations in a threshold voltage of a transistor and increased variances (deviation from an average value) of the value of a leakage current flowing from a transistor. These variations in the device characteristics deteriorate the operating performance of DRAMs and hence are desirably suppressed to as low a value as possible.

In particular, variations in a threshold voltage of a transistor may cause shifting of a trigger timing of a control signal within a DRAM chip. This shifting in a trigger timing of a control signal may, in turn, cause mistaken operations of the DRAMs. That is, the variations in the threshold voltage value severely affect the yield of the chip.

The reason for this is now explained with reference to FIGS. 31 to 34. FIG. 31 shows, in a block diagram, certain illustrative control signal generating circuits for a DRAM. Specifically, the blocks shown in FIG. 31 are a command decoder, a row system control circuit (Row Control), a row decoder (RDEC) and a memory cell array. The command decoder receives a chip select signal /CS, a row address strobe signal /RAS, a column address strobe signal /CAS, a write enable signal /WE and an address signal, not shown, to decode a command. The row system control circuit includes array logic circuits (AL0, AL1 and AL2) and analog delays (ADLY0, ADLY1 and ADLY2), and the row decoder includes an array control (ARAC), a main word driver (MWD), and a sense amplifier controller (SACTL).

The array logic circuits (AL0, AL1, AL2) output a precharge timing signal RDLEQ, a word line timing signal RMWL and a sense amplifier timing signal RSAN, respectively. The array control (ARAC), main word driver (MWD) and sense amplifier control (SACTL) output a precharge timing signal ADLEQ, a word line timing signal AMWL and a sense amplifier timing signal ASAN to the memory cell array, respectively.

Read is taken as an example for explanation. When command signals (/CS, /RAS, /CAS and /WE) and an address are delivered to a DRAM, an operation and an address are determined by the command decoder.

In FIG. 31, the bank active signal PACTV is decoded. The decoded signal is delivered to the array logic (AL0) where the precharge timing signal RDLEQ is activated. The bank active signal PACTV, entered to the array logic AL0, is delivered via the analog delay (ADLY0) to the array logic (AL1).

The analog delay (ADLY0) is used for adjusting the timing of the deactivation of the precharge timing signal RDLEQ and the start time of the word line timing signal RMWL. That is, the delay time of the analog delay (ADLY0) is adjusted so that the word line of the memory cell array will be activated substantially simultaneously as the completion of the deactivation of the precharging circuit, not shown, such as to control the outputting timing of the word line timing signal RMWL.

In similar manner, the sense amplifier timing signal RSAN is output as the delay time of the analog delay (ADLY1) is adjusted so that the sense amplifier circuit, not shown, will be activated at the same time as the selected word line of the memory cell array is activated and a readout signal has been sufficiently delivered on the data line. The timing signals, output from the array logic circuits (AL0, AL1, AL2), are delivered via a circuit within the row decoder (RDEC) to the memory array (Memory Cell Array). Since the operating timing within the DRAM is adjusted by the delay in the analog delay circuit, as described above, the performance of the access time of the DRAM is mainly determined by the adjustment of delay time of the analog delay. That, is, the DRAM access time is varied with variations in the delay time of the analog delay.

[Non-Patent Publication 1] Kohtaro Goto, Shigetoshi Wakayama, Miyoshi Saito, Junji Ogawa, Hirotaka Tamura, Yoshinori Okajima and Masao Taguchi, 'All-Digital Multi-Phase Delay Locked Loop for Internal Timing Generation in Embedded and/or High-Speed DRAMs', 1997 Symposium on VLSI Circuits Digest of Technical Papers pp. 107-108

Relating to most-advanced DRAMs, miniaturization and use of lower voltages are proceeding rapidly. Variations in device characteristics pose a serious problem as a result of recent progress in the use of lower voltage as external power supplies and due to manufacture tolerances of MOS transistors or interconnects in an LSI brought about by miniaturization.

SUMMARY OF THE DISCLOSURE

A circuit configuration of the analog delay (ADLY), discussed above, is shown in FIG. 32A, in which there is shown a circuit composed of a plurality of inverters connected in cascade.

FIG. 32B shows, as relative values, the values derived by simulation under a variety of conditions of the delay (td) of the analog delay (ADLY) of FIG. 32A. In FIG. 32B, Low-voltage and High-voltage represent cases of variations to higher values and to lower values of the operating voltage, respectively, and slow/fast represent cases of higher and lower values of the transistor threshold values, respectively. High temp/Low temp represent cases of a higher operating temperature and a lower operating temperature, respectively.

Referring to FIG. 32B, the combination of Low-voltage, slow and High temp, for example, is correlated with the delay for the case of variations of the operating voltage in a low range of voltage values, high threshold voltage of a MOS transistor, and the high operating temperature. The delay (td) of the analog delay (ADLY) is then increased.

The combination of the High voltage, fast and Low temp is correlated with the delay for the case of variations of the operating voltage in a high range of voltage values, low threshold voltages of a MOS transistor, and the low operating temperature. The delay (td) of the analog delay (ADLY) is then decreased. Other combinations may be surmised from the graph.

As may be seen from FIG. 32B, the longest delay (maximum delay) is approximately twice the shortest delay (minimum delay) in the analog delay (ADLY). In case the delay is varied that much in the delay circuit within the synchronous DRAM, the access time is increased.

FIG. 33B shows the operating timing of a circuit block under the condition of the fastest operation of a circuit within a synchronous DRAM (best case).

In this figure, the operating timings of the command decoder, row system control circuit (Row Control), row decoder (RDEC) and the memory array are plotted on the abscissa. In the drawing, the hatched portions represent the analog delay time.

As described above, the analog delay ADLY0 is an adjustment circuit for making adjustment so that deactivation of a precharging circuit and word line activation will occur at approximately the same time. That is, the analog delay adjusts the precharge-word line margin tDEQWLM_B so that it will be of a necessary minimum value. In similar manner, the delay time of the analog delay ADLY1 is adjusted so that the outputting of the read signal will occur approximately at the same time as activation of the sense amplifier circuit. That is, adjustment id made so that the word line-sense amplifier margin tWLSAM_B will be of a necessary minimum value. Timing designing is made in this manner so that the timing margin between respective timing signals will be reduced to as small a value as possible to provide for short access time.

FIG. 33A shows the operating timing of a circuit block under a condition of the slowest operation of the internal circuit of the DRAM in case the circuit design has been carried out as delay time is set on the best case side as discussed in the foregoing (worst case).

In the worst case, not only the operating time of the command decoder, row system control circuit, row decoder and the memory array, but also the delay time of the analog delay circuit (ADLY0, ADLY1) is increased. Noteworthy is the fact that there are cases where increase in the delay time of the analog delay is greater than increase in the operating timing of each circuit block.

In this case, wasteful margin (delay time) is produced in precharge—word line margin tDEQWLM_W (timing margin between the bit line equalize signal BLEQ and the word line timing signal AMWL) and word line—sense amplifier margin tWLSAM_W (timing margin between the word line SWL and the sense amplifier timing signal ASAN), in addition to delay in the DRAM circuit block. That is, the intrinsic performance of the circuit and device is not exploited, with the result that the access specifications of the DRAM are deteriorated.

If conversely the circuit designing is made as the delay time is determined on the worst case side and the DRAM chip is run on the best case side, read errors are produced in similar manner due to variations in the analog delay. The reason therefor is now explained with reference to FIG. 34.

FIG. 34A shows certain operating waveforms within the memory array in case timing designing is made on the worst case side. A precharge signal DLEQL associated with a selected memory cell is deactivated at approximately the same time as a shared switch line SHHR associated with the non-selected memory array is negated. On the other hand, a shared switch line SHRL, associated with the selected memory array, is at the VPP level. The shared switch lines SHHR, SHRL are control signal lines that control the transfer gates on or off. These shared switch lines are shown in FIGS. 23, 25 which will be referred to later.

A word line WL0 is then selected, and a potential difference is generated across data line pair DLT and DLB. If, at this time, a necessary sufficient potential difference is generated between the paired data lines DLT and DLB, the delay time of the analog delay (ADLY1) of FIG. 31 is adjusted so that sense amplifier activation signals ASAN, ASAP1B will be asserted, that is, so that the word line-sense amplifier margin tWLSAM_W will be of a necessary minimum value.

FIG. 34B shows a waveform for the case in which a chip with the timing designing on the worst case side is run on the best case side.

In the case of marked variations in the analog delay, a sense amplifier activation signal is initiated before a read signal is sufficiently output to the data line pair, as discussed above. If an offset voltage of a sense amplifier circuit (variations in the threshold voltages of the transistor pair that makes up a sense amplifier circuit) is greater than the readout signal amount at the time point the sense amplifier activation signals ASAN and ASAP1B are initiated, data is inverted erroneously, thus producing a read error.

With the timing control system, employing the conventional analog delay circuit, there is a risk of generation of timing errors due to increase in device variations.

To eliminate this problem, an example of applying a digital delay circuit to a memory circuit has so far been reported. A digital delay circuit means circuitry that generates, using a clock and a multi-phase clock, obtained on frequency division of the clock, a delay having a duration equal to an integer number times the period of the multi-phase clock.

The use of the digital delay circuit gives rise to a merit that, since the delay determined by the period of the clock supplied from outside may be produced, changes in the delay amount is small even though the devices, temperature or power supply voltages are changed.

In Non-Patent Document 1, for example, there is disclosed a DRAM which uses a multi-phase clock generated in the DLL (Delay Lock Loop) as the internal clock.

However, the driving current for a DLL is high so that the power consumption during chip operation is increased. In addition, with the DLL, a certain time (approximately 100 cycles) has to pass as from clock delivery until the internal delay is synchronized with the clock. Hence, the clock cannot be halted even in the standby mode of the DRAM, with the result that current consumption for the standby mode is increased.

The present invention seeks to solve one or more of the above problems.

The inventions disclosed in the present application may be briefly summarized as follows:

In one aspect of the present invention, there is provided a semiconductor device comprising a first clock generating circuit that generates a first clock signal having a first period from an input clock signal, a second clock generating circuit that generates a second clock signal having a second period from the input clock signal, and a timing generator. The timing generator receives the first clock signal, the second clock signal, an activation signal and a selection signal that selects the delay time to output a timing signal delayed as from the time of activation of the activation signal by a delay equal to a preset number prescribed by the selection signal times the first period plus another preset number prescribed by the selection signal times the second period.

In one embodiment of the present invention, the timing generator includes a coarse delay circuit that receives the first clock signal, the activation signal and a first value m to generate a coarse delay timing signal equal to a delay equal to m·T1 as from an effective edge of the first clock signal following the time of activation of the activation signal. The timing generator also preferably includes a fine delay circuit that receives the second clock signal, the coarse delay timing signal from the coarse delay circuit and a second value n to generate a fine delay timing signal equal to a delay of n·T2 as from an output timing of the coarse delay timing signal. It is noted that T1 is the first period, T2 is the second period, m is a non-negative integer prescribed by the selection signal and n is another non-negative integer prescribed by the selection signal. The fine delay timing signal, output with a delay of m·T1+n·T2 as from activation of the activation signal, is the timing signal from the timing generator.

In one embodiment of the present invention, the semiconductor device may further include a control circuit that receives the timing signal, output from the timing generator, to generate a control signal. The control circuit may include a flip-flop that samples the activation signal, using the timing signal, output from the timing generator, as a sampling clock, a delay circuit that delays the activation signal, and a circuit that delivers an output of the activation signal sampled by the flip-flop, as the control signal in one operating mode. The circuit may deliver the activation signal, delayed by the delay circuit, as the control signal in another operating mode.

In one embodiment of the present invention, the semiconductor device may further comprise a control circuit that receives the timing signal, output from the timing generator, to generate a control signal. The control circuit may include a flip-flop that samples the activation signal, using the timing signal, output from the timing generator, as a sampling clock, a delay circuit that delays the activation signal, a first logic circuit that masks an output of the delay circuit based on a preset control signal that controls an operating mode, and a second logic circuit that receives an output of the flip-flop and an output of the first logic circuit. The first logic circuit in one operating mode may mask an output of the delay circuit. The second logic circuit may deliver the activation signal, sampled by the flip-flop with the timing signal, as the control signal, when an output of the first logic circuit is set at a preset fixed value. The output of the flip-flop may be set in another operating mode at a preset fixed value. The first logic circuit then may not mask the output of the delay circuit, and the second logic circuit may output the control signal based on the output of the first logic circuit.

In one embodiment of the present invention, the semiconductor may further comprise a control circuit that receives the timing signal, output from the timing generator, to generate a control signal. The control circuit may include a flip-flop that samples the activation signal, using the timing signal, output from the timing generator, as a sampling clock, and a delay circuit that delays the activation signal. The control circuit may further include a first switching circuit routing the activation signal to the delay circuit, or causing the activation signal to skip the delay circuit, based on a signal that controls the operating mode, and a second switching circuit. When the activation signal is caused to skip the delay circuit by the first switching circuit based on the signal that controls the operating mode, the second switching circuit may deliver the activation signal from the first switching circuit to the flip-flop. When the activation signal is delivered by the first switching circuit to the delay circuit, the second switching circuit may output the delayed activation signal not via the flip-flop.

In one embodiment of the present invention, the delay circuit may include a plurality of inverters which are cascade-connected.

In one embodiment of the present invention, the timing generator may produce first and second control signals, as the control signals, and may include first and second control circuits, as the aforementioned control circuit. The first control circuit may receive the activation signal and a first timing signal that is delivered by the timing generator to output the first control signal. The second control circuit may receive the first control signal, output from the first control circuit, as the activation signal to be delivered as input to the control circuit. The second control circuit may also receive a second timing signal output from the timing generator to generate the second control signal.

In one embodiment of the present invention, the semiconductor device may further comprise a timing register that stores the selection signal that selects the delay time. The value of the selection signal may be variably set.

In one embodiment of the present invention, the value of the timing register may be set at the time of setting a mode register.

In one embodiment of the present invention, the semiconductor device may further comprise a circuit that receives the timing signal from the timing generator at its clock terminal to sample the activation signal in response to the timing signal. The timing signal output from the timing generator may be used as a control signal needed for activation.

In one embodiment of the present invention, the semiconductor device may further comprise a memory array including a number of memory cells at points of intersection of a plurality of bit lines and a plurality of word lines. The timing signal output from the timing generator may be used as the control signal needed for activation for at least one of operations of deactivating a precharging circuit for precharging the bit lines, activating the word lines and activating a sense amplifier.

In one embodiment of the present invention, the timing signal output by the timing generator may be used as a control signal for read access.

In one embodiment of the present invention, the timing signal output from the timing generator may be used as the control signal for read access for at least one of the operations for activating a column decoder and activating a main amplifier circuit.

In one embodiment of the present invention, the semiconductor device may further comprise a delay circuit in addition to the timing generator. The delay circuit may include an inverter string. When the semiconductor device is in a standby state, the analog delay circuit may be used in place of the output signal of the timing generator to control the timing of internal operations of the semiconductor device.

In the semiconductor device according to one embodiment of the present invention, the access specifications may be prescribed based on the aforementioned input clock.

In the semiconductor device according to one embodiment of the present invention, there may be further provided a register for controlling the timing generator, and means for outputting a value of the register to outside in a test mode.

According to the present invention, a semiconductor device may be provided in which timing variations are little against changes in power supply voltage or temperature. The present invention may be applied to a semiconductor memory, such as DRAM, to reduce the dead margin in timing designing to enable high speed access or low power consumption.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 15A and 15B are a tabulated diagram showing an instance of the information to be stored in the timing register according to the Example of the present invention.

FIG. 26A to FIG. 26D are schematic diagrams showing illustrative layouts of memory cells in the sub-array of FIG. 23.

PREFERRED MODES OF THE INVENTION

Figure 1:
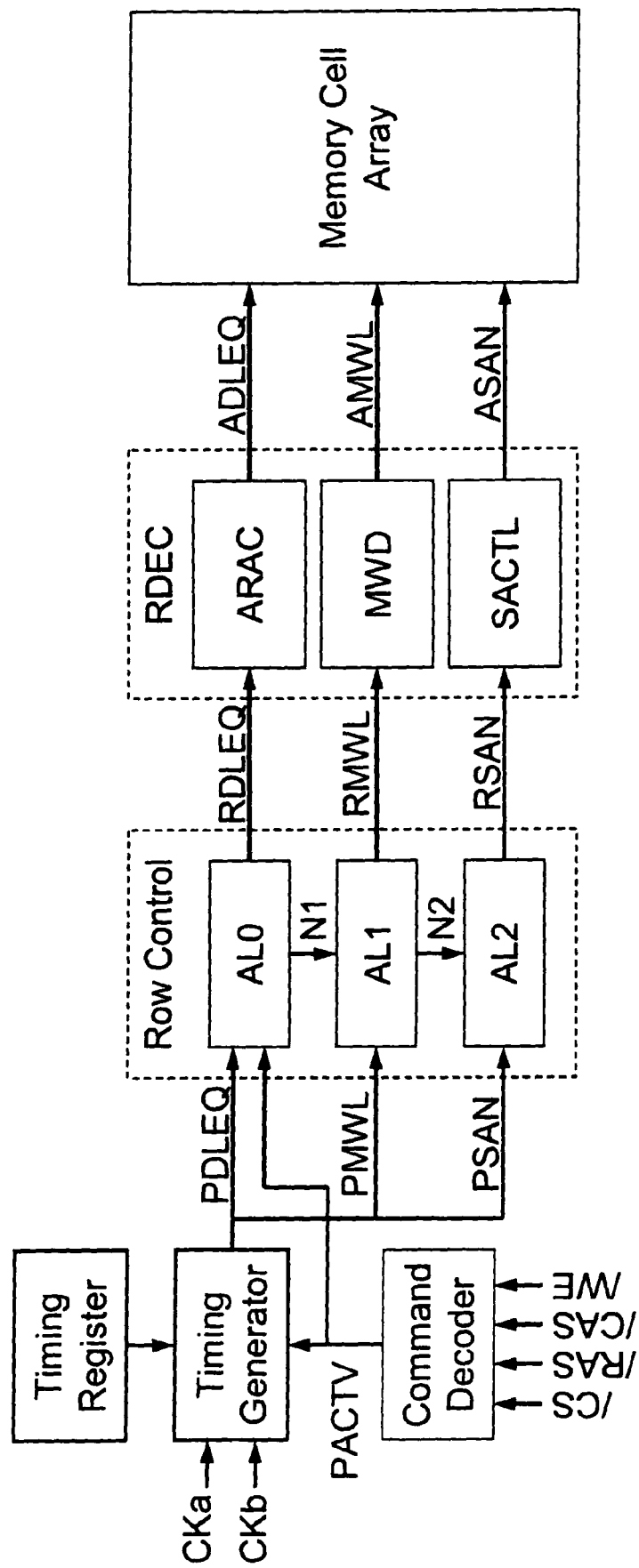
FIG. 1 is a block diagram showing the row system of a DRAM chip that employs a timing generator and a timing register of an Example of the present invention.

Exemplary embodiments of the present invention will now be described with reference to the drawings. In all figures referred to in the following description, the same reference numerals or symbols are used to depict the same parts of components, as a principle, and repetition of description of the same or similar parts or components is dispense with.

According to an exemplary embodiment of the present invention, there are provided a first clock generating circuit (Clock A Generator) that generates a first clock signal CKa having a first period T1, a second clock generating circuit (Clock B Generator) that generates a second clock signal CKb having a second period T2, and a timing generator. The timing generator receives the first clock CKa, the second clock CKb and an activation signal (PACTV) and generates a timing signal at a timing of delay time of td=m·T1+n·T2 from the time of activation of the activation signal (PACTV), where m and n are non-negative integers that prescribe the delay.

It should be noted that transistors that make up each block shown in the present exemplary embodiment are formed on a sole semiconductor substrate, such as single crystal silicon, by an integrated circuit technology, such as CMOS (complementary MOS) technology. That is, the transistors are formed by a process including a process step of forming a well, a device isolation region and an oxide film, followed by a process step of forming first and second semiconductor regions corresponding to a gate electrode and a source-drain region. As regards circuit symbols for a MOSFET (Metal Oxide Semiconductor Field Effect Transistor), a circle or arrow mark affixed to the gate of the MOSFET indicates that the MOSFET is of an N-type. If such circle or arrow mark is not affixed to the gate of the MOSFET, the MOSFET is of a P-type. In the following, a MOSFET is referred to as MOS or MOS transistor for simplicity sake. It should be noted that the present invention is not limited to a field effect transistor including an oxide film between a metal gate and a semiconductor layer, and may also be applied to a circuit that uses more general FETs, such as MISFET (Metal Insulator Field Effect Transistor). Although the following description is directed to generation of a timing control signal for a semiconductor memory, such as DRAM, it is to be noted that the present invention may be applied to any suitable optional semiconductor integrated circuit devices.

A semiconductor memory having a timing generator according to an Example of the present invention will now be described. FIG. 1 shows an arrangement of an Example of the present invention. Referring to FIG. 1, a DRAM circuit includes:

a timing generation circuit (termed as timing generator);
a timing register for controlling the timing generator;
a row system control circuit (termed as row control); and
a memory array. The timing generator receives a first clock signal Cka, a second clock signal Ckb and an activation signal PACTV to output a variety of timing signals.

The commands issued by the command decoder, such as an activation command (PACTV), are delivered to the timing generator.

The timing generator receives a first clock signal Cka of a first period T1 and a second clock signal Ckb of a second period T2 to generate a variety of timing control signals with desired delay as from the timing of activation of the activation command PACTV. Examples of these timing control signals include a precharge timing signal PDELQ, a word line timing signal PMWL and a sense amplifier timing signal PSAN.

These timing control signals are delivered to array logics (AL0, AL1, AL2) within the row system control circuit (Row Control) and thence to a row decoder (RDEC).

The timing control signals (precharge timing signal RDELQ, word line timing signal RMWL and the sense amplifier timing signal RSAN), supplied to the row decoder, are transmitted via an array control circuit (ARAC), a main word driver (MWD) and a sense amplifier control circuit (SACTL), within the row decoder respectively, so as to be output as memory array control signals, that is, as precharge timing signal ADLEQ, word line timing signal AMWL and sense amplifier timing signal ASAN, respectively.

The internal operation within the memory array is controlled with use of these timing signals, and hence is not liable to be influenced by difference in production processes, variations in the supply voltage or changes in temperature, resulting in a shorter access time.

Figure 2:
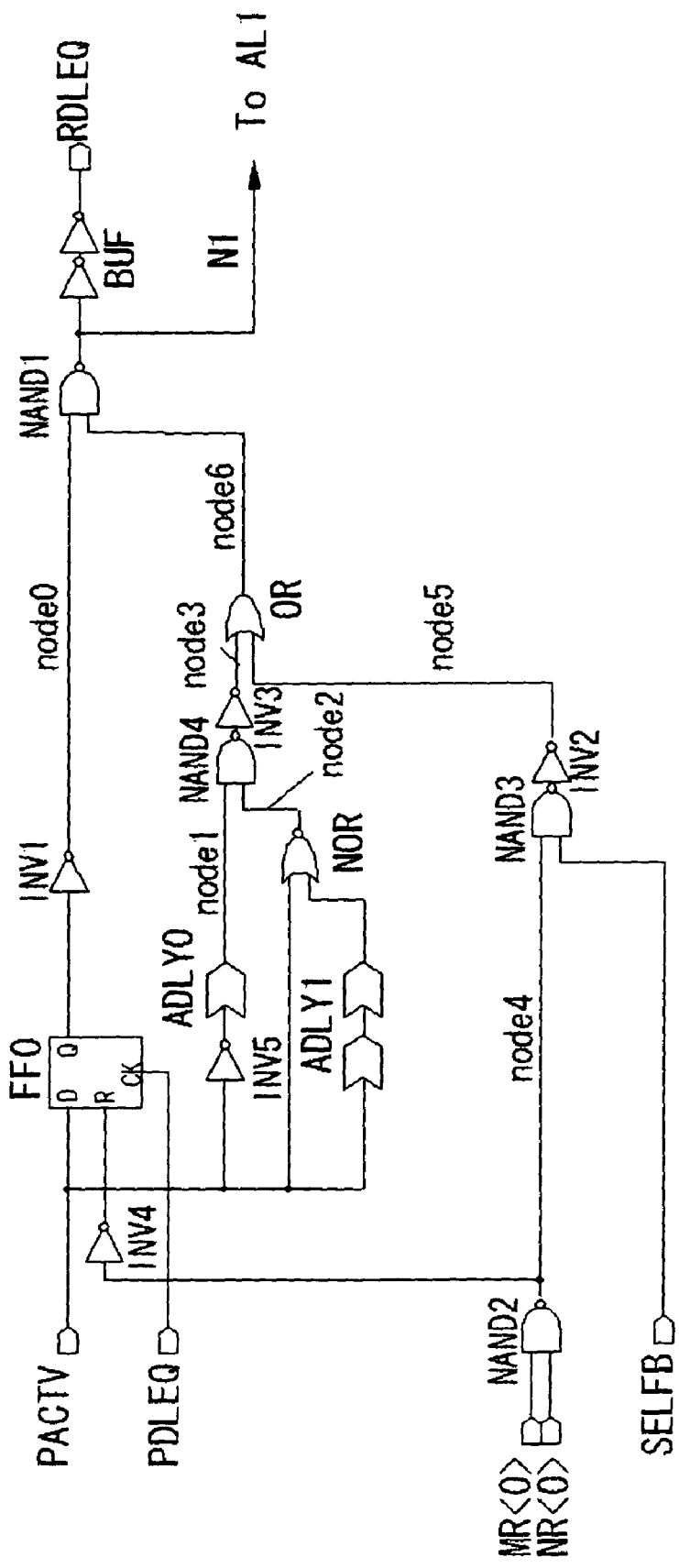
FIG. 2 is a circuit diagram showing a typical arrangement of an array logic circuit AL0.

FIG. 2 shows a typical circuit arrangement of the array logic AL0 provided in the row control of FIG. 1. Referring to FIG. 2, the array logic (AL0) includes a flip-flop (FF0), an analog delay circuit (ADLY0), an analog delay circuit (ADLY1), inverters (INV1, INV2, INV3, INV4 and INV5), NAND circuits (NAND1, NAND2, NAND3 and NAND4), an OR circuit (OR), a NOR circuit (NOR) and a buffer (BUF).

The signals delivered to the array logic (AL0) are the activation signal (PACTV), the timing signal (PDLEQ), and delay control signals MR<0>, NR<0> from a timing register, herein not shown, of the timing generator of FIG. 1 and a self refresh mode signal SELFLB. Output signals are the timing signal (RDLEQ) and a signal N1 delivered to the array logic (AL1). The voltage nodes are entered as node0 to node6 in the drawing.

The flip-flop (FF0) receives the activation signal PACTV at its data terminal D, while also receiving the precharge timing signal PDELQ from the timing generator of FIG. 1 at its clock terminal CK. The flip-flop samples the activation signal PACTV at a rising edge of PDELQ to output a sampled signal at its output terminal Q. The output signal from the output terminal Q of the flip-flop (FF0) is delivered via inverter INV1 to the node node0 and thence supplied to one input terminal of the two-input NAND NAND1. The two-input NAND NAND1 operates as an inverter which, when one of the inputs node0 and node6 is High, inverts the other input to deliver an inverted signal as output. MR<0> and NR<0> are delivered as inputs to the two-input NAND NAND2. In case both MR<0> and NR<0> are High, the output node node4 of NAND2 becomes Low to reset the flip-flop FF0, the reset terminal R of which receives the potential at the node node4 as inverted by the inverter INV4. The node node4 and the self refresh mode signal SELFLB are coupled to input terminals of the two-input NAND NAND3. An output signal of the two-input NAND NAND3, inverted by the inverter INV2, is supplied to the OR circuit OR, an output node node6 of which is connected to the input of NAND1. The analog delay circuit (ADLY0) receives a signal, which is PACTV inverted by the inverter INV5, and delays the received signal to output the delayed signal to node1. The analog delay circuit (ADLY1) outputs a signal delayed from PACTV. The delayed output of the analog delay circuit (ADLY1) and PACTV are delivered to the two-input NOR circuit (NOR), which then outputs to NAND4 a signal which goes High as long as PACTV and the delayed output of the analog delay circuit (ADLY1) are both Low. A signal which transitions from High to Low at a timing corresponding to the rising edge from Low to High of PACTV delayed by delay time of ADLY0 and which also transitions from Low to High at a timing corresponding to the falling edge from High to Low of PACTV delayed by delay time of ADLY1 is output to the node node3 via NAND4 and inverter INV3. When node5 is Low and node0 is High, a signal wave form obtained by inverting the signal waveform of node3 by NAND1 is output via BUF as RELEQ. This node node5 is High when node4 is High, that is, except when MR<0> and NR<0> are both High, and SELFB is High, while being Low when otherwise. An output of NAND1 is delivered to AL1 as N1.

Figure 3:
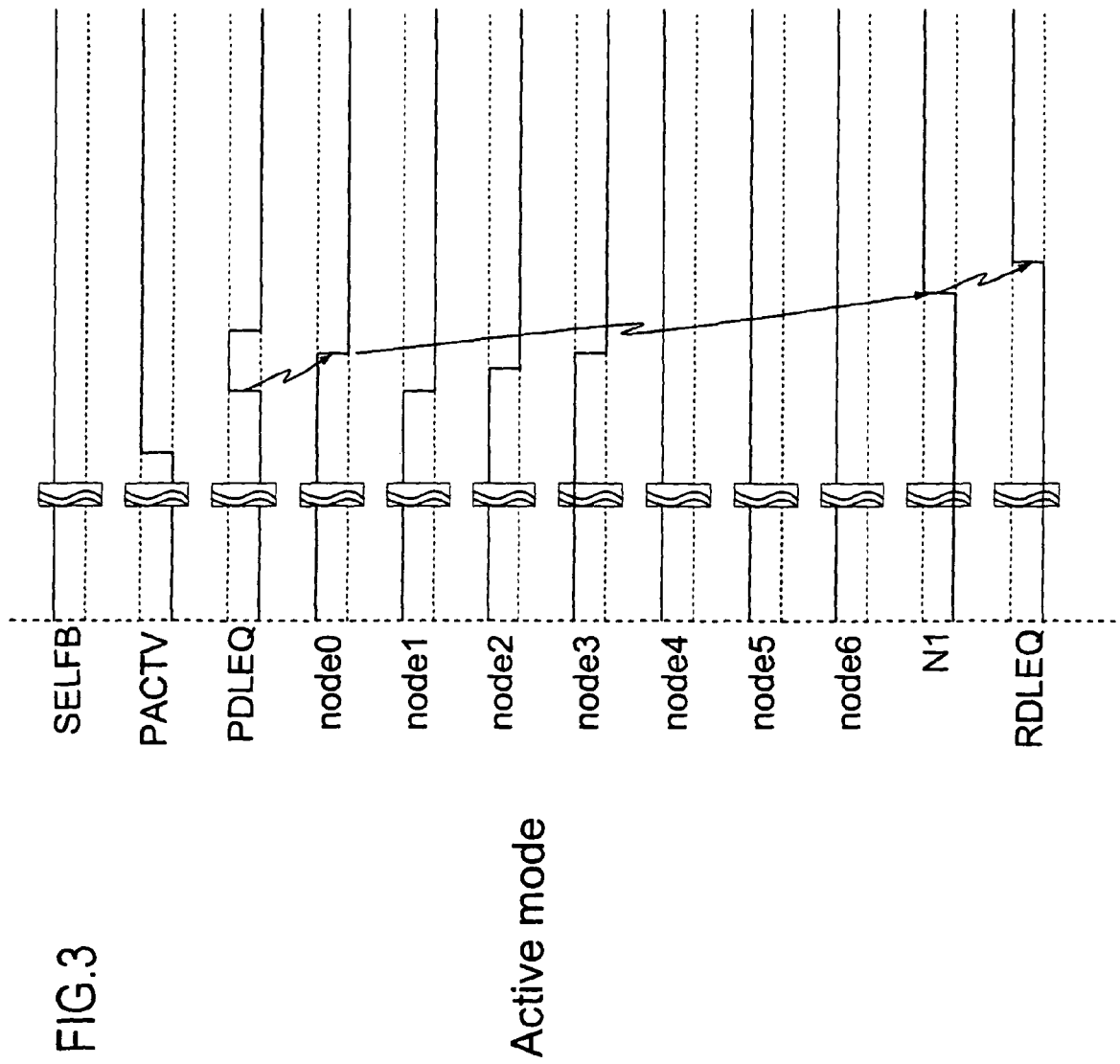
FIG. 3 is a typical operating waveform of an active mode of the array logic circuit AL0.

FIG. 3 depicts a timing diagram showing an instance of a normal operation (Active Mode) of the array logic AL0 of FIG. 2. RDLEQ rises in response to the rising edge of PDLEQ, as shown in FIG. 3. The normal operation (Active Mode) is for such a case excepting the case of MR<0> and NR<0> being both High in a timing register in the timing generator that controls the delay of PDLEQ, that is, a case excepting the case when setting values of the timing register of FIG. 16 as later described are such that MR<0> and NR<0> are both High. It should be noted that the setting value 0.0 of the timing register in the timing generator controlling the delay of PDLEQ (see FIG. 16) indicates a case where MR<0>=High and NR<0>=High in FIG. 16 (through-mode as later described). Also, during the normal operation (Active Mode), SELFB is High, node4 is High, node5 and node6 are High, and outputs of the analog delay circuit (ADLY0), (ADLY1) are masked (PACTV is selected). That is, referring to FIG. 3, if a PACTV command is entered, node0 becomes Low responsive to the rising edge of PDLEQ which is subsequently entered. RDLEQ is brought High (activated). When RDLEQ is brought Low (deactivated), PACTV transitions from High to Low, a one-shot pulse is entered to PDLEQ, and RDLEQ falls Low at the rising timing of PDLEQ.

Figure 8:
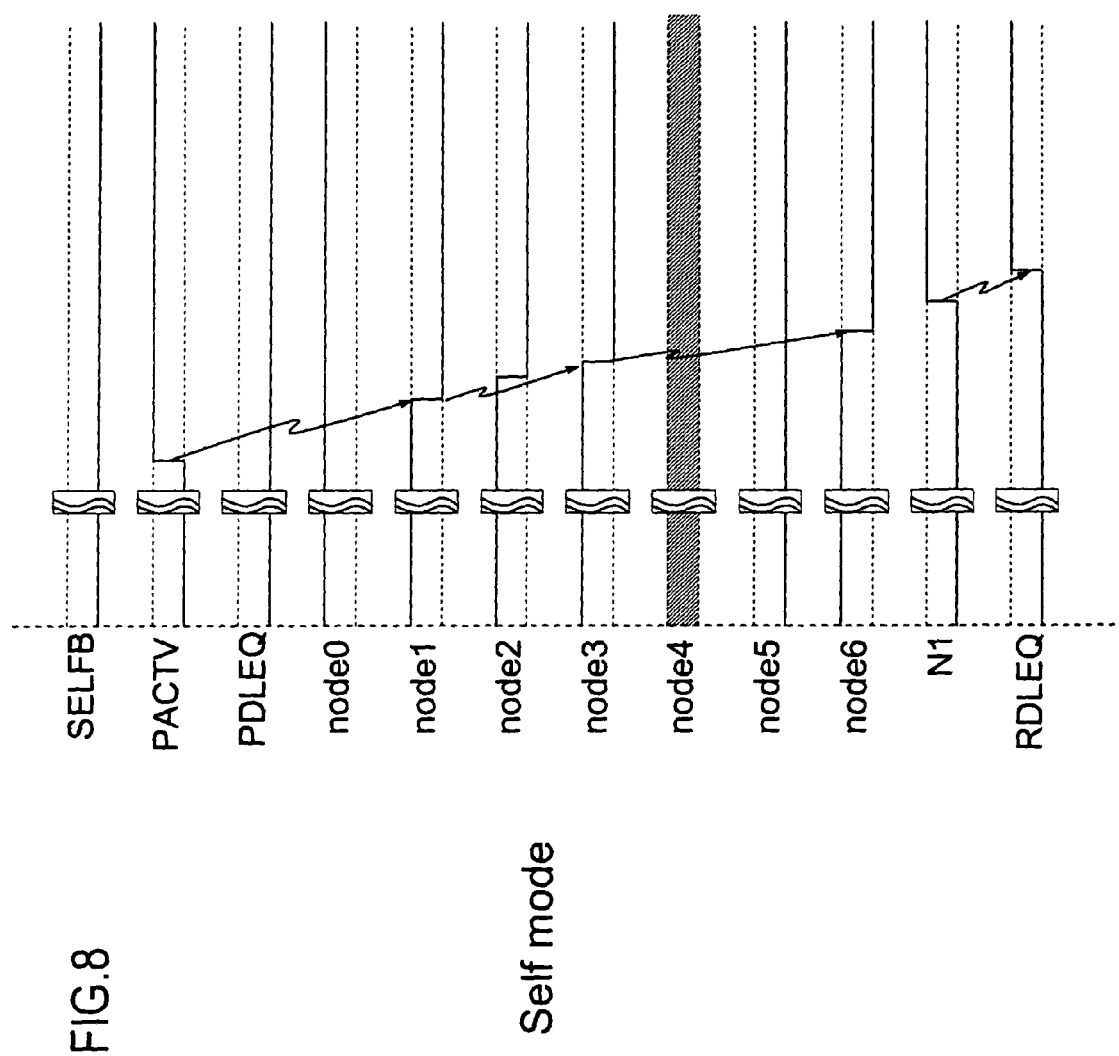
FIG. 8 is a timing diagram showing a typical operating waveform of the self-mode of the array logic circuit AL0.

FIG. 8 depicts a timing diagram showing an instance of a self-mode of the array logic AL0 of FIG. 2. In the self-mode, SELFB is activated (brought Low), while PDLEQ is set to Low, as shown in FIG. 8. The node node5 is brought Low, while the node node0 is set to High. Thus, RDLEQ receives PACTV and is controlled by the analog delay circuit (ADLY0) that delays the rising edge. When resetting RDLEQ of High level to Low, the analog delay circuit (ADLY1) is used as a delay circuit that delays the falling edge of PACTV.

Figure 9:
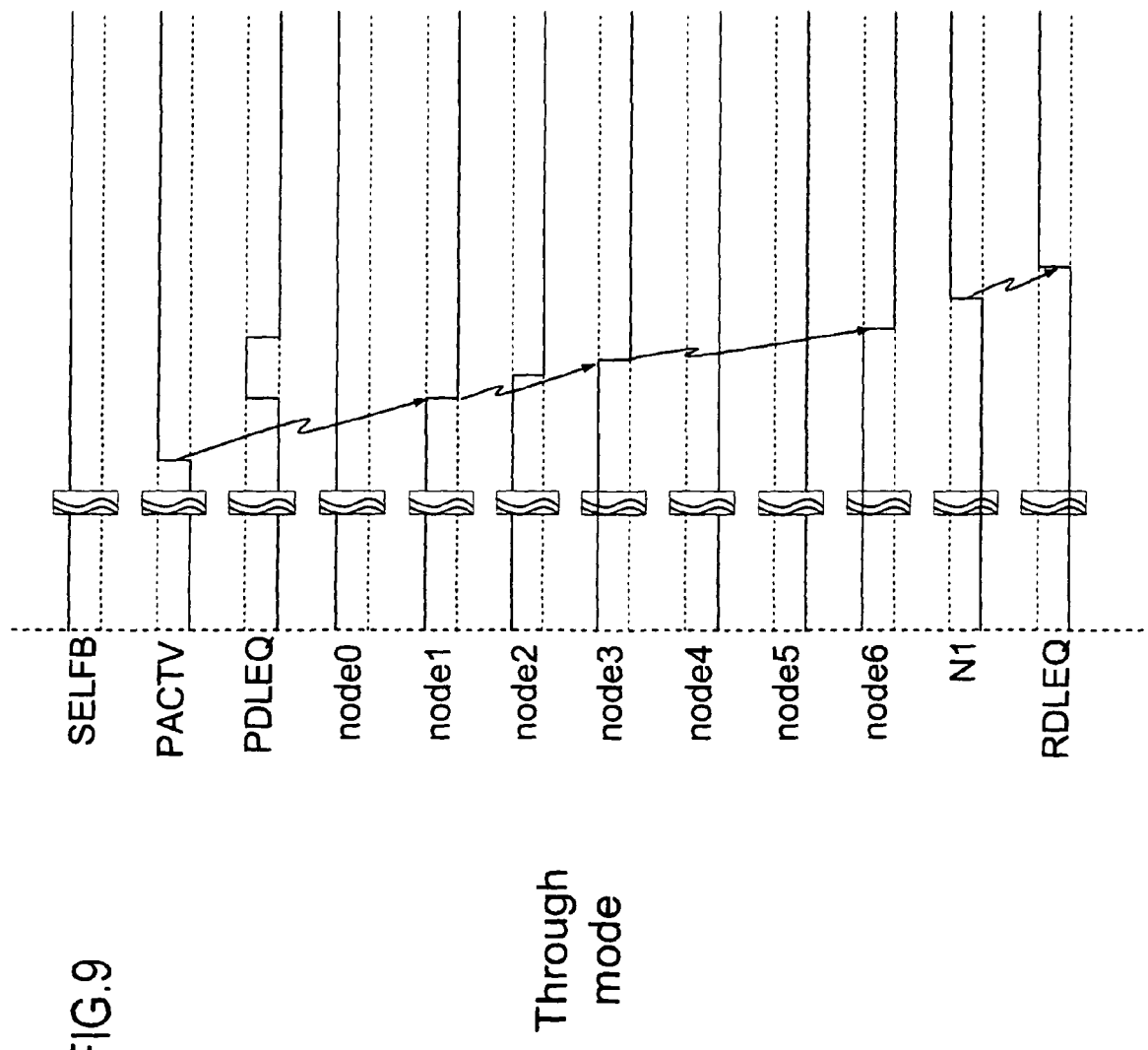
FIG. 9 is a timing diagram showing a typical operating waveform of the through-mode of the array logic circuit AL0.

FIG. 9 depicts a timing diagram showing an instance of the operation of a through-mode of the array logic AL0 of FIG. 2. The through-mode is such a mode in which, in the normal operation, supplied with the clock, the timing of activation and deactivation of RDLEQ is controlled by the analog delay circuits (ADLY0) and (ADLY1). At this time, since MR<0> is High and NR<0> is High, node4 is Low and node5 is also Low. The reset terminal R of the flip-flop FF0 is High to reset FF0. The node0 is High. That is, the activation timing of RDLEQ is controlled by the analog delay circuit (ADLY0) that delays the rising of PACTV. The deactivation timing of RDLEQ is controlled by the analog delay circuit (ADLY1).

Figure 4:
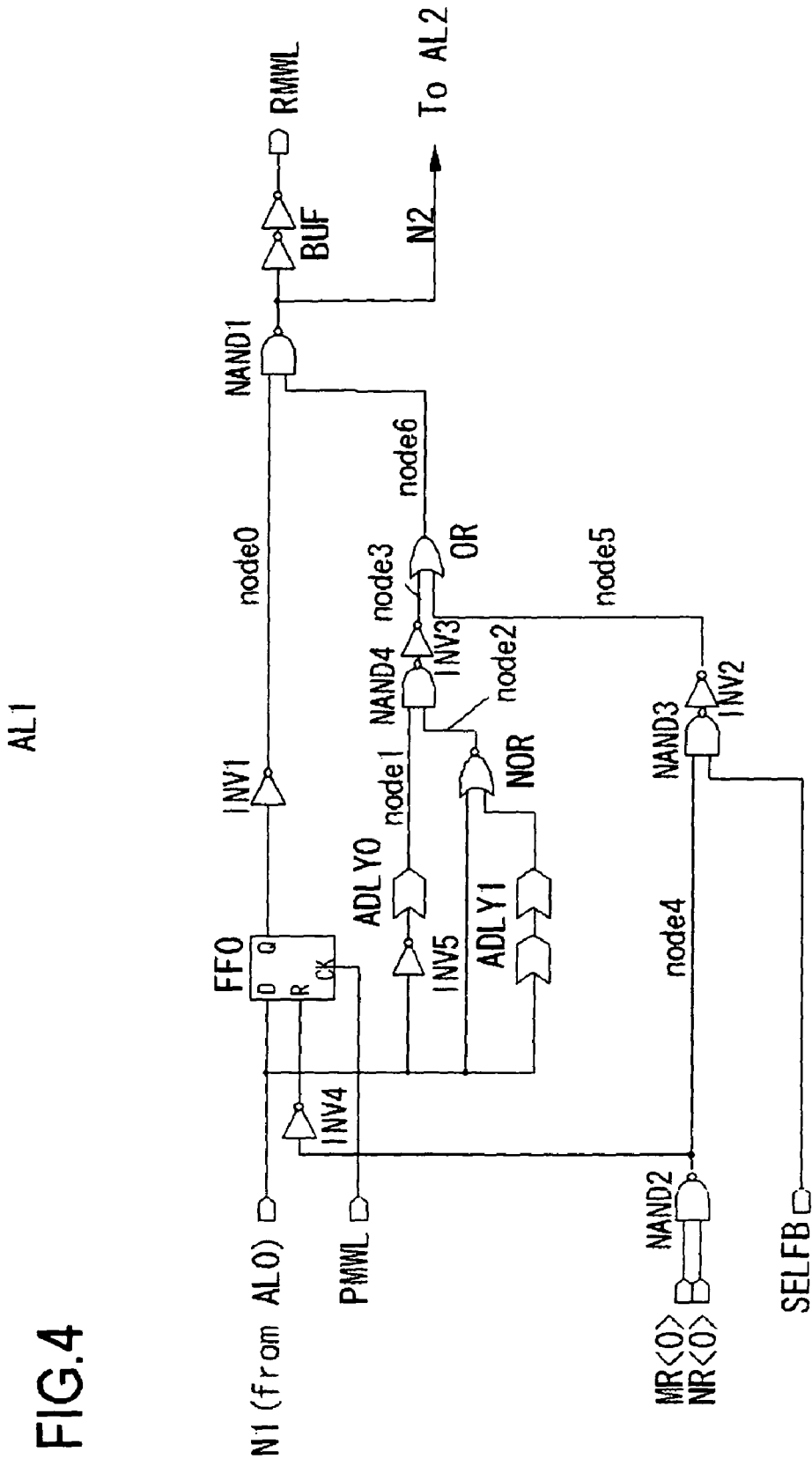
FIG. 4 is a circuit diagram showing a typical arrangement of an array logic circuit AL1.

The arrangement of the array logic AL1 will now be described with reference to FIG. 4. Since the arrangement of the array logic AL1 is basically similar to that of the array logic AL0, the following description is mainly centered about a point of difference. The difference between the array logics AL1 and AL0 is that input signals to the array logic AL1 are the output signal N1 of the array logic AL0 and the word line timing signal PMWL, and that output signals are the timing signal RMWL and an output signal N2.

The circuit operation of the array logic AL1 is similar to that of the array logic AL0. That is, it suffices that the activation signal PACTV in FIG. 3 and the input signal N1 are interchanged, and also that the timing signal PDLEQ and the timing signal PMWL are interchanged. Since the basic operation is thus the same, detailed description of the method for operation is here dispensed with.

Figure 5:
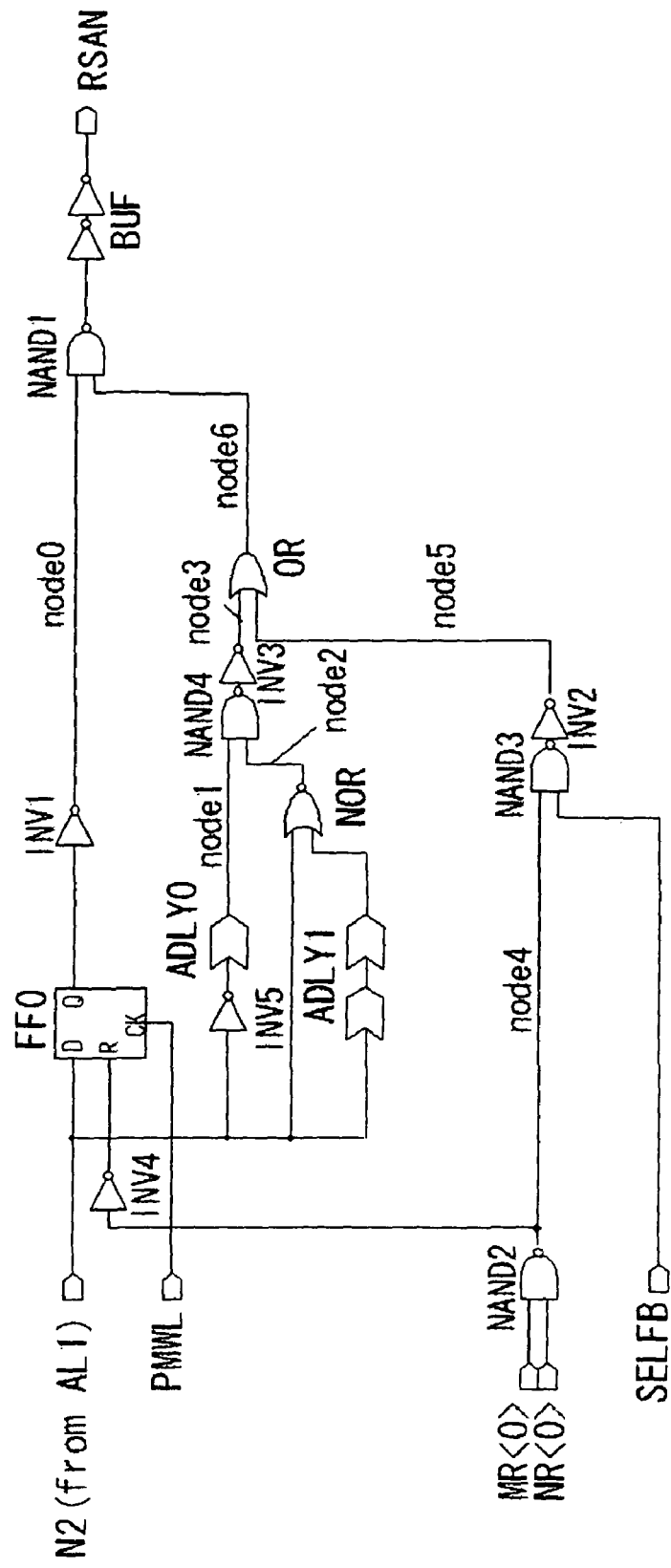
FIG. 5 is a circuit diagram showing a typical arrangement of an array logic circuit AL2.

Referring to FIG. 5, the arrangement of the array logic AL2 will now be described. Since the arrangement of the array logic AL2 shown in FIG. 5 is basically the same as that of the array logic AL0 or AL1, the following description will be mainly focused on the point of difference. The difference between the array logics AL2 and AL1 is that the input signals of the array logic AL2 are the output signal N2 of the array logic AL1 and the sense amplifier timing signal PSAN, and that the output signal is the sense amplifier timing signal RSAN.

The circuit operation of the array logic AL2 is similar to that of the array logics AL0 and AL1. That is, it suffices that the activation signal PACTV in FIG. 3 and the input signal N2 are interchanged, and also the timing signal PDLEQ and the timing signal PSAN are interchanged. Since the basic operation is thus the same, detailed description of the method for operation is here dispensed with.

Figure 6:
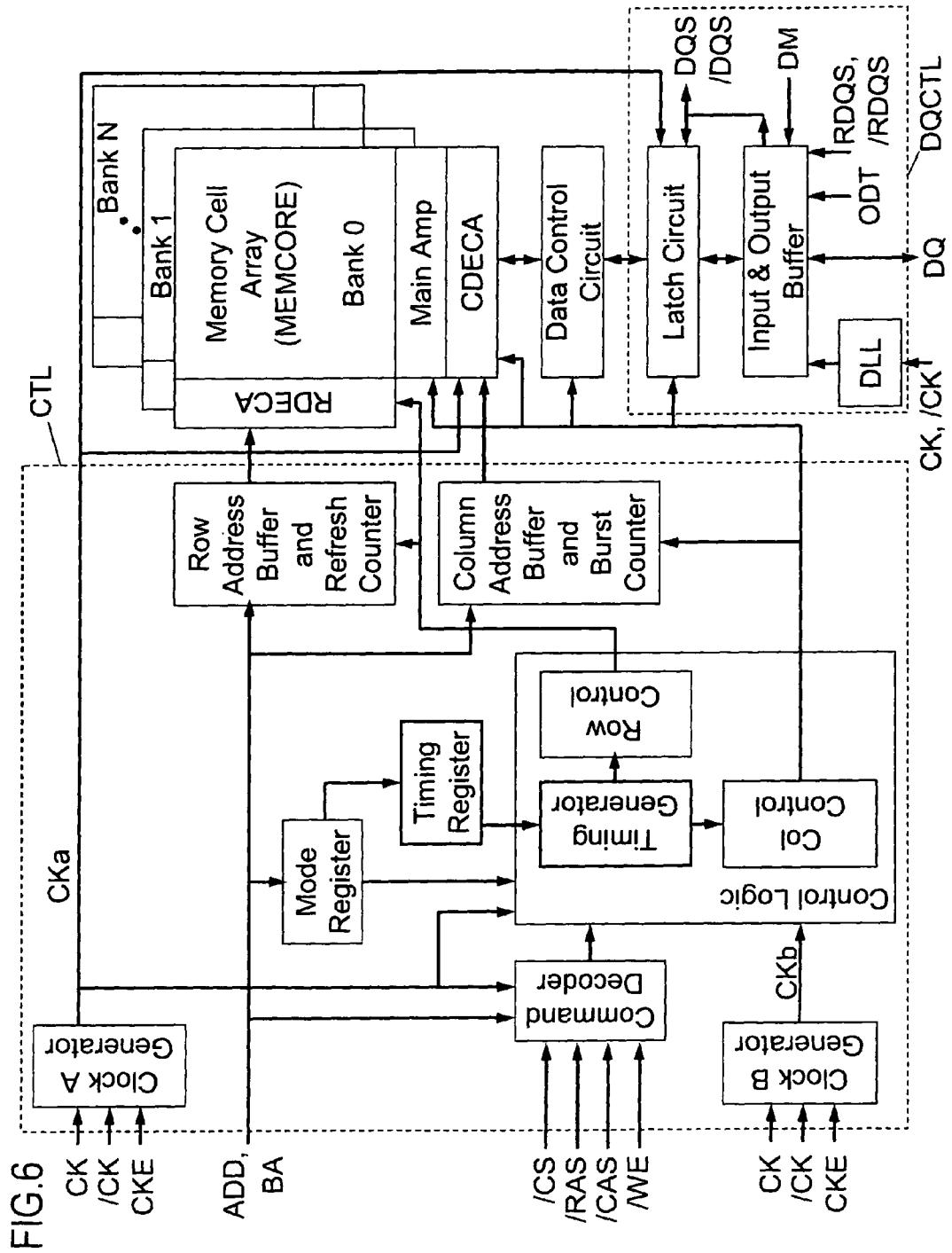
FIG. 6 is a block diagram showing a DRAM chip, in its entirety, with the DRAM chip employing the timing generator and the timing register of an Example of the present invention.

FIG. 6 depicts a typical block circuit diagram of a DRAM chip made up of the timing generator, timing register, row system control circuit, row decoder and the command decoder, as already explained with reference to FIGS. 1 to 5.

Referring to FIG. 6, the DRAM chip includes a command decoder that receives a chip select signal /CS, a row address strobe signal /RAS, a column address strobe signal /CAS, a write enable signal /WE, and an address signal, not shown, to decode a command. In the DRAM chip, there are also provided a clock generator (termed as Clock A Generator) that receives differential clocks CK and /CK and a clock enable signal CKE to generate a clock signal CKa of a first period, and another clock generator (termed as Clock B Generator) that receives differential clocks CK, /CK and the clock enable signal CKE to generate a clock signal CKb of a second period. In the DRAM chip, there are also provided a mode register, a timing register, a control logic that includes a row control, a column system control circuit (termed as col control), a timing generator, a column address buffer, a burst counter for a burst length, a row address buffer, a refresh counter for generating a refresh address, a row decoder array (termed as RDECA), a column decoder array (termed as CDECA) and a main sense amplifier. There are also provided a memory cell array includes memory banks Bank0, Bank1 and BankN, a DQ control circuit (termed as DQCTL) and a data control circuit. The DQCTL includes a data input and output buffer, a latch circuit and a delay locked loop (DLL). The data control circuit controls data exchange between DQCTL and the memory cell array.

DQS and /DQS are data strobe signals, RDQS, /RDQS are read data strobe signals, DM is a data mask signal, ODT is an on-die terminate signal and DQ is data. The clock enable signal CKE controls whether or not a clock is to be effective. If CKE is High, the rising edge, for example, of the next clock is made effective.

In FIG. 6, the command decoder, timing register, timing generator, row control of the control logic, row decoder array (RDECA) and the memory cell array correspond to the respective elements shown in FIG. 1. The circuitry other than the mode register, timing register and the control logic, and the method for controlling the control signals, are similar to those used in the well-known SDRAM/DDR or SDRAM, and hence the corresponding description is dispensed with. With the arrangement, described above, it is possible to produce DRAM chips having the access performance unsusceptible to differences in the manufacture process, variations in the supply voltage or changes in temperature.

Figure 7:
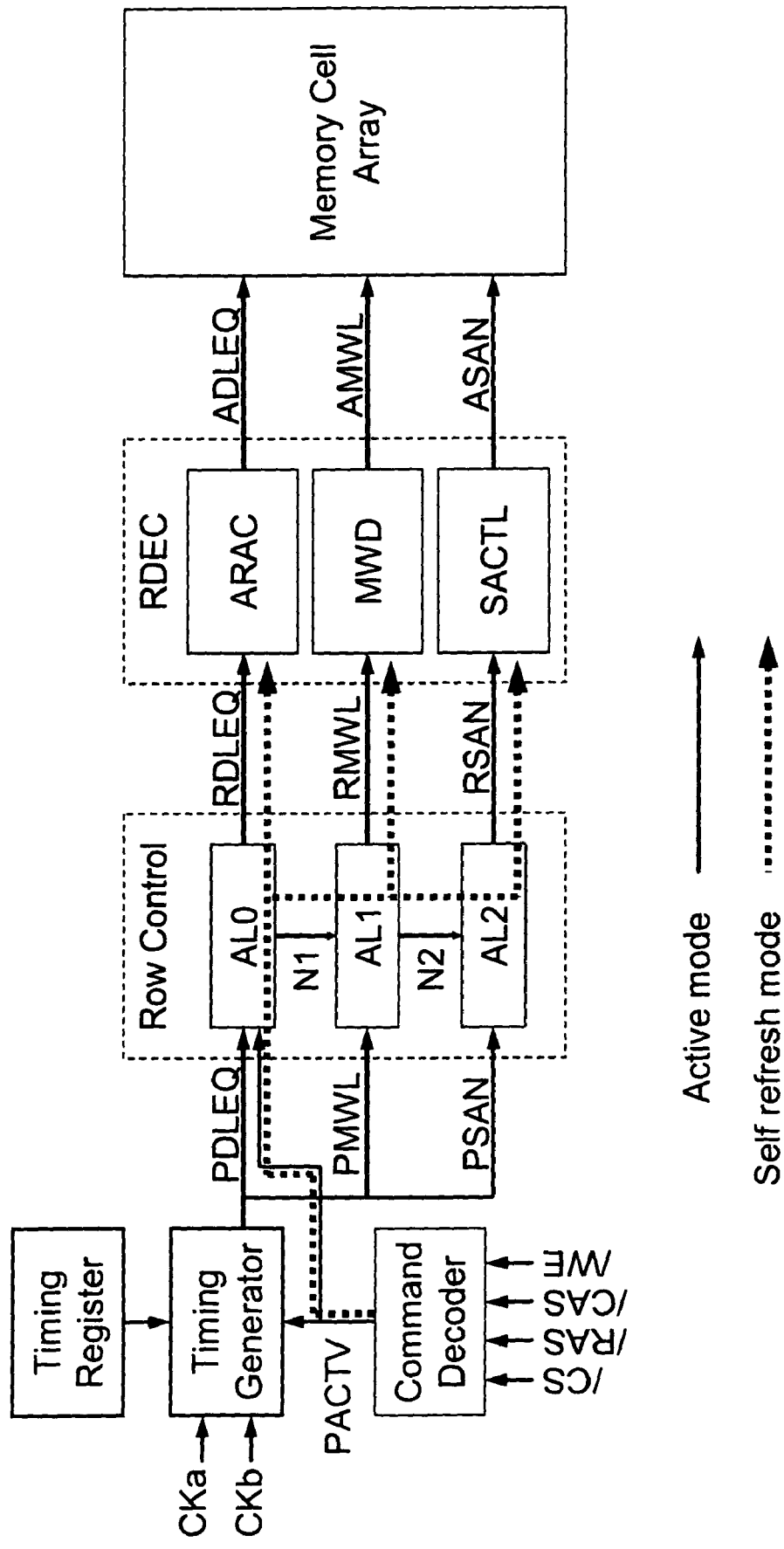
FIG. 7 is a block diagram showing a DRAM chip in which the timing generator and the timing register of the present Example are used in a self-refresh mode.

FIG. 7 shows propagation paths for signals in which a DRAM chip is run in a self refresh mode. The circuit arrangement of FIG. 7 is similar to that of FIGS. 1, 2, 4 and 5 described above.

In FIG. 7, broken lines represent an access path after entry to the refresh mode. That is, the output node node0 in FIG. 2 is controlled at all times so as to be fixed at High level. The activation signal PACTV is not transmitted via flip-flop (FF0) to the downstream side circuitry, but is transmitted to the downstream side circuitry via analog delays (ADLY0, ADLY1) of FIG. 2. In this manner, it becomes possible to run the circuitry within the DRAM only with the refresh command generated by the refresh counter even in case the clocks (CKa, CKb) are not supplied, such as in a standby mode.

During the standby mode, the operation within the array occurs at a lower speed than that during the active period. Hence, there is presented no problem even if timing designing is made with the use of the conventional analog delay, insofar as the operation is concerned.

In the self-refresh mode (SELFB=Low), the DRAM chip can be controlled without supplying the clock, thus enabling optimum trade-off between the low power operation of the standby mode and the stable operation of the DRAM chip.

It goes without saying that the DRAM employing the timing generator of the present invention is not limited to the above arrangement.

The analog delay may be used to adjust the timing of the internal operation of the DRAM even under the normal active mode other than the self refresh mode (through-mode).

That is, the precharge timing signal PDELQ is fixed at all times at the High level, as under the self refresh mode.

Since there is no signal path via the flip-flop (FF0), it is unnecessary to provide a setup hold margin otherwise needed for the flip-flop FF0. That is, since the setup hold margin for the flip-flop FF0 may be dispensed with, a high speed operation may become possible.

Figure 10:
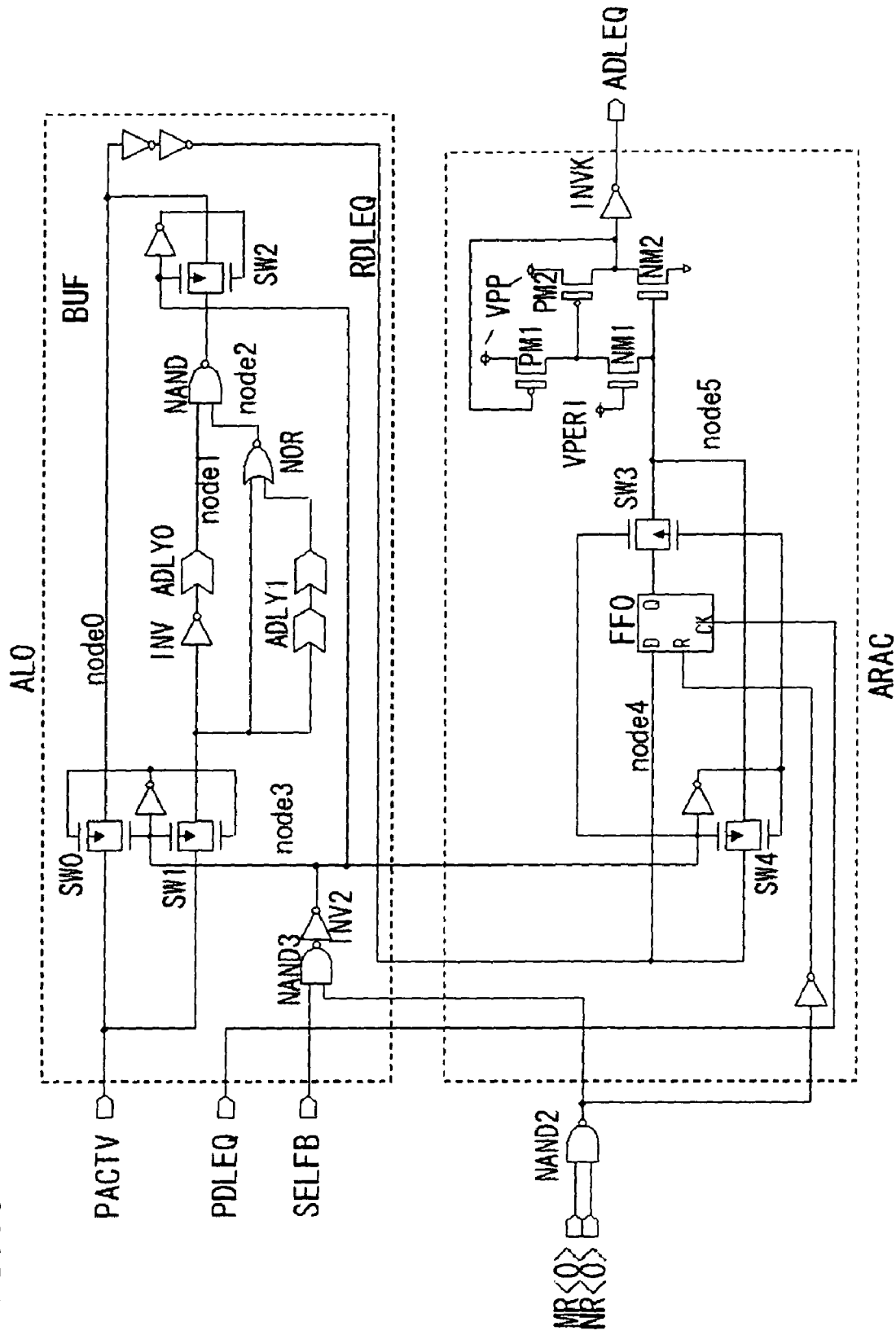
FIG. 10 is a block diagram showing an arrangement of a modification of the array logic circuit AL0.

FIG. 10 shows a modification of the array logic shown in FIG. 2. Specifically, FIG. 10 shows an exemplary configuration of the array logic (AL0) and the array control (ARAC) in case the timing signals PDLEQ, PMWL and PSAN, generated by the timing generator, are delivered to both the row control and the row decoder (RDEC).

The difference between the configuration of the array logic AL0 shown in FIG. 10 and the array logic AL0 shown in FIG. 2 is that complementary switches SW0, SW1 and SW2 are newly provided in FIG. 10. The switches SW0, SW1 and SW2 of AL0 are CMOS transfer gates, and the switches SW3 and SW4 of the array control ARAC are also CMOS transfer gates. The switches SW0 and SW3 are turned on when the node node3 is high, whilst the switches SW1, SW2 and SW4 are turned on when the node node3 is Low. The node node3 corresponds to the node node5 of FIG. 2, and becomes High when SELFB is High, the output of NAND2 is High, that is, except when MR<0> is High and NR<0> is High, while becoming Low if otherwise.

In FIG. 10, the flip-flop (FF0) is arranged in the array control (ARAC).

During the normal operation (active mode), the node3 becomes High, the switches SW0 and SW3 are turned on, while the switches SW1, SW2 and SW4 are turned off. Thus, control is exercised so that the access path of PACTV, SW0, node0, RDLEQ, node4, SW3, node5 and ADLEQ is selected.

During the self-refresh mode and the through-mode, the switches SW1, SW2 and SW4 are turned on, while the switches SW0 and SW3 are turned off. Hence, control is exercised so that the access path of PACTV, SW1, node1, node2, SW2, RDLEQ, SW4, node5 and ADLEQ is selected.

Figure 11:
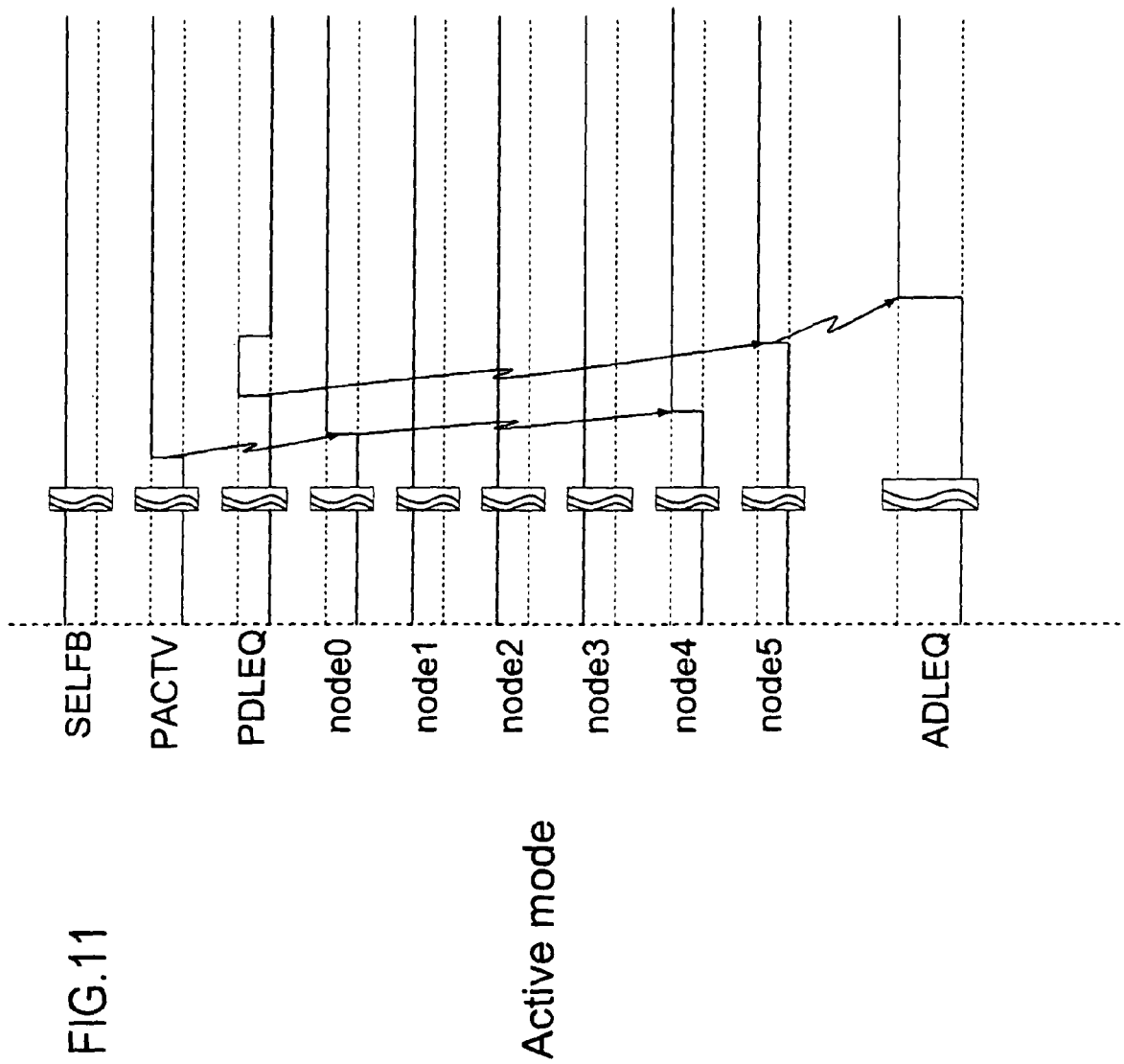
FIG. 11 is a waveform diagram showing an illustrative operating waveform of the modification of the array logic circuit AL0.

FIG. 11 depicts a timing diagram showing a typical operation in the normal operation (active mode) of the circuit shown in FIG. 10. When the node node3 is brought High, the switches SW0 and SW3 are turned on and the activation signal PACTV is brought High, node4 of FIG. 10 goes High. When the pulse of the precharge timing signal PDELQ is received, the flip-flop FF0 samples and outputs a signal of node4 with a rising edge of PDELQ so that a timing signal is output to node5. This timing signal is converted in level to the high potential VPP side by a level converter circuit (PMOS transistors PM1, PM2 and NMOS transistors NM1, NM2) to transmit the precharge timing signal ADLEQ via an inverting buffer INVK (thick-film buffer) to the memory array side.

By supplying the timing control signal, generated by the timing generator, to the array control (ARAC), more variations in the delay time of the timing signal may be removed. It is because the timing control signal generated in synchronization with the clock may be delivered to a circuit block that lies closer to the precharge circuit.

In the Example shown in FIG. 2, the timing control signal is delivered to the row control. Taking the precharge timing signal RDLEQ as an instance, the delay time which is to pass since the signal RDLEQ is output from the array logic AL0 until it is actually delivered to the precharge circuit is influenced by manufacture tolerances, fluctuations of the power supply voltage or changes in temperature.

Conversely, on the signal path from the timing generator down to the array logic (AL0) and the array control (ARAC), the outputting of the timing signal is digitally controlled, so that no such variations in the delay time are produced.

In FIG. 10, the delay time until the signal ADLEQ, output from the array control (ARAC), is actually delivered to the precharge circuit, is influenced by manufacture tolerances, fluctuations of the power supply voltage or changes in temperature.

On the signal path from the timing generator down to the array control (ARAC), the outputting of the timing signal is digitally controlled, so that no such variations in the delay time are produced.

That is, comparison of the arrangement of FIG. 10 and that of FIG. 2 indicates that, with the arrangement of FIG. 10, the delay time since the digitally controlled timing control signal is output from the output node until it is delivered to the precharge circuit becomes shorter than with the arrangement of FIG. 2. Stated differently, in case the digitally controlled timing control signal is delivered to the circuit block lying closer to the circuit being controlled, it is possible to suppress variations in the delay time of the timing signal to smaller values.

Thus, with the use of the arrangement of FIG. 10, the variations in the delay time of the timing signal may be suppressed more effectively. The result is that the timing margin of the internal operation of the DRAM may be minimized to provide for shorter access time.

Figure 12:
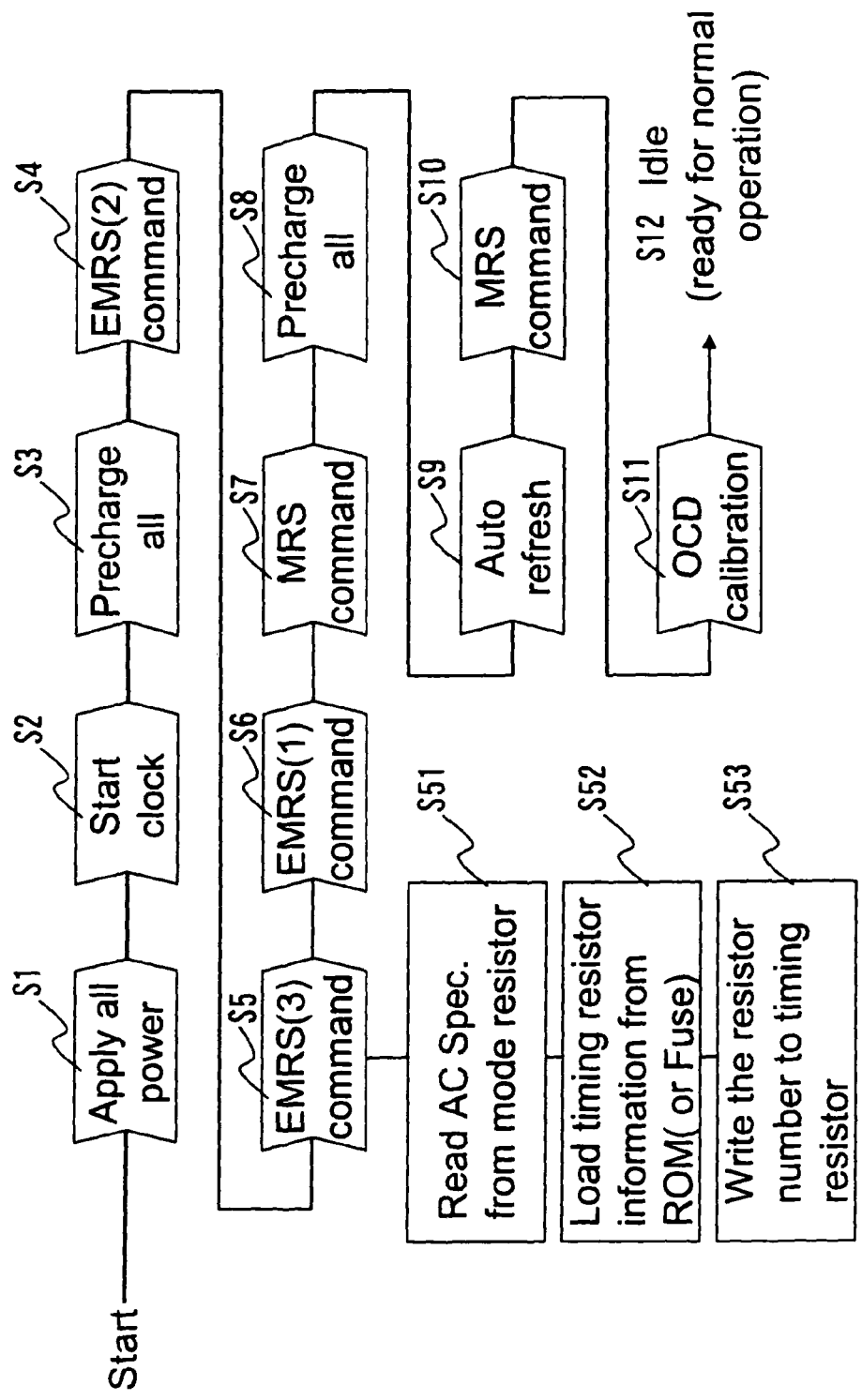
FIG. 12 is a block diagram showing an illustrative initialization sequence of a DRAM chip according to an Example of the present invention.

FIG. 12 depicts an instance of a sequence of operations for power up and initialization of a timing generator of the present Example and a DRAM chip employing the same.

Initially, all power supplies are turned on (Apply all power) (step S1).

The clock is then supplied (Start clock) (step S2).

A precharge all command is then supplied (Precharge all) (step S3).

A mode register command (2) is then supplied (EMRS(2) command) (step S4).

It is noted that the specified contents of the mode register command EMRS (2), mode register command EMRS (1) and the mode register command MRS, shown in the drawing, are equivalent to those of the routine DRAM chip, disclosed for instance in Non-Patent Document 1, and hence the detailed description is dispensed with.

Figure 13:
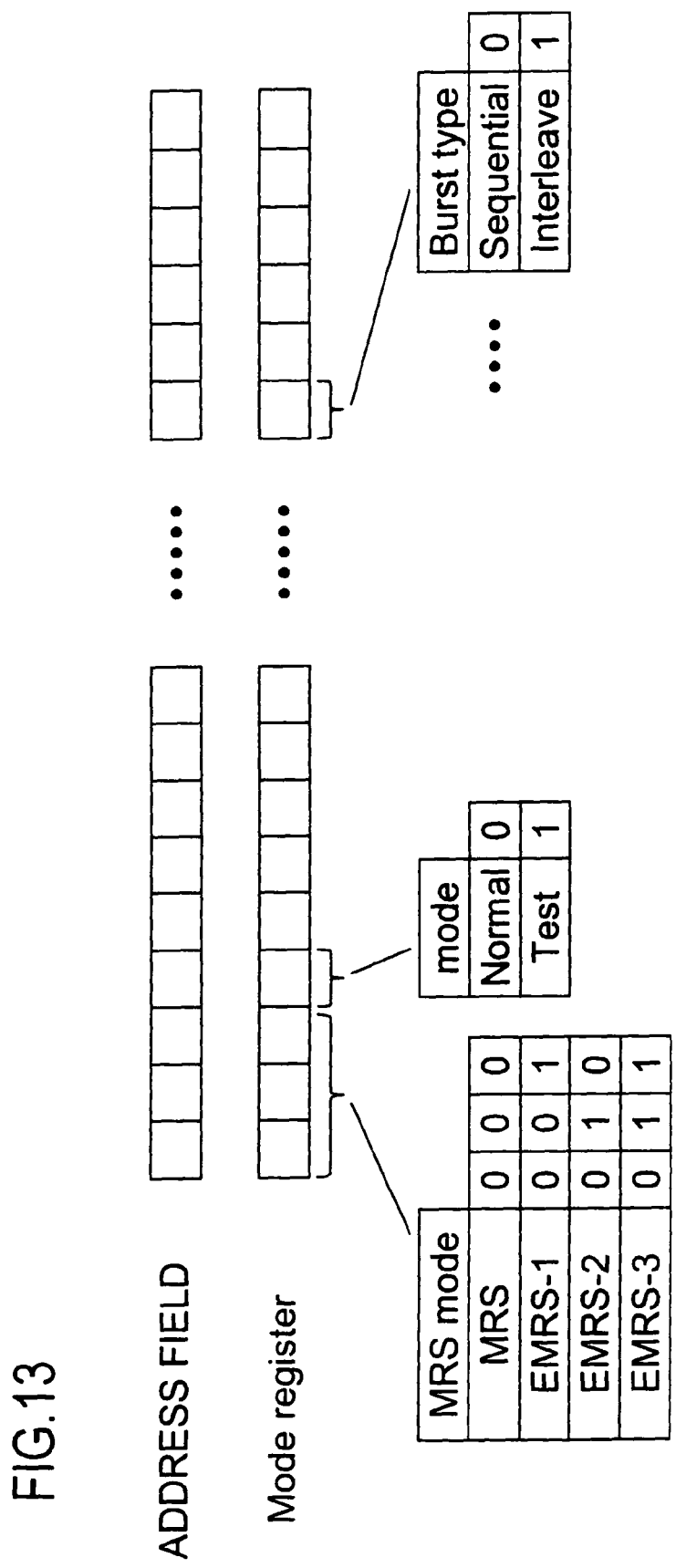
FIG. 13 is a schematic view showing an illustrative mode register command in the initialization sequence.

FIG. 13 depicts an instance of a mode register command MRS (Mode Register of FIG. 6) out of multiple mode register commands. For example, it is selected, by the value entered in an address field, whether the operating mode is a normal mode (Normal) or a test mode (Test), or whether the burst type (Burst Type) is sequential (Sequential) or interleaved (Interleaved).

Referring again to FIG. 12, in the next mode register command EMRS (3), the control information of the timing generator is set (step S5). Initially, the access specifications (AC Spec) of a DRAM chip are read (step S51).

Figure 14:
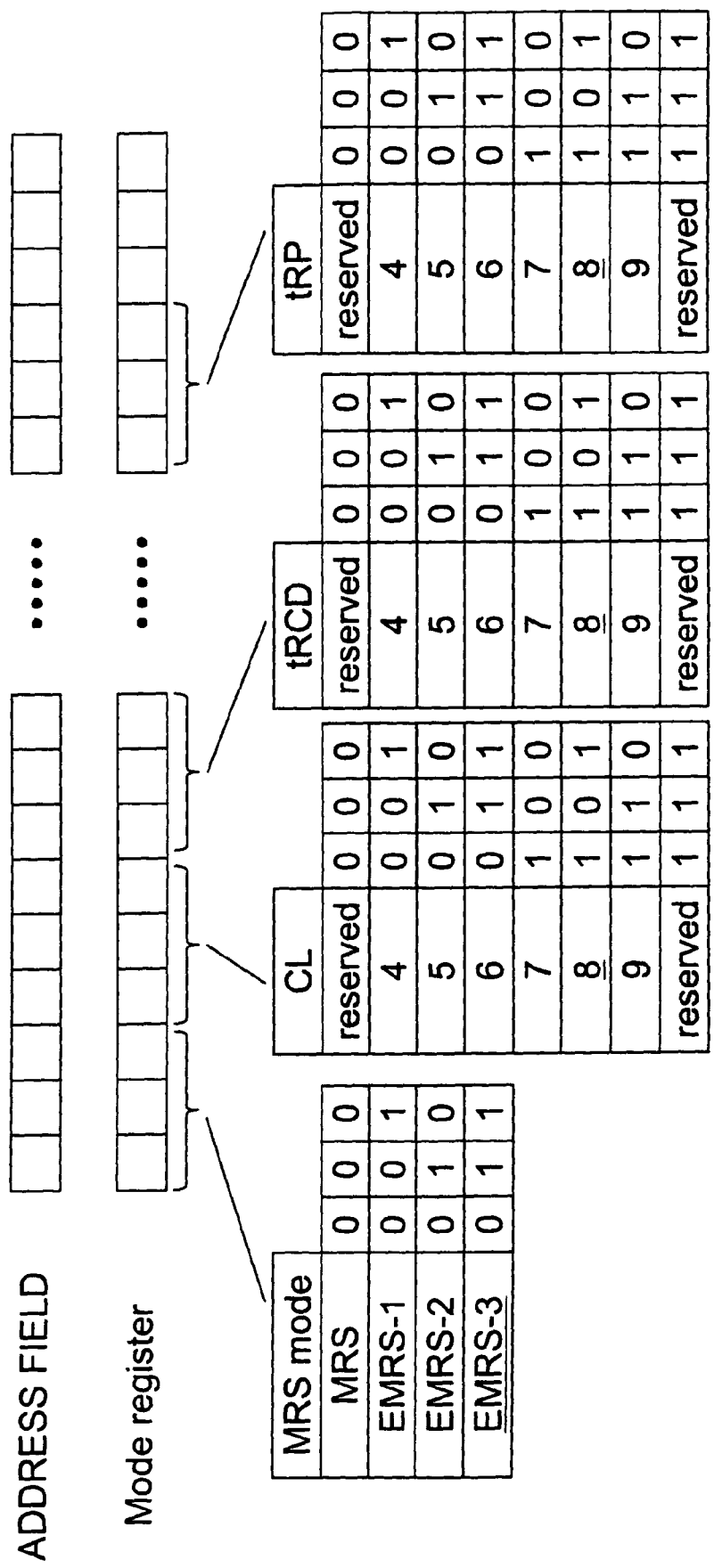
FIG. 14 is a schematic view showing another illustrative mode register command in the initialization sequence.

In each address field, the access specifications, such as column latency CL, active-column command delay tRCD and a precharge command period tRP, are stored in terms of numbers of clocks, as shown in FIG. 14.

For example, as shown in FIG. 14, information items including:

8 clocks for CL (CAS latency);
8 clocks for tRCD (Active to read and write command); and
8 clocks for tRP (Row Precharge)

are stored in the mode register.

Referring to FIG. 12, numerical values of the access specifications (AC Spec) of the mode register information, read next, are loaded in a timing register (step S52). The information loaded in the timing register may be stored in a ROM outside of the DRAM chip or by severing the fuses in the DRAM chip.

FIG. 15 shows a part of the control information of the timing signal within the DRAM in certain access specifications of a DRAM. FIG. 15A shows an instance of correspondence between the specifications of tRCD and PDLEQ, PMWL and PSAN, and FIG. 15B shows an instance of correspondence between the specifications of tRP and PDLEQ, PMWL and PSAN.

In the instance shown in FIG. 14, the access specifications of tRCD and tRP are each set in terms of 8 clocks. The description of FIG. 15 is made of the case of 8 clocks each.

During the access time tRCD as from receipt of the activation command PACTV until receipt of a column command, the timing control signals needed for the operation inside the DRAM are the precharge timing signal PDELQ, word line timing signal PMWL and the sense amplifier timing signal PSAN, as mentioned above.

It is noted that tRCD is eight clocks. The numbers of the timing signals entered in respective rows of the eight clocks have the following meaning: The precharge timing signal PDELQ, for example, is controlled to be output after 1.4 clocks as from the clock directly after delivery of the activation command PACTV.

The meaning of the 1.4 clocks is that the clock duration is the sum of one clock cycle of the clock CKa and four cycle clocks of the clock CKb.

In similar manner, the word line timing signal PMWL and the sense amplifier timing signal PSAN are output at the 2.3rd clock and at the 4.7th clock, respectively, from the timing generator. The same applies for the precharge command period tRP.

An information table for the timing signal outputting time points, which are in keeping with respective access specifications, are pre-stored for the cases of the access specifications tRCD other than 8 clocks, as shown in FIG. 15.

The above information is stored in fuses or in a ROM, and is written by the mode register command EMRS(3) in the timing register, as shown in FIG. 12 (step S53).

Referring to FIG. 12, setting is then made by the mode register command EMRS(1) (step S6), a mode register command MRS (step S7), precharge all (step S8), all refresh (step S9), a mode register command MRS (step S10), and by an on-chip driver (OCD) calibration (step S11). Thus, a standby state for accepting the normal operation is set (step S12). The foregoing is the sequence for power-up and initialization.

It would be convenient if the setting values of the timing register, described above, could be delivered as output to a DQ pad.

For example, the debugging time would be shortened if, in the test mode, the values of the timing register could be delivered to outside as output. Any suitable routine technique, as provided in e.g. JTAG (Joint Test Action Group), may be used as outputting means to the DQ pad.

In the present Example, the setting values of the timing register of FIG. 6 may be changed in the test mode. Changes in the setting values of the timing register in the test mode would allow for timing adjustment following the mask designing to contribute appreciably to improving the chip yield.

Figure 16A:
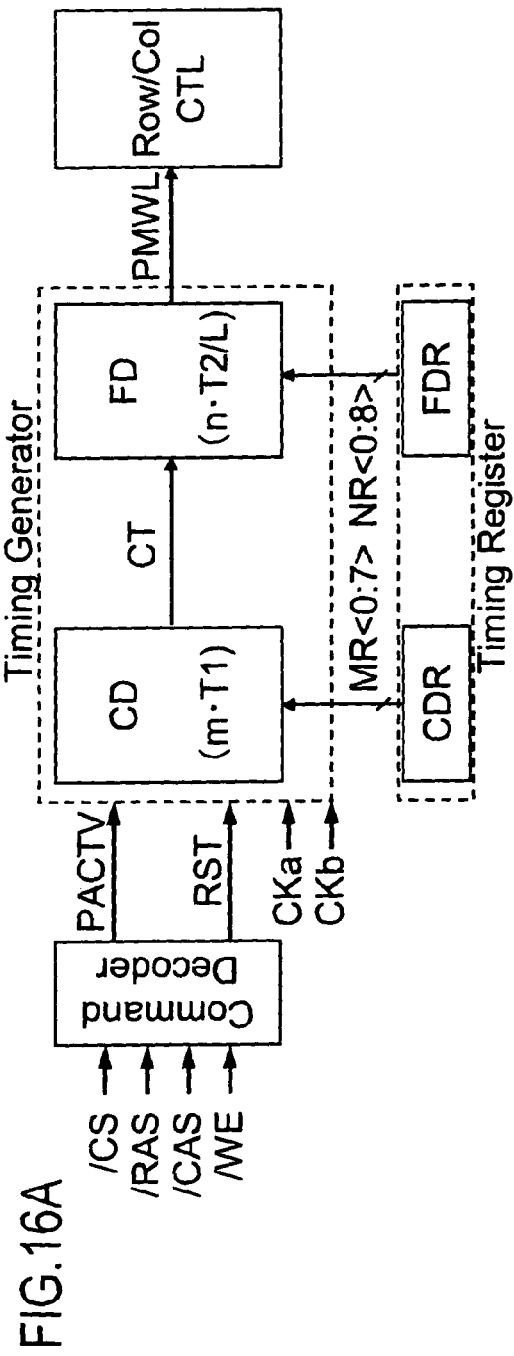
FIGS. 16A and 16B are a schematic view showing an arrangement of a timing generator of an Example of the present invention and an illustrative operating waveform.
Figure 16B:
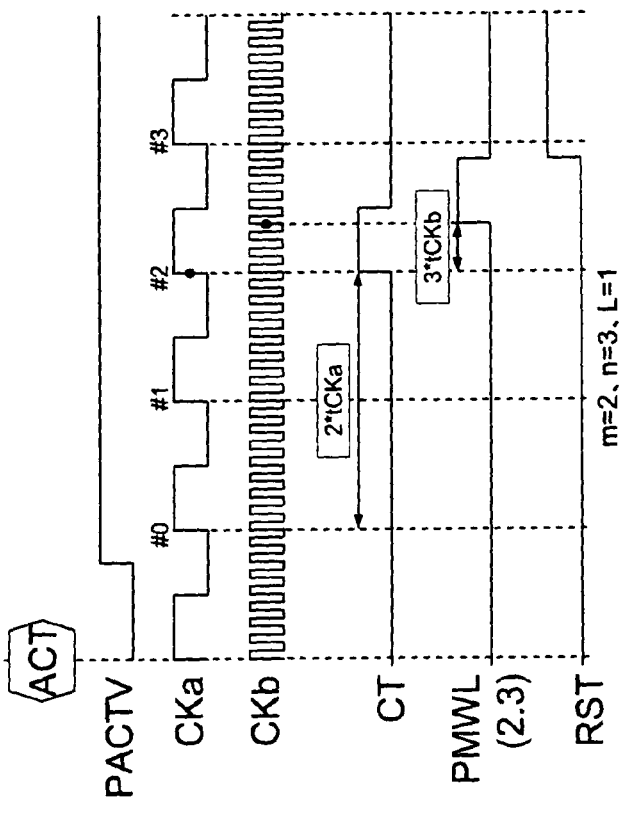

FIG. 16A shows an arrangement of the timing generator shown in FIG. 1 or 6, and FIG. 16B shows its illustrative operating waveform.

The timing generator receives the decoded signal and the reset signal RST from the command decoder, while receiving the clock CKa with the period equal to T1 and the clock CKb with the period equal T2 from the clock generating circuits.

The timing generator includes a coarse delay circuit (CD) (coarse delay timing generator) and a fine delay circuit (FD) (fine delay timing generator). The coarse delay circuit (CD) and the fine delay circuit (FD) are controlled by a coarse delay register (CDR) (coarse delay timing register) and a fine delay register (FDR) (fine delay timing register), respectively. The coarse delay register (CDR) and the fine delay register (FDR) make up the timing register of FIG. 6. The coarse delay circuit (CD) is supplied with the clock CKa, generated by the clock generator of FIG. 6 (Clock A Generator), to generate a coarse delay timing signal CT delayed by m·T1 as from the rising edge of the clock CKa at a time point of activation of the activation signal PACTV from the command decoder. The value of m is transmitted from the coarse delay register, and is equal to 2 (m=2) in the case of FIG. 16B.

The fine delay circuit (FD) is supplied with the clock CKb, generated by the clock generating circuit of FIG. 6 (Clock B Generator), and outputs a fine delay timing signal delayed by n·T2 as from a timing of outputting the coarse delay timing signal CT. FIG. 16B shows a case of generating the word line activating signal PMWL (see FIG. 1). The value of n is transmitted from the fine delay register (FDR) and, in the instance shown in FIG. 16B, is equal to 3 (n=3).

FIG. 16 shows, for simplicity, a configuration in which the timing generator includes only one set made up of the coarse delay circuit (CD) and the fine delay circuit (FD). In case the timing generator generates PDLEQ, PMWL and PSAN of FIG. 1, it includes three sets each made up of the coarse delay circuit (CD) and the fine delay circuit (FD), and generates PDLEQ, PMWL and PSAN from the fine delay circuit (FD) of each set.

The delay time as from the edge (#0) of the clock CKa corresponding to the time point of activation of the activation signal PACTV down to the word line timing signal PMWL is m·T1+n·T2. In the example of FIG. 16B, L(number of phases)=1. The delay time increases by T1 each time m is incremented, and by T2 each time n is incremented.

With the use of the timing generator, the fine delay timing signal is determined by the periods T1 and T2, L, m and n, and hence is unsusceptible to variations caused by temperature changes of device-based fluctuations. Only fixed delay, which accounts for a small fraction of the entire delay and, in practical circuits, only the fixed delay which occurs when the clock signal traverses the circuit, and which corresponds to the delay time generated without dependency on the clock period, is affected by these variations. It is thus possible to reduce appreciably the proportion of the variations to the entire delay.

Figure 35:
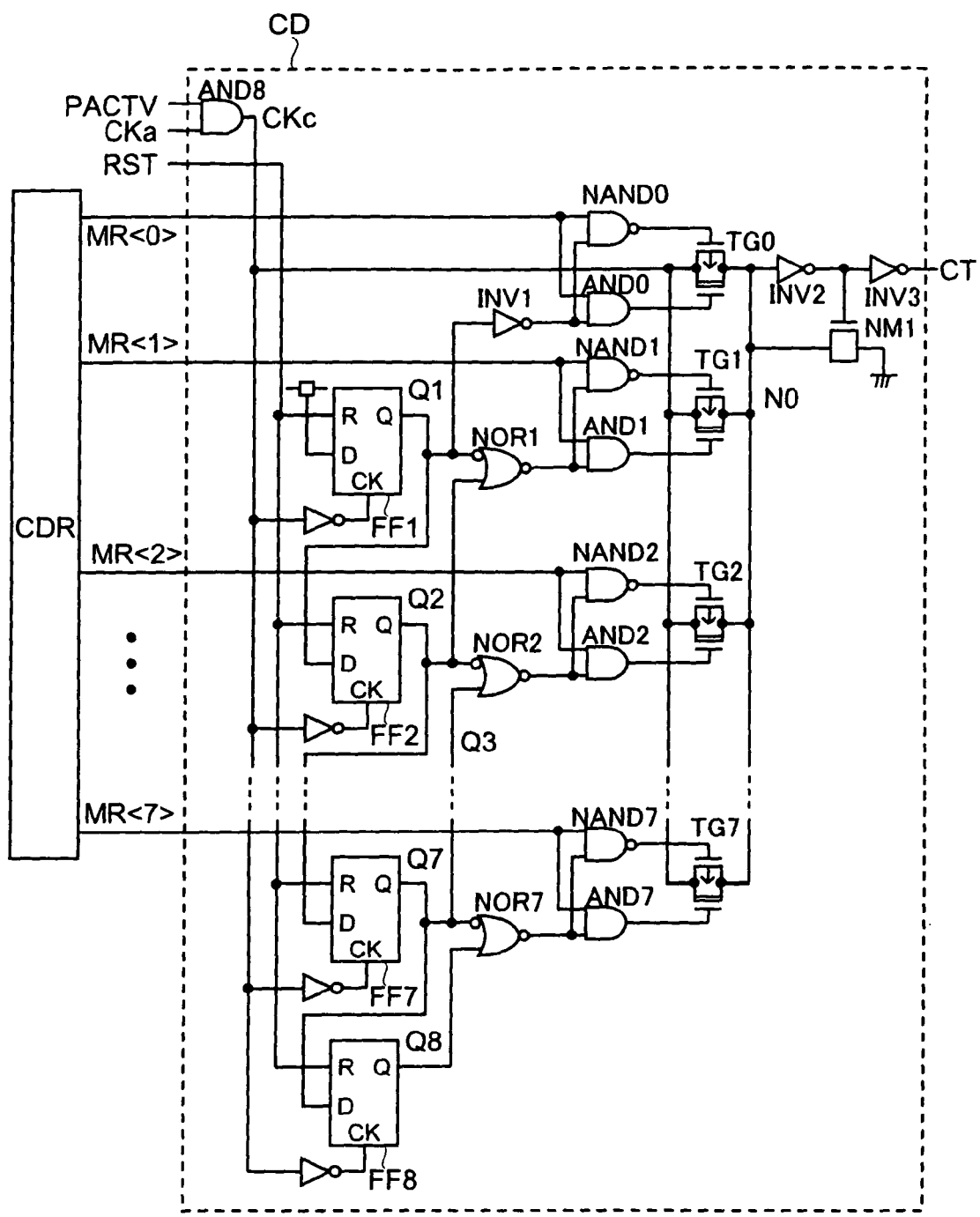
FIG. 35 is a circuit diagram showing an illustrative arrangement of a coarse delay circuit (CD) of FIG. 16.

It is of course possible to use an L-phase clock as CKb. The L-phase clock has a phase difference of T2/L with respect to the clock period T2. The following description is directed to an illustrative configuration of the coarse delay circuit (CD) and the fine delay circuit (FD) in which the clock generator of FIG. 6 (Clock A Generator) generates CKa of the period T1 synchronized with the external clock CK (/CK) and in which the clock generator of FIG. 6 (Clock B Generator) generates CKb of the period T2 synchronized with the external clock CK (/CK), with L equal to 1. FIG. 35 shows a configuration of the coarse delay circuit (CD) of FIG. 16.

FIG. 35 shows an instance of the circuit configuration of the coarse delay circuit (CD) of FIG. 16A. Referring to FIG. 35, the coarse delay circuit (CD) includes a shift register made up of a plurality of flip-flops (FF1 to FF8) interconnected in cascade. The shift register operates as a counter that counts the clocks. Based on the m-selection signal MR<0:7> from the coarse delay register (CDR) and on an output of a relevant stage of the shift register, the coarse delay circuit (CD) selects one of CMOS based transfer gates (TG0, TG1, . . . , TG7) to be turned on to generate the coarse delay timing signal (CT) delayed from the clock A (CKa) by m periods.

An AND gate (AND8) receives the activation signal (PACTV) and the clock (CKa). If the activation signal (PACTV) is in activated state (High), the clock (CKa) is transmitted and output as clock (CKc). If conversely the activation signal (PACTV) is in deactivated state (Low), a fixed value LOW is output, that is, the clock is masked.

The transfer gates (TG0, TG1, . . . , TG7) receive the clock (CKa) in common, and have outputs connected to a node (N0) in common. The node (N0) is connected to the coarse delay timing signal (CT) via inverters (INV2) and (INV3). The inverter INV3 is an inverting buffer.

The transfer gate TG0, associated with the activated one MR<0> of the m-selection signals, is selectively turned on when the output Q1 of the next stage flip-flop FF1 is Low. The transfer gate thus outputs CKc as CT. When the output Q1 of FF1 goes High at the next clock cycle, TGi is turned off, so that the one-shot pulse is output as CT.

The transfer gate TGi corresponding to an activated one MR<i> of the m-selection signals, where i is 1 to 7, is selectively turned on in case an output Qi of the corresponding stage flip-flop FFi is High and an output Qi+1 of the next stage flip-flop FFi+1 is Low. The transfer gate TGi then outputs CKc as CT. When the output Qi of the corresponding stage flip-flop FFi is High and the output Qi+1 of the next stage flip-flop FFi+1 is High, during the next clock cycle, the transfer gate TGi is turned off, as a result of which the one-shot pulse is output as CT. The NMOS transistors (NM1), the gate of which receives the output of INV2, and the source and the drain of which are grounded and connected to the node (N0), respectively, is turned on in case the output of INV2 is High. The transistor NM1 then discharges electric charge from the node (N0) to set it to the ground potential.

More specifically, an output of the NAND gate (NAND0) and an output of the AND gate (AND0) are connected to the gates of a PMOS transistor and an NMOS transistor of the transfer gate (TG0), respectively. The NAND gate (NAND0) receives MR<0> out of the m-selection signals MR<0:7> and an output of the inverter INV1 that inverts the output Q1 of FF1, while the AND gate (AND0) receives the output of INV1 and MR<0>. If, with the activation signal PACTV and MR<0> both in activated state (High), the output Q1 of FF1 is Low, outputs of NAND0 and AND0 become Low and High, respectively, so that TG0 is turned on. If, with the activation signal PACTV and MR<0> both in activated state (High), the output Q1 of FF1 is High, the outputs of NAND0 and AND0 become High and Low, respectively, so that TG0 is turned off. That is, at a cycle 0 at the time point when the activation signal PACTV is activated, with the number of the rising edges of the clock CKc being then zero (zero shot), TG0 is turned on to output CKa to node N0 and thence via buffers (INV2 and INV3) to CT.

The first stage flip-flop FF1 has a data input terminal (D) connected to the power supply (VDD), and has a clock terminal (CK) supplied with a signal obtained by inverting CKc by an inverter. The output Q1 of FF1 is connected to the data input terminal (D) of the next stage flip-flop FF2, while being inverted and delivered to a NOR circuit (NOR1) as a negative logic input. An inverting output terminal Q1B of FF1, not shown, may thus be connected to this input of NOR1. The output Q1 of FF1 is delivered via INV1 to AND0, as mentioned above. An output Q2 of the next state flip-flop FF2 is supplied to the other input of NOR1, an output of which is supplied as an input to AND1. The NOR circuit NOR1 outputs High when the output Q1 of FF1 is High and the output Q2 of FF2 is Low, and outputs Low if otherwise. An output of NAND1 that receives MR<1> and the output of NOR1, and an output of AND 1 that receives the output of NOR1 and MR<1>, are connected respectively to the gates of the PMOS transistor and the NMOS transistor of the transfer gate TG1.

It is supposed that if, with the activation signal PACTV and MR<1> in activated state (High), the flip-flop FF1 has sampled the power supply potential with the falling edge of CKc, its output Q1 is High and the output Q2 of FF2 is Low, that is, that the power supply potential signal has not been shifted down to FF2. In this case, the output of NOR1 becomes High, while the outputs of the NAND1 and AND1 become Low and High, respectively, to turn on TG1. If, with the activation signal PACTV and MR<1> in activated state (High), both the output Q1 of FF1 and the output Q2 of FF2 become High, that is, the power supply potential signal has been shifted down to FF2, the output of NOR1 goes Low, while the outputs of NAND1 and AND1 become High and Low, respectively, to turn off TG1. That is, TG1 is turned on responsive to the falling of the first shot of clock CKc as from the time point of activation of the activation signal PACTV to deliver the clock CKc to the node N0 and thence to CT via the buffer (INV2, INV3). When TG1 is on, the node N0 is discharged via NMOS transistor NM1 to the grounded terminal in response to transition from High to Low of CKa. The transfer gate TG1 is turned off in response to the falling of the second shot of the clock CKc.

The flip-flops of the next and the following stages FF2 to FF7 are arranged in similar manner. An output of FF8 is delivered to NOR7 corresponding to the previous stage flip-flop FF7. RST is connected in common to reset terminals (R) of FF1 to FFF8. When RST is High, output terminals Q1 to Q8 of the flip-flops are reset to Low. FF1 is responsive to the falling edge of the first shot clock pulse of CKc to sample and output the high potential (power supply potential). FF2 to FF7 are responsive to falling edges of the second to seventh shot clock pulses of CKc, respectively, to sample and output the High potential output from the previous stages of the flip-flops FF1 to FF6. The flip-flop FF8 is responsive to the falling edge of the seventh shot clock pulses of CKc to sample and output the High potential output from FF7.

Figure 36:
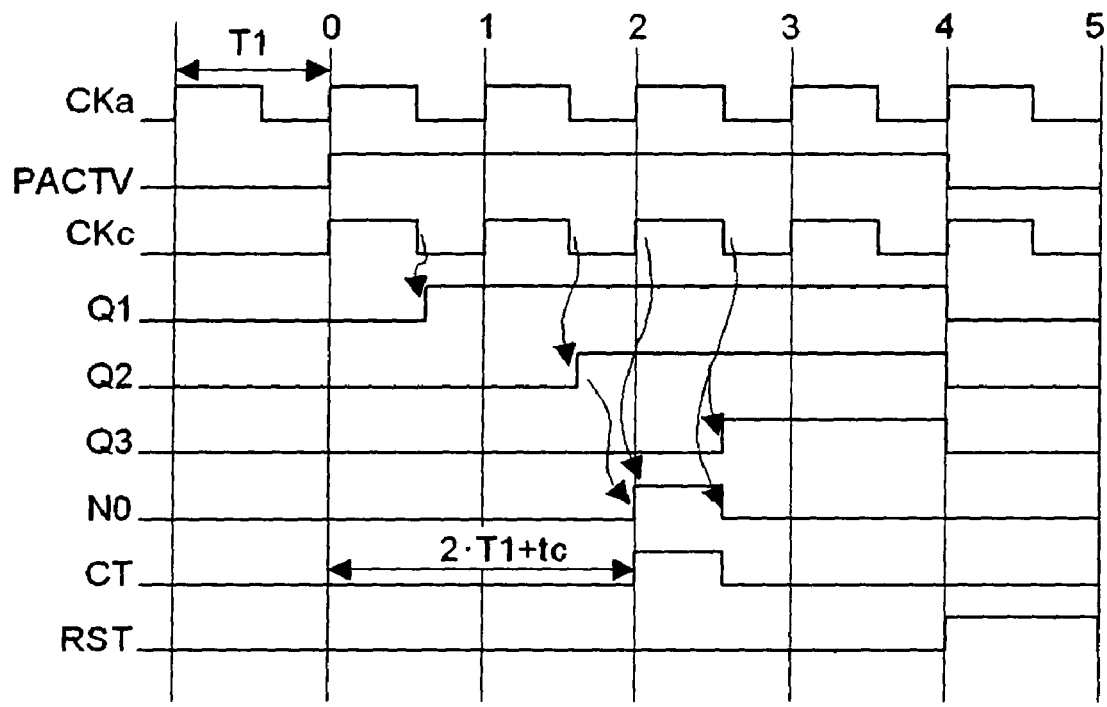
FIG. 36 is a circuit diagram showing an illustrative operation of the coarse delay circuit (CD) of FIG. 35.

FIG. 36 depicts a timing diagram for illustrating the operation of the coarse delay circuit (CD) of FIG. 35. The clock CKa (with the period of T1) is ANDed by gate AND8 with the activation signal (PACTV) to form CKc which is then supplied as a shift clock to the shift register composed of FF1 to FF8. Since a signal inverted from CKc is delivered to clock terminals of the shift register, the High potential signal is sequentially transferred, every clock cycle, from Q1 to Q7, by the falling edges of CKc. In FIG. 36, Q1 to Q4 are responsive to the falling edges of CKc to become sequentially High in potential, during the clock cycles 0 to 3 as from the time point the activation signal PACTV has become High. At the clock cycle 4, RST is brought High, so that the outputs Q1 to Q8 of FF1 to FF8 are reset to Low.

At a falling edge of CKc of clock cycle 1, more precisely, at the second falling edge of CKc from the time of activation of the activation signal (PACTV), the output terminal Q2 of FF2 transitions from Low to High. With m=2, MR<2> is High, such that the transfer gate TG2 is rendered conductive via a selector (AND2, NAND2 and NOR2). That is, with MR<2> High, output Q2 of FF2 High and with output Q3 of FF3 Low, the output of NOR2 is High, the output of the gate NAND2 is Low and the output of the gate AND2 is High. This causes both the PMOS transistor and the NMOS transistor of the transfer gate TG2 to be turned on. In this state, the second rising edge of CKc passes through TG2 to generate a delay of 2·T1+tc at the node (N0).

As from the falling edge of CKc, more precisely, as from the third falling edge of CKc of the clock cycle 2, since the time of activation of the activation signal PACTV, the output Q2 of FF2 becomes high, whilst the output Q3 of FF3 becomes High. Thus, the output of the gate NOR2, the output of NAND2 and the output of AND2 become Low, High and Low, respectively, and hence the PMOS transistor and the NMOS transistor of TG2 are both turned off, so that the transfer gate is non-conductive.

In the clock cycle 2, the pulse of the clock CKc, transferred to the node (N0), is output as coarse delay timing signal (CT), via inverters INV2 and INV3. When the clock CKc, transferred to the node (N0), transitions from High to Low, the output of the inverter INV2 becomes High. This causes the path transistor NM1 to be turned on to discharge electrical charge from the node (N0) to set the potential at the node (N0) to Low.

Thus, a single-shot pulse (one-shot pulse) having a delay of m·T1+tc prescribed by m (MR<0> to <7>) from CDR, where tc is a delay caused when the clock pulse CKa propagates through the coarse delay circuit (CD) of FIG. 35, may be generated as the coarse delay timing signal (CT). For example, tc corresponds to the sum of propagation delay time in AND8, transfer gate, INV2 and INV3.

With the coarse delay circuit (CD) of FIG. 35, it is possible to generate delay with only little variations with respect to temperature or process variations. Furthermore, it is not the shift register output itself that is output as the coarse delay timing. The transfer gate, passed through by CKc, is rendered conductive (turned on) beforehand by the falling edge of CKc of the previous clock cycle. It is thus possible to shorten the path passed by the clock to diminish the time difference between the output and the clock edge. Referring to FIG. 36, with MR<2> High, for example, the output Q2 of FF2 becomes High with the falling edge of CKc of the clock cycle 1, in response to which TG2 is rendered conductive (turned on) to transfer the High pulse of CKc of the clock cycle 2 via TG2 to the node (N0). The clock CKc has to pass only through TG2, which is rendered conductive, before the clock is output to the node (N0), thus decreasing the time difference between the output and the edge of clock CKc. It is thus possible to suppress the effect by variations in delay time in the coarse delay timing signal (CT) caused by changes in the process, voltage or temperature.

Figure 37:
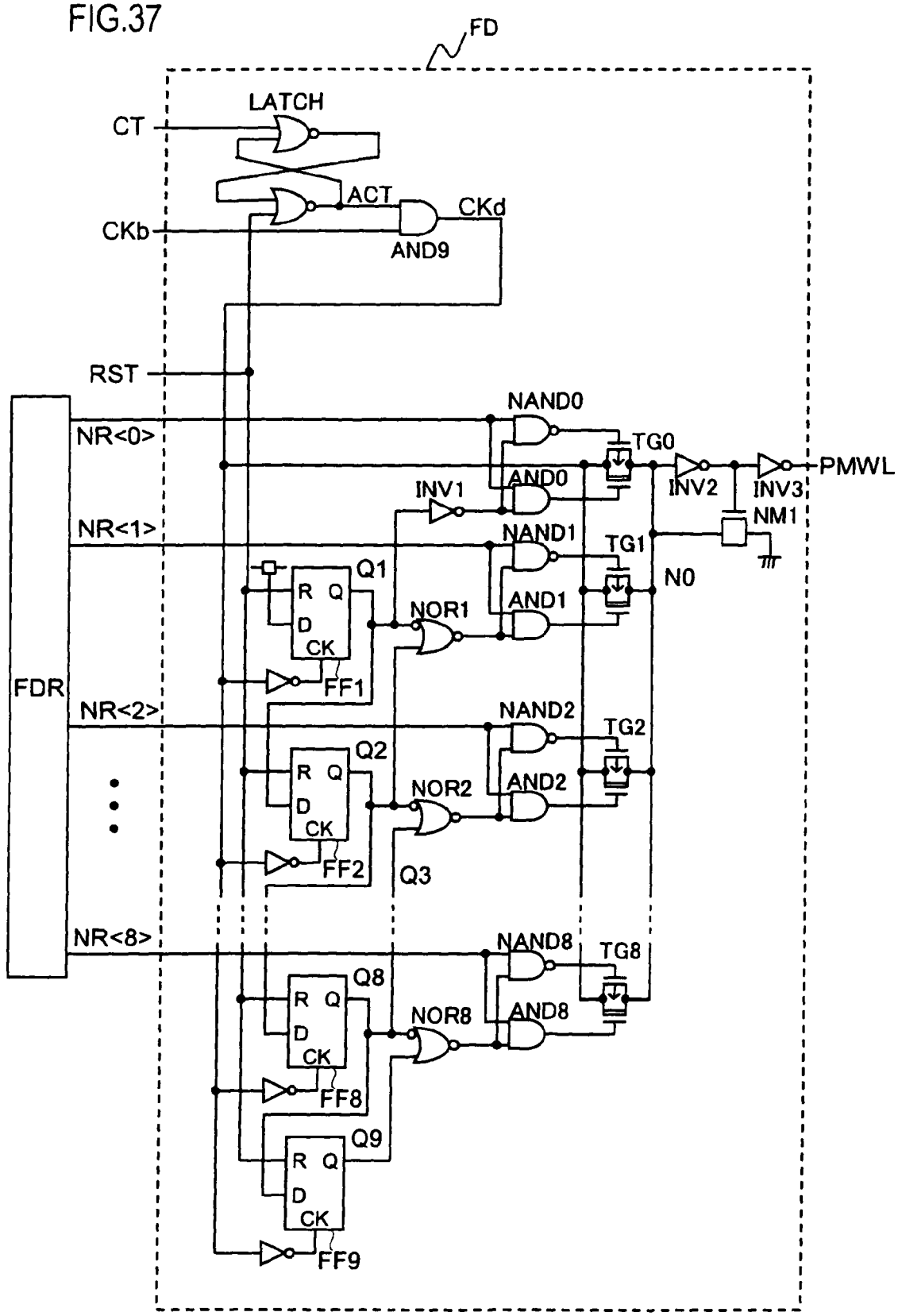
FIG. 37 is a circuit diagram showing an illustrative arrangement of a fine delay circuit (FD) of FIG. 16.

The clock CKb may be a clock, the frequency of which is multiplication of the frequency of the clock CKa, though not in a limiting way. In this case, the fine delay timing generator (FD) of FIG. 16A may be configured similarly to that of FIG. 35 except that the signal ACT generated based on the output signal CT from the coarse delay timing generator (CD) of the previous stage is used as the activation signal, CKb is used as input clock, and the number n, deciding the delay, is supplied from the fine delay timing register (FDR). FIG. 37 shows a typical arrangement of the fine delay timing generator (FD) of FIG. 16. In FIG. 37, parts or components similar to those of FIG. 35 are denoted by the same reference numerals or symbols. Referring to FIG. 37, an output of an SR latch, set by a High pulse of the output signal CT from the coarse delay timing generator (CD) is used as an activation signal (ACT). The SR latch (LATCH) used here is a NOR-gate latch.

In the arrangement of FIG. 37, the SR latch (LATCH) is reset by a High of the reset signal RST, whereby the activation signal (ACT) is reset to Low. The SR latch (LATCH) is set by a High of the coarse delay timing signal (CT), whereby the signal ACT goes High. The signal ACT is ANDed with CKb by AND9 and inverted to form a clock CKd which is supplied common to clock terminals of FF1 to FF9. At a time point that, in case NR<3> is High, with the other NR signals being Low, a High (power supply potential) is transferred from the FDR to the corresponding FF3, not shown, by the clock CKd, the transfer gate TG3, not shown, is turned on. A pulse of CKd is propagated to the node N0 and output as PMWL. The operation of the circuit of FIG. 37 is basically the same as that of the circuit of FIG. 35 except that the clock period is T2 different from that of FIG. 35.

Figure 38:
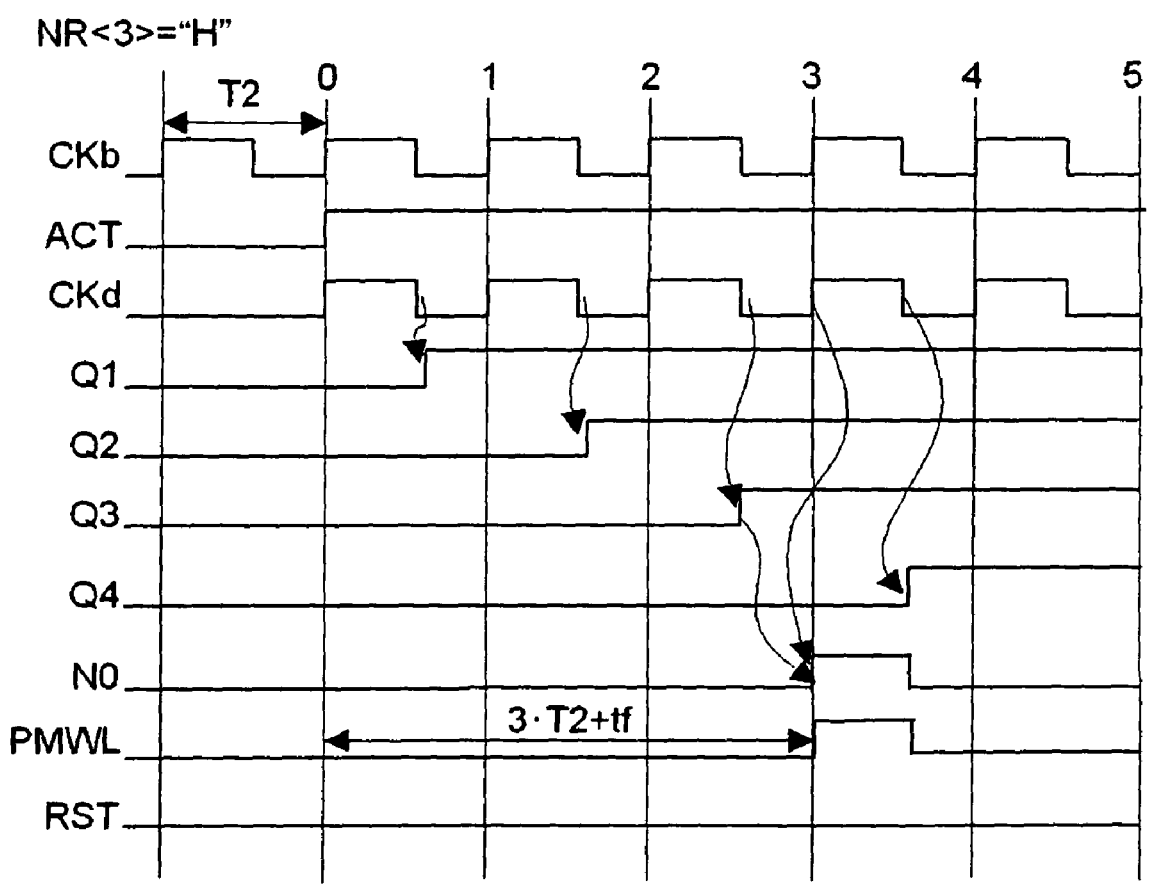
FIG. 38 is a circuit diagram showing an illustrative operation of the fine delay circuit (FD) of FIG. 37.

Referring to FIG. 38, part of the operation for the case of n=3 (NR<3>=High) in the circuit of FIG. 37 will now be described. Meanwhile, the clock cycles 0 to 5 of FIG. 38 are equivalent to the clock cycle 3 of FIG. 36, and are only shown enlarged, with the reset signal RST remaining High. The outputs Q1 to Q4 of FF1 to FF4 become High and thereafter are kept High until RST becomes High. Referring to FIG. 38, the pulse of clock CKd, transmitted to the node (N0), is output, at the clock cycle 3, as timing control signal PMWL via inverters INV2 and INV3. On transition from High to Low of the clock Cd, transmitted to the node (N0), the output of the inverter INV2 becomes High to turn on the path transistor NM1. This discharges electric charge from the node (N0), which node (N0) then falls to Low potential.

The timing control signal PMWL is thus a one-shot pulse which rises with a delay of n·T2+tf, as determined by n (NR<0> to NR<8>), from the rising edge of CT where tf denotes a delay caused when the clock pulse CKb traverses the fine delay circuit (FD) of FIG. 37. For example, tf corresponds to the sum of propagation delay time in the SR latch (LATCH), AND9, transfer gate, INV2 and INV3.

By the timing operation of FIGS. 36 and 38, PMWL rises at a timing of 2·tCKa (=T1)+3·tCKb (=T2) as from the rising of the activation signal PACTV to High, as shown in FIG. 16B.

The timing generator, described above with reference to FIGS. 35 to 38, is only illustrative, and may be of any suitable circuit configuration provided that the function as well as the operation shown in FIG. 16 may thereby be fulfilled.

Although the clock is a single-phase clock, with L=1, in the above Example, L may be an integer not less than 2. It is thus possible to use multi-phase clocks, the timing phases of which are displaced by T2/L from one another, as CKb. The delay time td as from the effective edge (rising edge) of the first clock at the time point of activation of the activation signal PACTV until the effective edge (rising edge) of the timing signal may be a sum of T1 multiplied by m or m·T1 and (T2/L) multiplied by n or n·(T2/L), that is, m·T1+n·(T2/L) (td=m·T1+n·(T2/L)). In this case, the coarse delay circuit (CD) in FIG. 16 may output the coarse delay timing signal (CT) with a delay of m·T1 as from the effective edge of the first clock (CKa) at the time point of activation of the activation signal (PACTV). Then, based on the result of detection of the second clock (CKb) having an effective edge at the same time as or at a time immediately following the effective edge of the first clock (CKa) at the time point of activation of the activation signal (PACTV), the fine delay circuit (FD) may derive a second clock having an effective edge at the same timing as the effective edge of the m'th cycle of the coarse delay timing signal (CT) as from the effective edge of the first clock at the timing of activation of the activation signal (PACTV). The fine delay circuit (FD) may then re-array a set of L of the above second clocks so that the second clock derived as described above will be the phase 1 of the L-phase clock, thereby generating an L-phase fine delay clock with a delay amount equal to n·(T2/L). Or, the fine delay circuit (FD) may sample the coarse delay timing signal (CT) from the coarse delay circuit (CD) with the timings of the L-phases of the second clock. The fine delay circuit may then generate a signal with a delay of n·(T2/L), based on the sampled signal, and select one of the L phases to output a fine delay timing signal with a delay amount equal to n·(T2/L).

Figure 17:
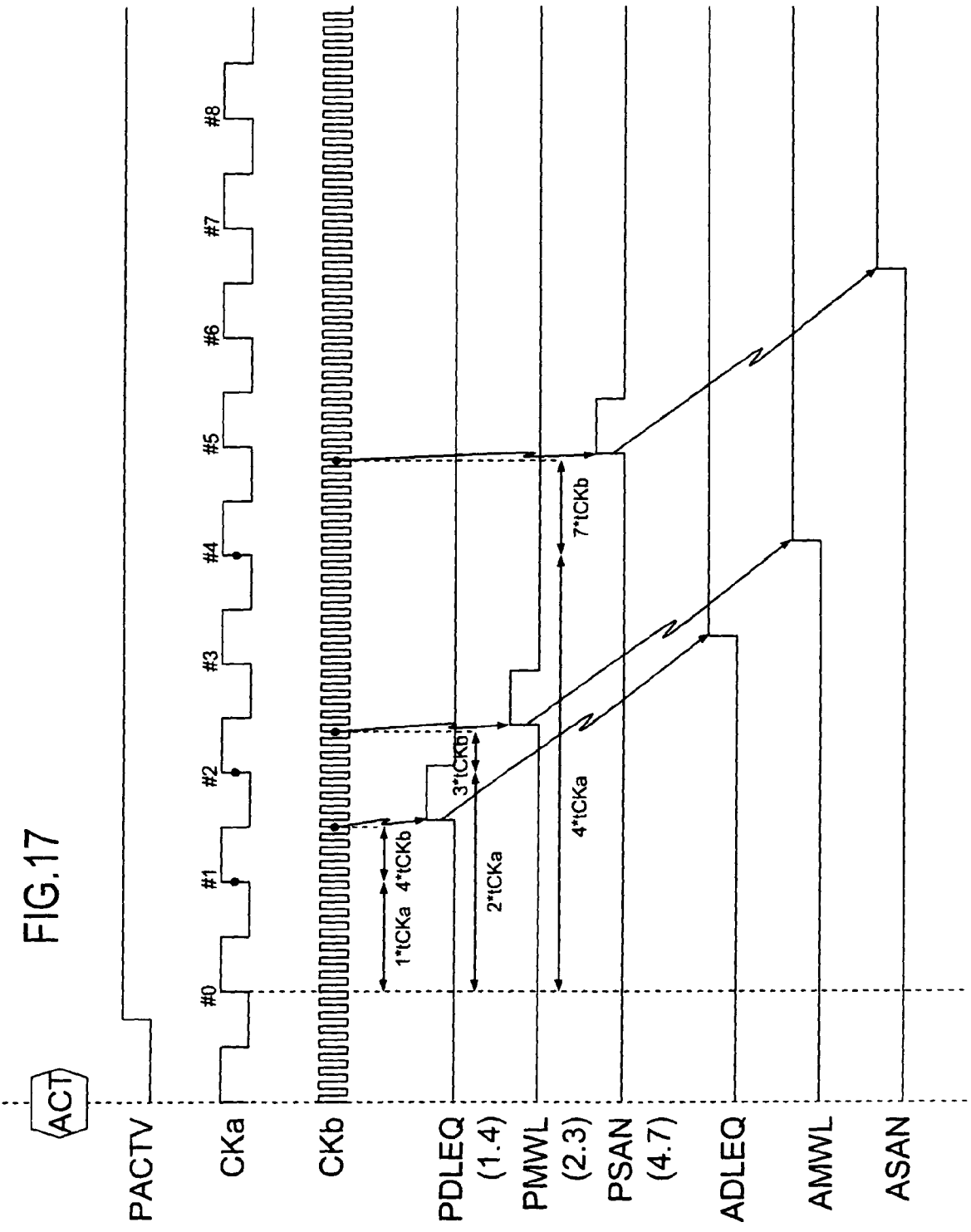
FIG. 17 is a timing diagram showing an illustrative operating waveform at the time of activation of the DRAM chip employing the timing generator of the Example of the present invention.

FIG. 17 depicts an operating waveform at the time of activation of a DRAM chip including a timing generator of the present Example.

An Example shown in FIG. 17 has operating waveforms of various timing signals, with tRCD being of eight clocks. Initially, the activation signal PACTV is received.

Then, at a desired timing, that is, after lapse of 1·CKa clock time as counted from the clock #0 directly following the reception of the activation signal PACTV plus 4 CKb clock time, a precharging timing signal (PDLEQ) is output from the timing generator and supplied to the array logic AL0.

In similar manner, the word line timing signal PMWL is supplied to the array logic (AL1), after lapse of time of 2·CKa clock time plus 3·CKb clock time.

Further, the sense amplifier timing signal PSAN is supplied to the array logic (AL2), after lapse of time of 4·CKa clock time plus 7·CKb clock time.

The respective timing signals are supplied to the memory cell array as timing signals ADLEQ, ADWL and ASAN, via array control (ARAC), main word driver (MWD) and sense amplifier control circuit (SACTL), respectively.

Figure 18:
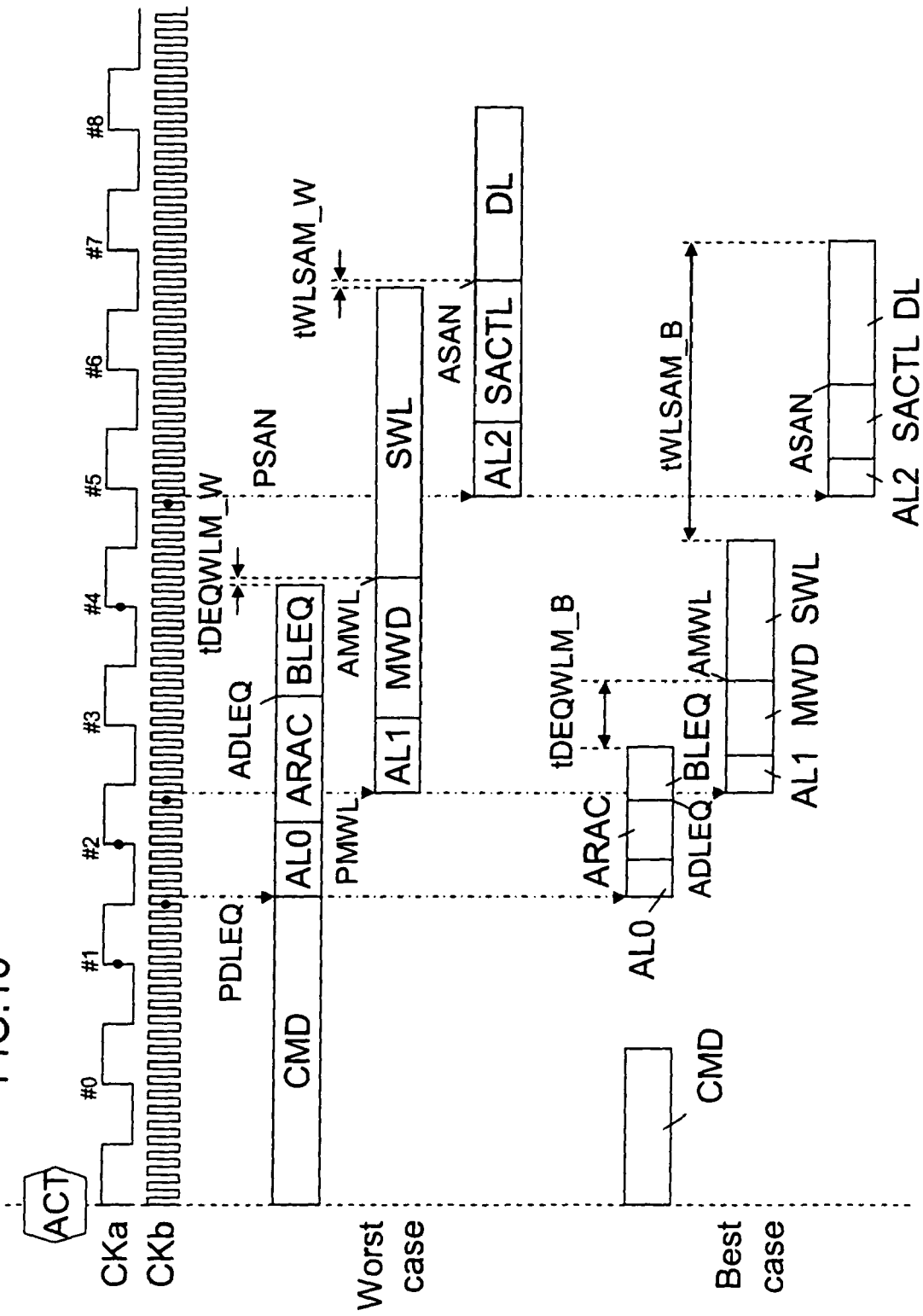
FIG. 18 is a timing diagram showing an operating timing of the DRAM circuit block of FIG. 17.

FIG. 18 depicts an operating timing diagram of a DRAM circuit block shown in FIG. 17. The operating timings of the command decoder, row control, row decoder (RDEC) and the memory cell array are plotted along the horizontal axis.

In FIG. 18, BLEQ is time as from delivery of the precharge timing signal ADLEQ until deactivation of the precharging circuit in the array remotest from the array control (ARAC).

SWL is time as from delivery of the word line timing signal AMWL until start of the word line in the array remotest from the main word driver (MWD).

DL is time that is to lapse as from input of the sense amplifier timing signal ASAN until a signal on the data line in the array remotest from the sense amplifier control circuit SACTL has swung sufficiently. Stated differently, DL is access time in the cell of the worst case operating time.

It is noted that FIG. 18 shows two cases, namely a case where timing designing has been made under a condition of the slowest operation of the circuitry (worst case) within the DRAM, and a case where a chip with worst case timing designing is run under a condition of the fastest operation of the circuitry in the DRAM.

It is seen from FIG. 18 that, with the timing generator of the present Example, the precharge-word line margin tDEQWLM_W (time margin as from deactivation of the precharging circuit until word line activation) may be set at a necessary minimum value.

In similar manner, the word line-sense amplifier margin tWLSAM_W (time margin as from word line activation and delivery of a sufficient readout signal amount to the data line) may be set to a necessary minimum value with the use of the timing generator of the present Example. The result is that the timing margin may be suppressed to a minimum value, thereby shortening the access time.

Figure 34:
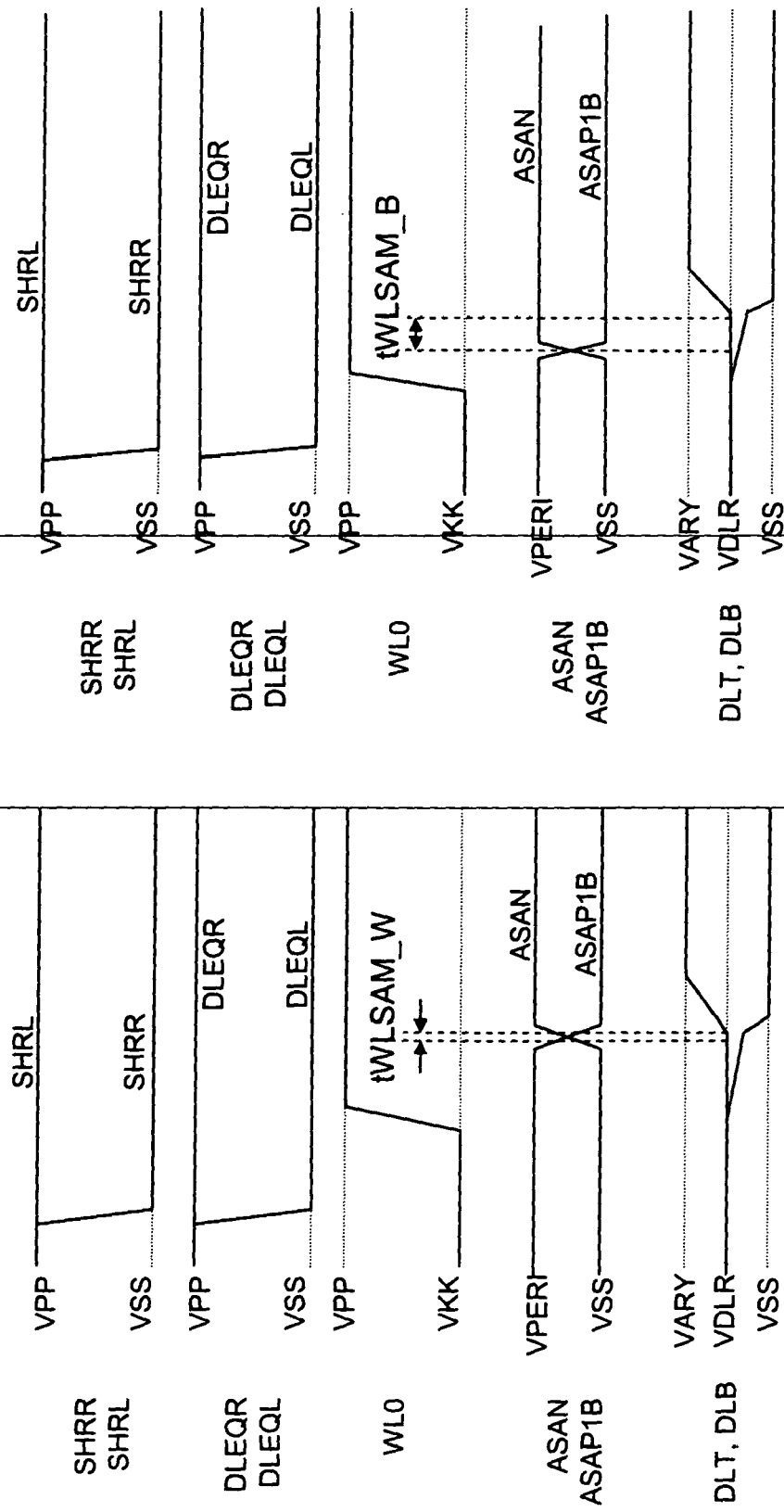
FIGS. 34A and 34B are waveform diagrams showing illustrative operating waveforms of a read error operation in timing control of a typical DRAM chip.

With the DRAM chip of the present Example, no mistaken operation, as explained with reference to FIG. 34, is produced even in case a DRAM array timing-designed for the worst case is run on the best case side.

The reason is that the start timing of the timing signal is digitally controlled by multiple clocks. Although the operating timing of each circuit block within the DRAM becomes shorter on the best case side, the timing signal start timing is digitally controlled, and hence the delay time of the timing control signal may not be made shorter.

There is thus no possibility that a sense amplifier circuit is activated before a sufficient amount of the read signal is output on the data line pair, so that sufficient time margins (tDEQWLM_B or tWLSAM_B) may be assured. A stable read operation may be achieved because variations in the manufacture process, changes in power supplies or changes in temperature may be suppressed to the smallest values possible.

Figure 19:
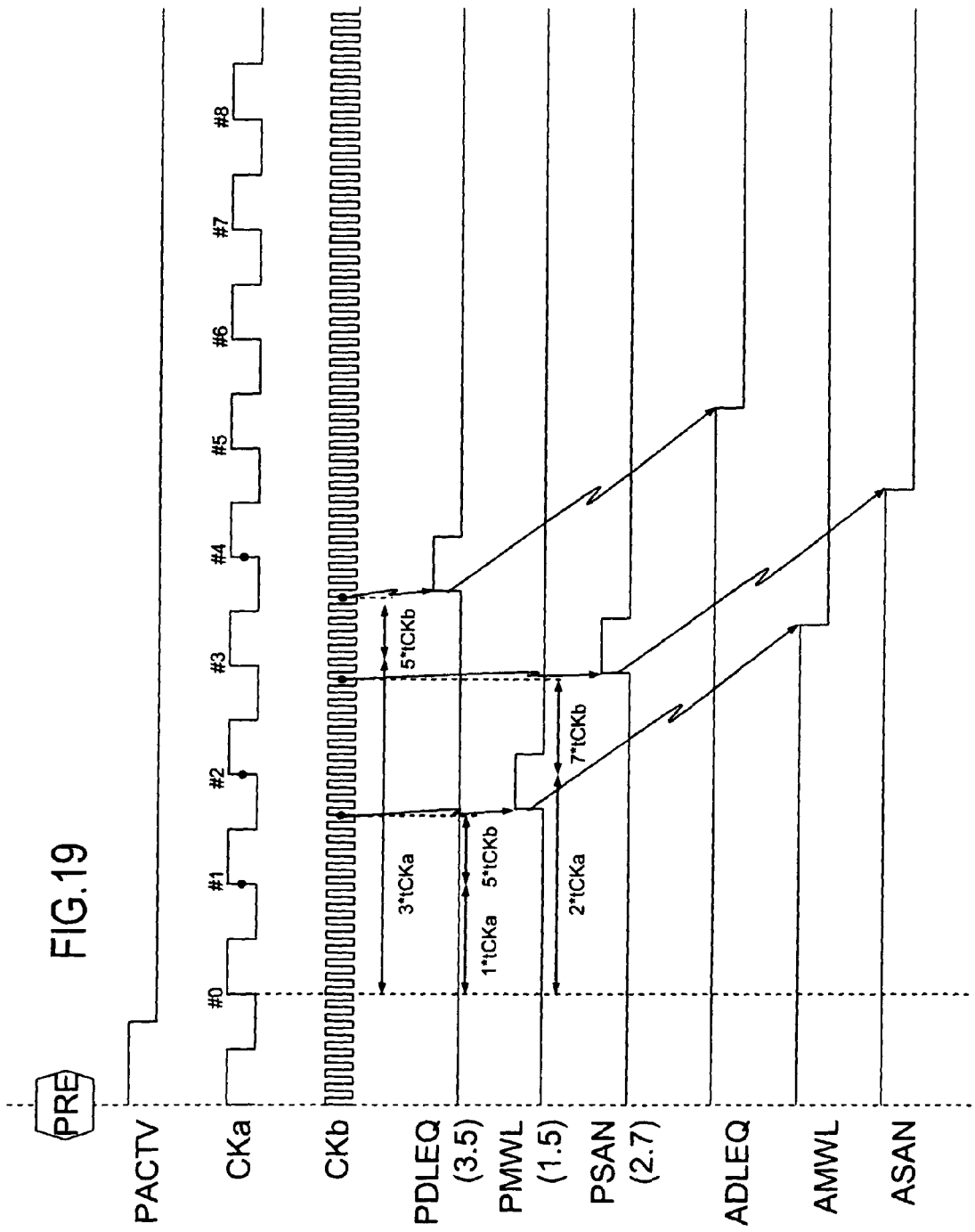
FIG. 19 is a timing diagram showing an operating waveform in case respective timing signals are generated using the timing generator according to an Example of the present invention.

FIG. 19 shows an instance of a waveform of the precharge operation in case the timing signals are generated by the timing generator of the present Example.

On receipt of a precharge command PRE, the activation signal PACTV is negated.

Then, at a desired timing, that is, after lapse of 1·CKa clock time as counted from #0 of the clock CKa immediately after negation of the activation signal PACTV plus 5·CKb, a word line timing signal PMWL is supplied to the array logic AL1. This timing signal is delivered via main word driver MWD as word line timing signal AMWL to the memory array to deactivate a word line.

The sense amplifier timing signal PSAN is then delivered to the array logic AL2 after lapse of 2·CKa clock time, as counted from the clock #0, plus 7·CKb clock time, and is delivered as sense amplifier timing signal ASAN to the memory array to deactivate the sense amplifier.

Finally, after time lapse of 3·CKa clock time plus 5·CKb clock time, the precharging timing signal is delivered to the array logic AL0, under similar control, to activate the precharge circuit within the array.

With the timing generator of the present Example, it is thus possible to start various timing control signals with the values as set in the timing register. Thus, the timing margin within the DRAM may be suppressed to a necessary minimum value, thereby shortening the access time within the DRAM.

Figure 20:
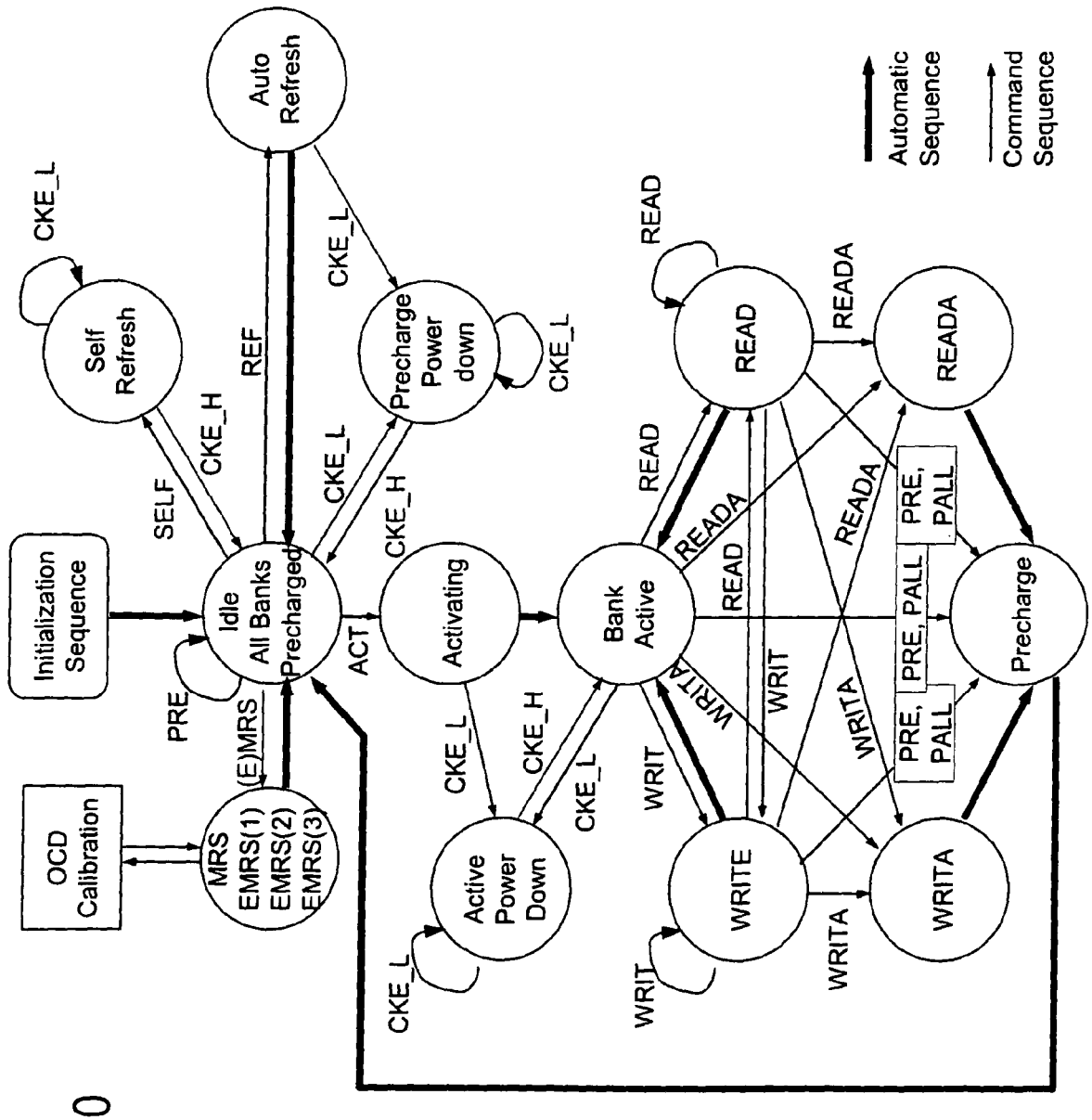
FIG. 20 is a schematic view showing an illustrative status transition of a DRAM chip according to an Example of the present invention.

FIG. 20 shows a typical state transition diagram of a DRAM of the present Example. Only by way of illustration, the DRAM includes the following states:

(a) an initialization sequence;
(b) on-chip driver (OCD) calibration;
(c) a mode register set MRS, EMRS(1), EMRS(2) and EMRS (3);
(d) a self-refresh mode;
(e) an idle state;
(f) all banks precharged;
(g) auto-refresh;
(h) a precharge power down mode;
(i) an active command inputting state (activating);
(j) active power down;
(k) bank active;
(l) read;
(m) write;
(n) read all (READA);
(o) write all (WRITA); and
(p) precharge.

In FIG. 20, thick arrows indicate an automatic sequence. These indicate that, for example, if a read command READ is delivered in the bank active state, reversion is made automatically to the bank active state.

In FIG. 20, thin arrows indicate a command sequence, indicating that no transition occurs except if various commands are delivered.

Only by way of illustration, the command sequence includes the following:
 a precharge command (PRE);
 a precharge all command (PALL);
 a self refresh command (SELF);
 a mode register command (EMRS);
 an auto-refresh command (REF);
 an activate command (ACT);
 a read command (READ);
 a read all command (READA);
 a write command (WRITE);
 a write all command (WRITA); and
 a clock enable command (CKE_H, CKE_L).

Since details of the internal operations in the fundamental states are approximately the same as those of Non-Patent Document 1, the detailed description with the aid of the operating waveforms is dispensed with.

Figure 21:
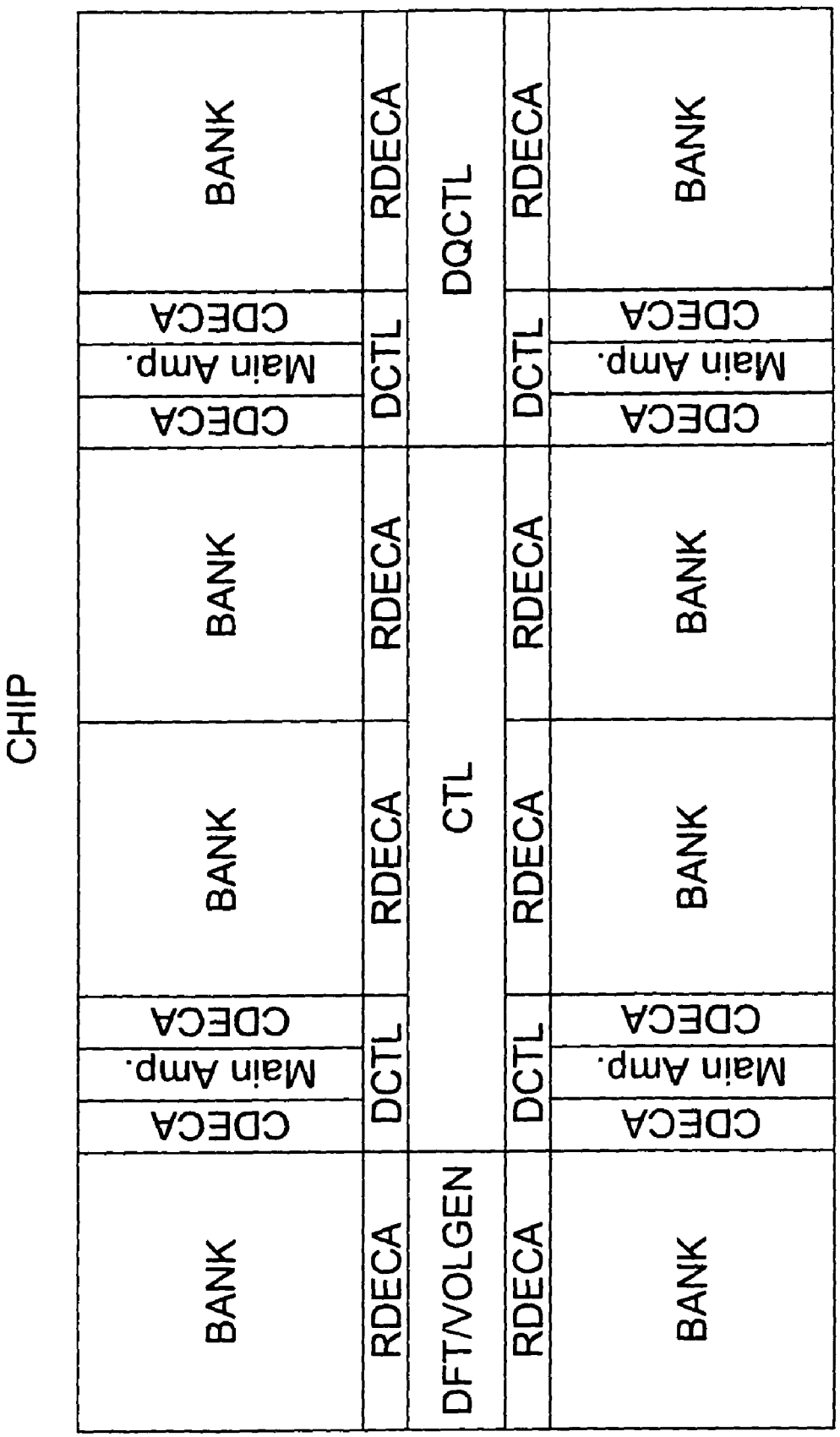
FIG. 21 is a diagram showing an illustrative overall configuration of a DRAM chip according to an Example of the present invention.

FIG. 21 shows an illustrative configuration of a chip of a semiconductor memory according to an exemplary embodiment of the present invention. It is noted that the semiconductor memory shown in FIG. 21 is a DRAM device.

Referring to FIG. 21, the memory chip (CHIP) is roughly divided into a control circuit (CTL), an input and output circuit (DQCTL), a memory bank (BANK), a test circuit (DFT), a power supply circuit (VOLGEN), a data control circuit (DCTL), a row decoder array (RDECA), a column decoder array (CDECA) and a main amplifier (Main Amp).

Clocks, addresses and control signals are supplied from the memory chip (CHIP) to the control circuit (CTL) to decide on operating modes of the memory chip (CHIP) or to pre-decode the addresses.

The input and output circuit (DQCTL) includes e.g. an input and output buffer and receives write data from outside the memory chip (CHIP) to deliver read data to outside.

The memory bank (BANK) includes a plurality of sub-arrays (SARY) arranged like arrays. Sense amplifier arrays (SAA_L, SAA_R), sub-word driver arrays (SWDA_U, SWDA_D) and a cross-area (IS) are arranged therearound. On the outer perimeter of and within the memory bank (BANK), the column decoder array (CDEC) and a main amplifier (Main Amp) are arranged parallel to the sense amplifier array (SAA). A row decoder (RDEC) and an array control circuit (ARAC) are arranged parallel to a sub-word driver array (SWDA).

Figure 23:
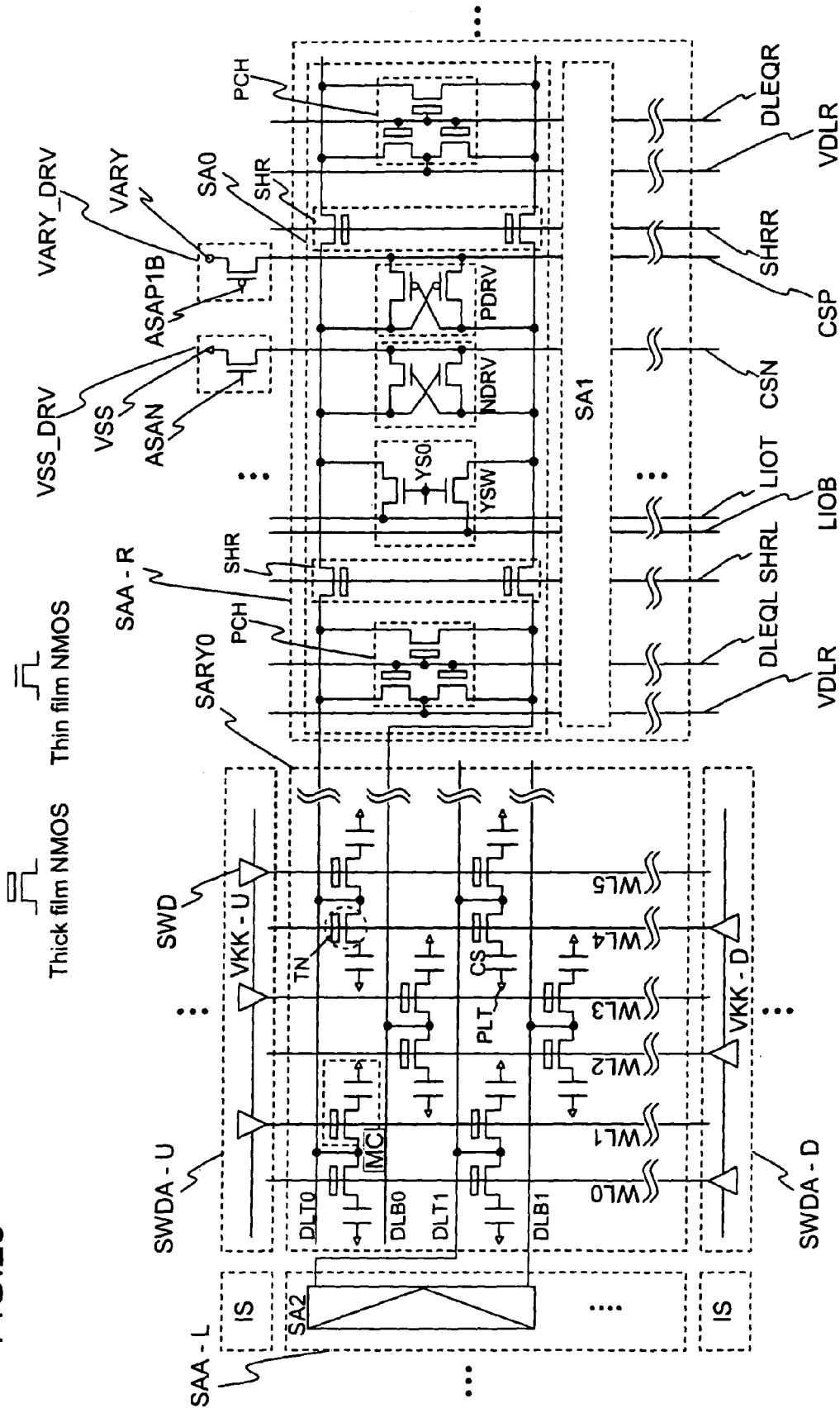
FIG. 23 is a diagram showing a circuit arrangement of the sense amplifier, sub-array and the cross-area of FIG. 22.

FIG. 23 shows a typical circuit diagram of the sub-arrays (SARY), sense amplifier arrays (SAA_L, SAA_R), sub-word driver arrays (SWDA_U, SWDA_D) and the cross-area (IS).

Referring to FIG. 23, the sense amplifier array (SAA_R) includes a sense amplifier circuit (SA0), a pull-down circuit (NDRV), a pull-up circuit (PDRV), a column switch (YSW), a precharge circuit (PCH) and a shared switch (SHR).

Other constituents are: a common source line (CSN) of the pull-down circuit NDRV, a common source driver (VSS_DRV) that drives the pull-down circuit NDRV, a sense amplifier timing signal (ASAN) that controls the common source driver (VSS_DRV), a common source line (CSP) of the pull-up circuit PDRV, a common source driver (VSS_DRV) that drives the pull-up circuit PDRV, a sense amplifier timing signal (ASAP1B) that controls a common source driver VARY_DRV, shared switch control lines (SHRR, SHRL), a column switch control line (YS0), a local input and output line (LIOT, LIOB), a precharge voltage (VDLR), precharge timing signals (DLEQL, DLEQR), a ground voltage (VSS), a data line High level voltage (VARY), sense amplifier circuits (SA1, SA2), sense amplifier arrays (SAA-R, SAA-L), a sub-word driver (SWD), sub-word driver arrays (SWDA-U, SWDA-D), negative voltages (VKK-U, VKK-D), data lines (DLT0, DLT1, DLB0, DLB1), sub-word lines (WL0, WL1, WL2, WL3, WL4, WL5), a memory cell (MC), an access transistor (TN), a cell capacity (CS), a plate electrode (PLT), a thick-film NMOS transistor (Thick film NMOS) and a thin-film NMOS transistor (Thin film NMOS).

It should be noted that a part of the constituent circuits and interconnections, including the precharge circuit of common source lines or local input and output lines LIOT1 and LIOB1, is omitted for convenience in formulating the drawing. In addition, the method for controlling the circuits is similar to that of a routine DRAM and hence the description thereof is omitted.

For example, in precharging, the data line pairs (DLT, DLB, LIOT and LIOB) are precharged to a precharging voltage VARY/2 (VDLR).

In operation, it is sufficient to exercise control to amplify a signal read out from the memory cell (MC) connected to the activated word line WL, by the sense amplifier circuit (SA), and to transfer the so amplified signal via column switch (YSW) to the local input and output line (LIOT, LIOB).

Figure 22:
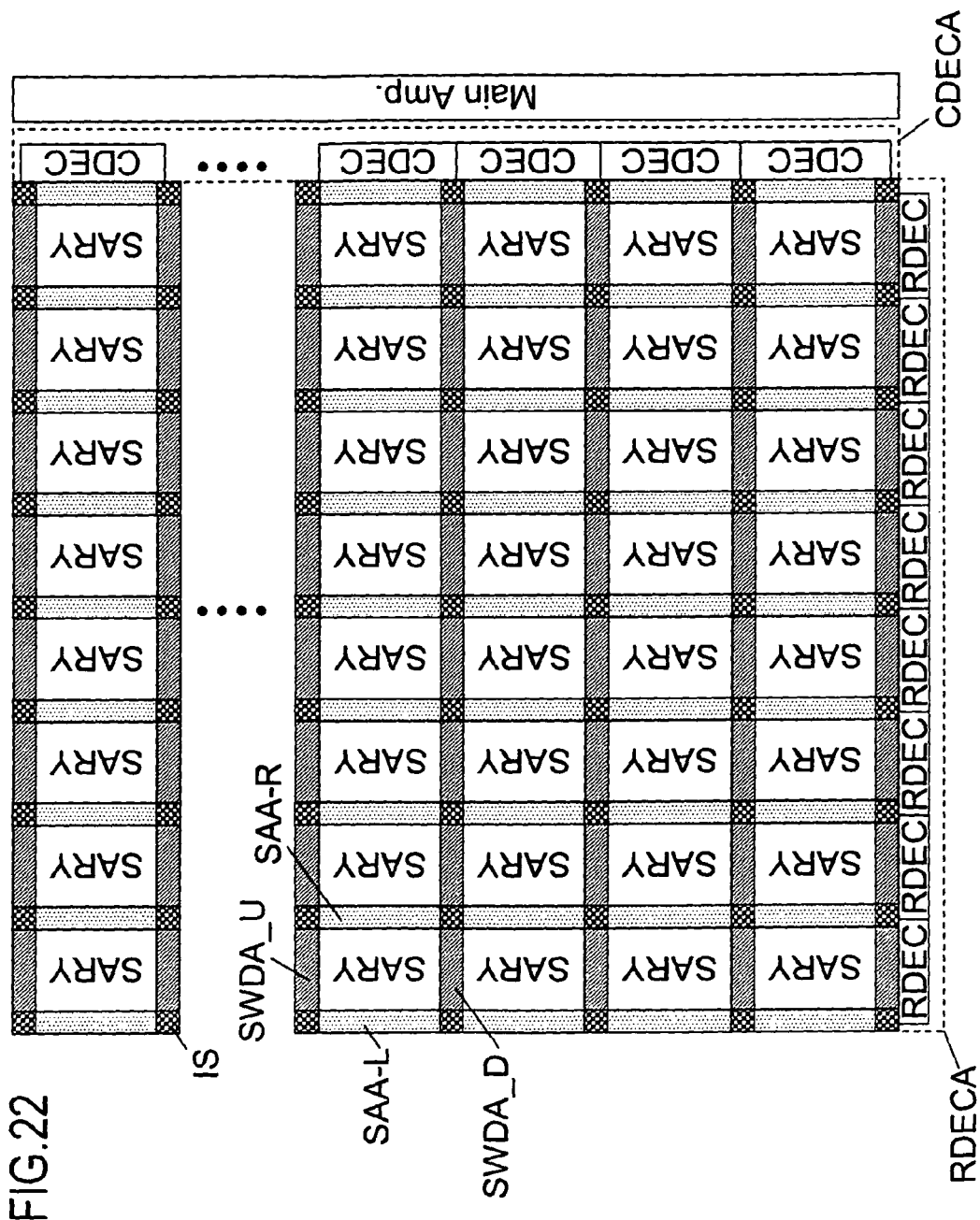
FIG. 22 is a diagram showing an illustrative configuration of a memory bank and a control circuit section of the DRAM chip shown in FIG. 21.
Figure 24:
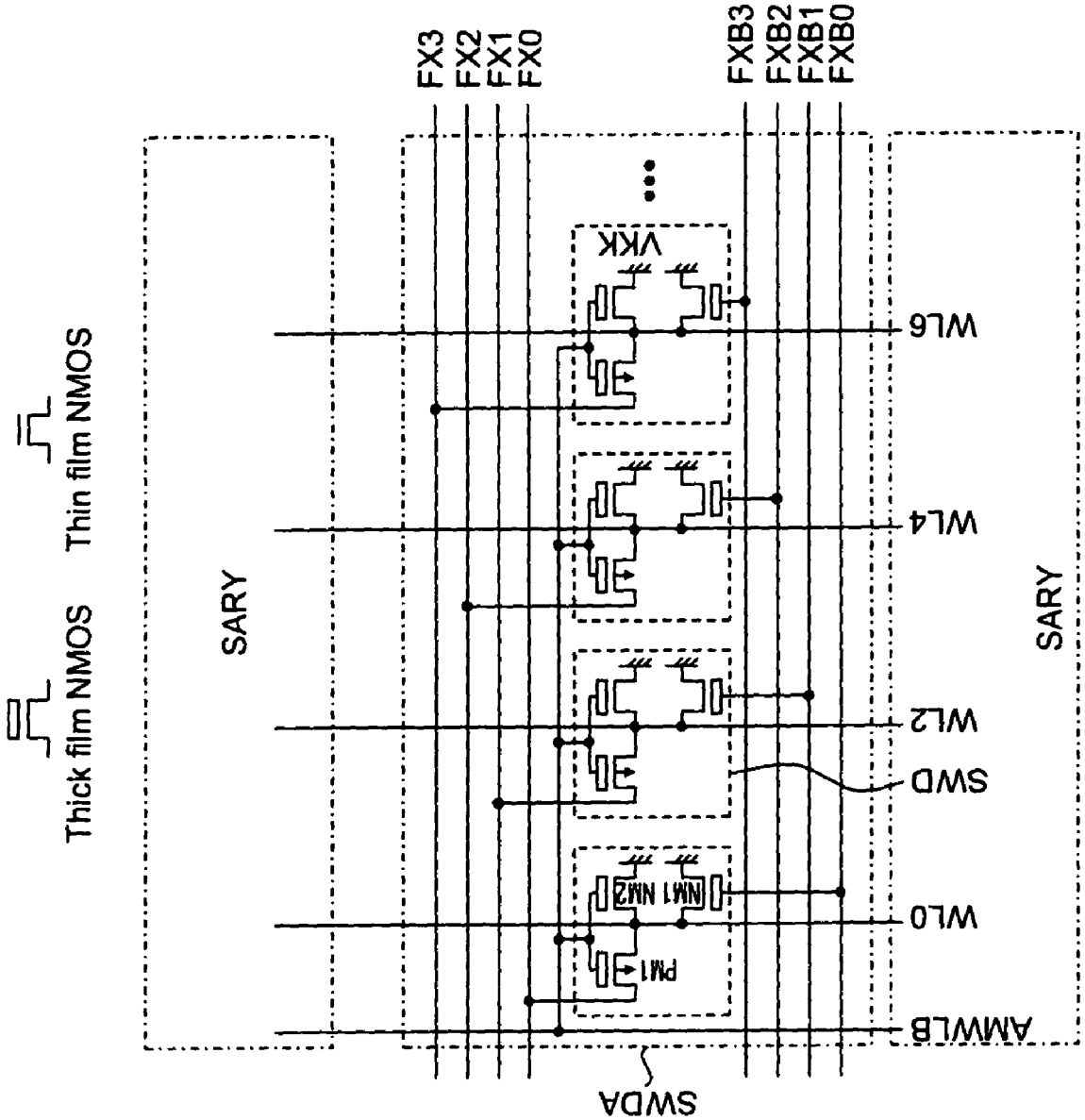
FIG. 24 is a diagram showing a schematic circuit arrangement of a sub-word driver array of FIG. 22.

FIG. 24 depicts a circuit diagram showing a typical configuration of a sub-word driver array in the configuration of the memory bank (BANK) of FIG. 22.

Referring to FIG. 24, the sub-word driver array (SWDA) is made up of a plurality of sub-word drivers (SWD), and is arranged on the periphery of the sub-array (SARY).

The sub-word drivers (SWD) drive word lines (WL) in the sub-arrays (SARY) arranged on its both sides.

Meanwhile, as explained with reference to FIG. 23, the sub-word driver arrays (SWDA) are arrayed in alternation with the sub-arrays (SARY). Hence, every two sub-word lines WL in the sub-array (SARY) are connected to left and right sub-word drivers (SWD).

Each sub-word driver (SWD) is made up by two N-channel MOS transistors (NM1, NM2) and one P-channel MOS transistor (PM1).

The N-channel MOS transistor NM2 has a gate connected to a main word line AMWLB, while having a drain connected to the sub-word line WL and having a source connected to a negative voltage VKK.

The N-channel MOS transistor NM1 has a gate connected to complementary word driver selection lines FXB, has a drain connected to the word line WL and has a source connected to a negative voltage VKK. This negative voltage VKK generated by a negative voltage generating circuit is lower than VSS.

The P-channel MOS transistor PM1 has a gate connected to a main word line MWLB, has a drain connected to the word line WL and has a source connected to a sub-word driver selection line FX. On each sub-word driver selection line SWDA are arranged four sub-word driver selection lines FX0 to FX3 and FXB0 to FXB3 which are complementary signal lines of FX0 to FX3, respectively. One of four sub-word drivers SWD, as selected by one main word line MWLB, is selected for activating a sole sub-word line WL.

Figure 25:
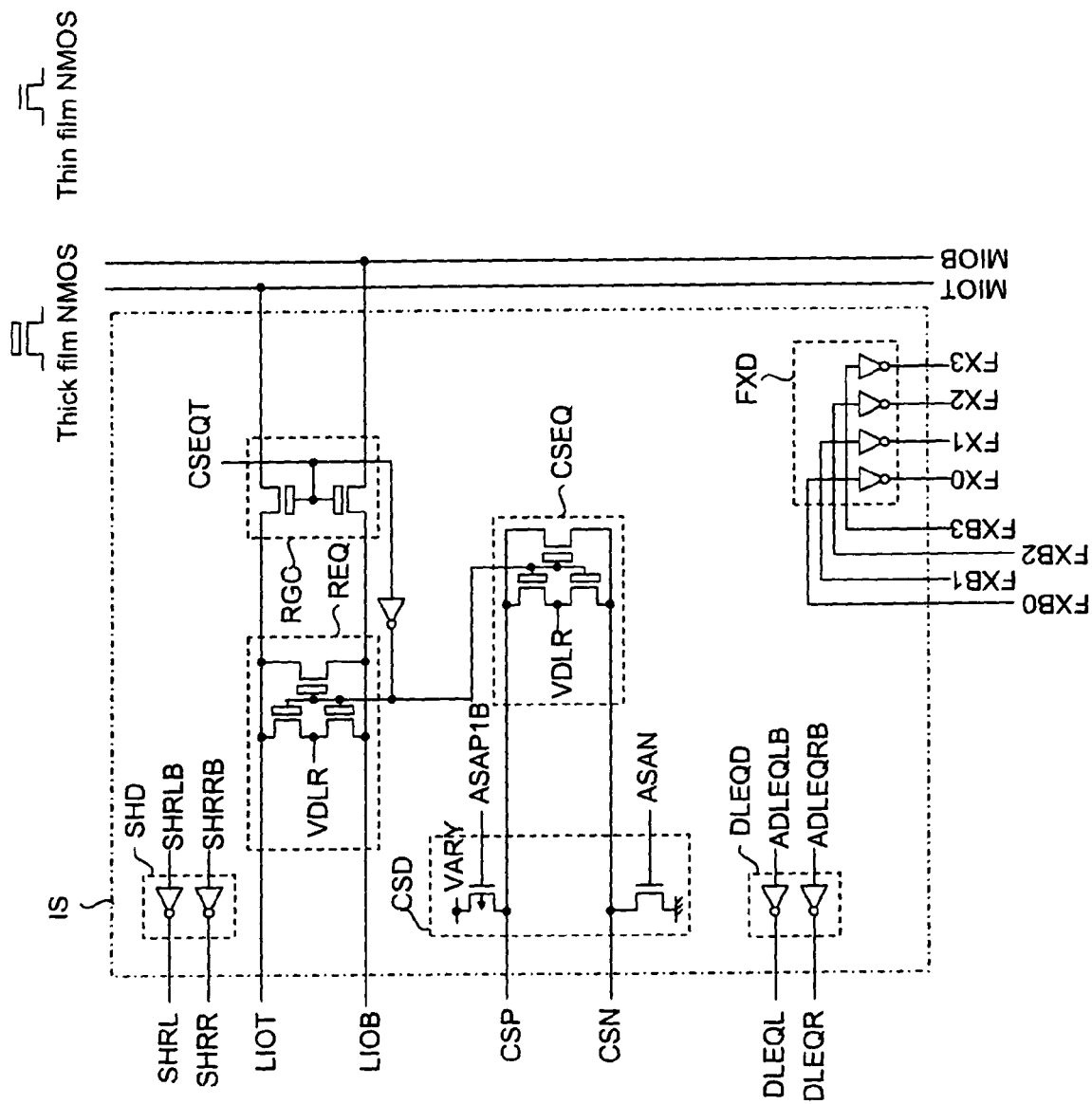
FIG. 25 is a diagram showing a schematic circuit arrangement of the cross-area of FIG. 22.

FIG. 25 shows a circuit configuration of an illustrative configuration of the cross-area (IS) in the semiconductor memory shown in FIG. 22. Referring to FIG. 25, the cross-area (IS) includes shared switches (SHRL, SHRR), a shared switch driver (SHD), a precharge timing signal driver (DLEQD), a local input and output line (LIOT/LIOB), a precharge circuit (REQ), a read and write gate (RGC), common source lines (CSN, CSP), a common source driver (CSD), a common source line precharge circuit (CSEQ) and an FX driver (FXD).

The shared switch driver (SHD) receives complementary signals (SHRLB, SHRRB) of the shared switch control lines (SHRL, SHRR) to output inverted versions thereof.

The precharge circuit for the local input and output line (REQ) pre-charges the local input and output line pair (LIOT/LIOB) to the voltage VDLR in case a common source equalizing signal CSEQT is in deactivated state of the VSS level.

The read and write gate (RGC) interconnects the local input and output line pair (LIOT/LIOB) and a main input and output line pair (MIOT/MIOB) when the common source equalizing signal CSEQT is in activated state voltage VCL. This voltage VCL is of the same level as the external VCC or a level lower than it and is used as a power supply for peripheral circuits.

When the N-side sense amplifier timing signal ASAN is in activated state, the common source driver (CSD) drives the common source line CSN to the grounding potential VSS. When the P-side sense amplifier timing signal SAP1B is in activated state (VSS level), the common source driver (CSD) drives the P-side common source line CSP to the voltage VARY ('H' level of bit line).

When the common source equalizing signal is deactivated, the common source line precharge circuit (CSEQ) precharges the P-side common source line CSP and the N-side common source line CSN to VARY/2 (VDLR).

The precharge timing signal driver (DLEQD) receives complementary signals (DLEQLB, DLEQRB) of the precharge timing signals (DLEQL, DLEQR) to output inverted versions thereof.

The FX driver (FXD) receives the signal FXB to output its complementary signal to a sub-word driver selection line (FX line).

FIG. 26A shows a planar layout of the sub-array (SARY), shown in FIG. 22, and the sense amplifier arrays (SAA-R, SAA-L) connected thereto.

Referring to FIG. 26A, the access transistor (TN) is made up of the sub-word line (WL) and the diffusion layer (ACT), and a cell capacitor (CS) includes a storage node (SN) and a plate electrode (PLT). There are provided a cell contact (SNCNT) for connecting the diffusion layer (ACT) to an overlying interconnection or contact, a bit line contact (DL-CNT) for interconnecting the data line pair (DLT, DLB) and the diffusion layer (ACT), and a landing pad (LPAD).

The landing pad (LPAD) is a contact that interconnects the storage node (SN) and the cell contact (SNCNT). The position of the cell capacitor (CS) can be optimized, and hence the cell capacitor (CS) may be increased in its surface area. If a sufficient capacity of the cell capacitor (CS) is assured, it is of course not mandatory to use the landing pad (LPAD). The number of process steps may then be reduced to lower the cost.

The layout of the memory cell MC may be varied in many ways, as shown in FIGS. 26A to 26D.

FIG. 26A shows a so-called folded data line architecture in which, since the shape of the diffusion layer (ACT) is a simple rectangle, there is an advantage that miniaturization may be facilitated.

FIG. 26B shows a pseudo-folded data line architecture which differs from the structure of FIG. 26A in that the diffusion layer ACT is laid out obliquely with respect to the sub-word line WL. Since this allows effectively increasing the channel width, the on-current of the access transistor TN may be increased to advantage. Thus, by combining the memory cell structures of the present Example, it is possible to accomplish a semiconductor memory capable of performing faster operations.

FIGS. 26C and 26D show open data line architectures. With the open data line architecture, as compared to the folded data line architecture, it is possible with advantage to reduce the cell area.

With the layout configuration with a broad data line pitch, shown in FIG. 26C, it is also possible to reduce a data line parasitic capacitance. Thus, by combining the layout configuration with the memory cell structure of the present Example, it is possible to accomplish a semiconductor memory of higher integration capable of performing an operation at lower voltages.

With the layout configuration of FIG. 26D, the cell area may be made smaller than with FIG. 26C. Thus, by combining the layout configuration with the memory cell structure of the present Example, it is possible to accomplish a semiconductor memory of higher integration. Of course, the layout that may be applied to the memory cell structure of the present Example is not limited to those shown above.

For example, the diffusion layer (ACT), laid out obliquely relative to the sub-word line (WL), may be laid out at right angles thereto, as shown in FIG. 26A. In this case, there may be obtained an advantage that the diffusion layer (ACT) has a rectangular shape to render miniaturization easier.

By way of a possible modification, a diffusion layer (ACT) may be shared by the left and right side neighboring cells on the sub-word lines (WLA), and the low level VSS may be applied at all times to the sub-word lines (WLA) to achieve device isolation. Since it is then unnecessary to form a device isolation area of an insulating material in a direction parallel to the data lines, it is possible to reduce the number of process steps to lower the cost.

The memory cell structure may be modified in many ways, as discussed above.

Figure 27:
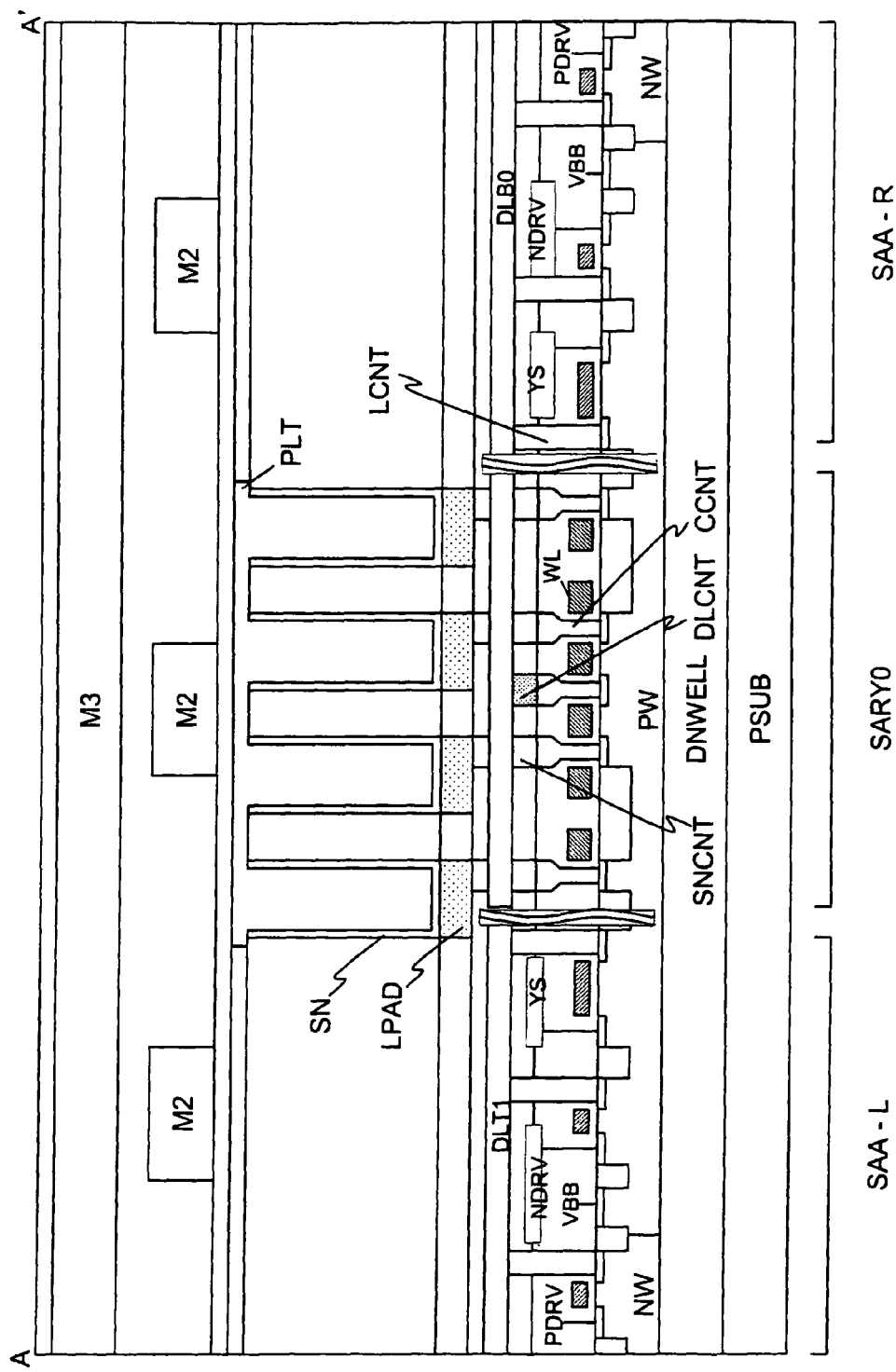
FIG. 27 is a cross-sectional view of the layout of FIG. 26.

FIG. 27 depicts a partial cross-sectional view of a plurality of memory cells (MC) and the sense amplifier circuit (SA0). In this figure, M2 denotes an interconnect layer of a second layer, M3 an interconnect layer of a third layer, PW a P-well substrate, NW is an N-well substrate, DNWELL is a deep N-well substrate, and PSUB is a P-type substrate.

It should be noted that the method for preparing these layers or substrates is similar to that of a routine semiconductor memory, in particular a so-called general-purpose DRAM, and hence the detailed description is dispensed with. It should also be noted that the structure of the cell capacitor CS is not limited to that shown in the drawing and a variety of changes may be made as by using a crown type capacitor.

There is also no limitation to the number of the interconnect layers. The DRAM chip of the present Example may be formed using an interconnect layer M4 which is a fourth layer. Since the fourth interconnect layer may then be used as the global input and output line or the power supply line, it is possible to relax pitch requirements of the second and third interconnect layers and hence to achieve a DRAM chip of higher performance.

Figure 28:
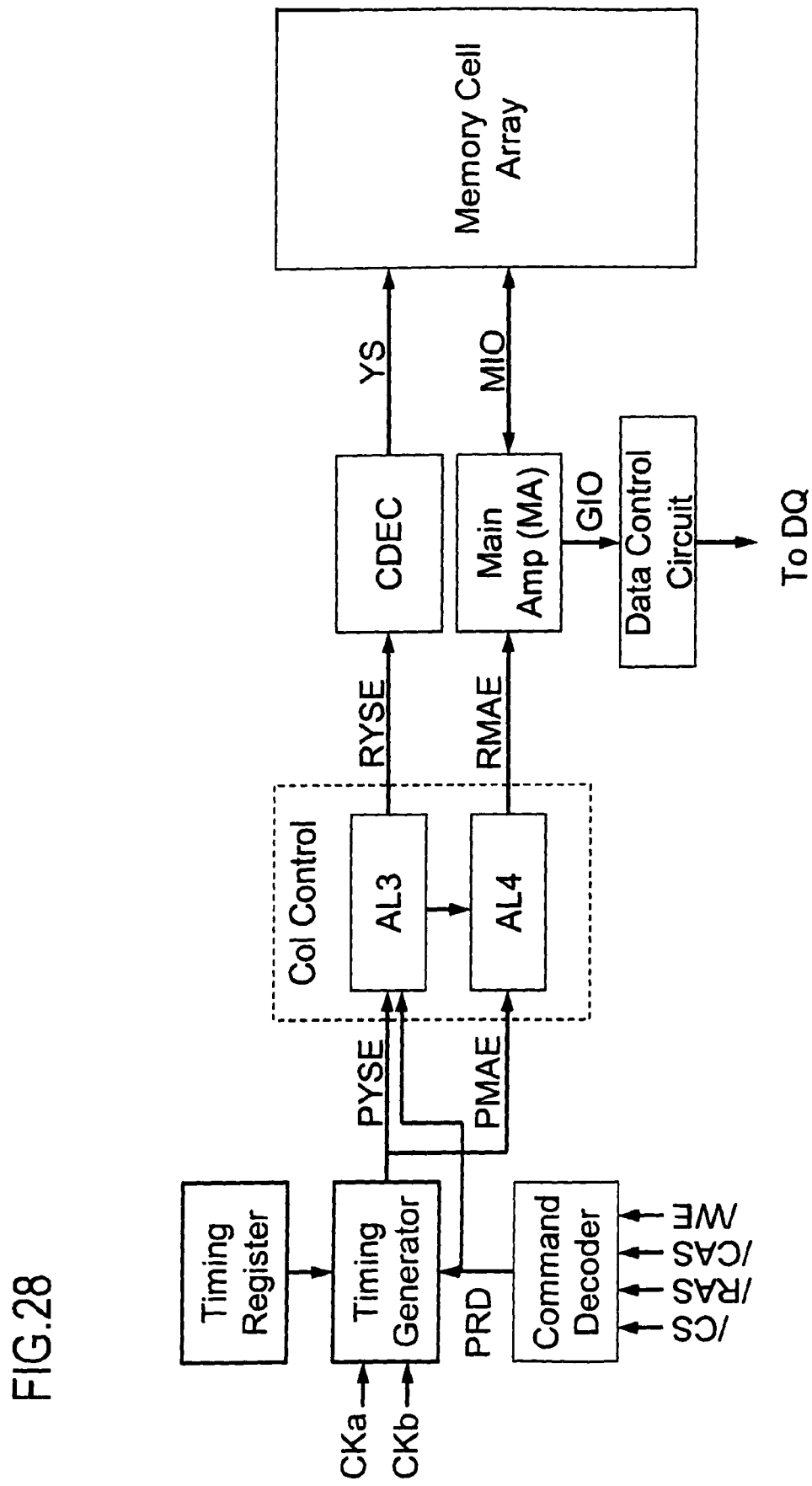
FIG. 28 is a block diagram showing a configuration of a column system block of a DRAM chip employing a timing generator and a timing register according to an Example of the present invention.

FIG. 28 shows a DRAM circuit made up of a timing generator, a timing register, part of a control circuit (CTL) and a memory cell array. The timing register controls the timing generator.

A command issued by the command decoder, such as a read signal PRD, is supplied to the timing generator of the present invention, and generates various timing control signals, such as a column decoder timing signal PYSE or a main amplifier timing signal PMAE.

These timing control signals are supplied to the array logics (AL3, AL4) in a column system control circuit (Col Control) and subsequently to the column decoder (CDEC) and the main amplifier (Main Amp).

The timing signal PYSE, supplied to the column decoder (CDEC), is used as an enable signal for the decoding circuit that decodes the column address. The column decoder (CDEC) activates one selected column address (column switch) YS which is supplied to the memory cell array.

The timing signal RMAE, supplied to the main amplifier (Main Amp), is used as an enable signal for the main amplifier (Main Amp) when the column address YS is supplied to the memory cell array and subsequently the read signal from the memory cell, amplified by the sense amplifier, is output via the main input and output line pair (MIOT/MIOB) to the main amplifier (Main Amp).

The internal operation of the column system within the memory array uses the timing control signals, generated by the timing generator of the present Example, and hence is not susceptible to differences in fabrication processes, variations in power supply voltage or changes in temperature, thus resulting in shorter access time. It should be noted that the arrangement of the array logic circuits, timing register setting values at Read time, mode register setting values or the initialization sequence is similar to that described with reference to FIGS. 1 to 15 and FIGS. 17 to 20 and hence detailed description thereof is dispensed with.

Figure 29:
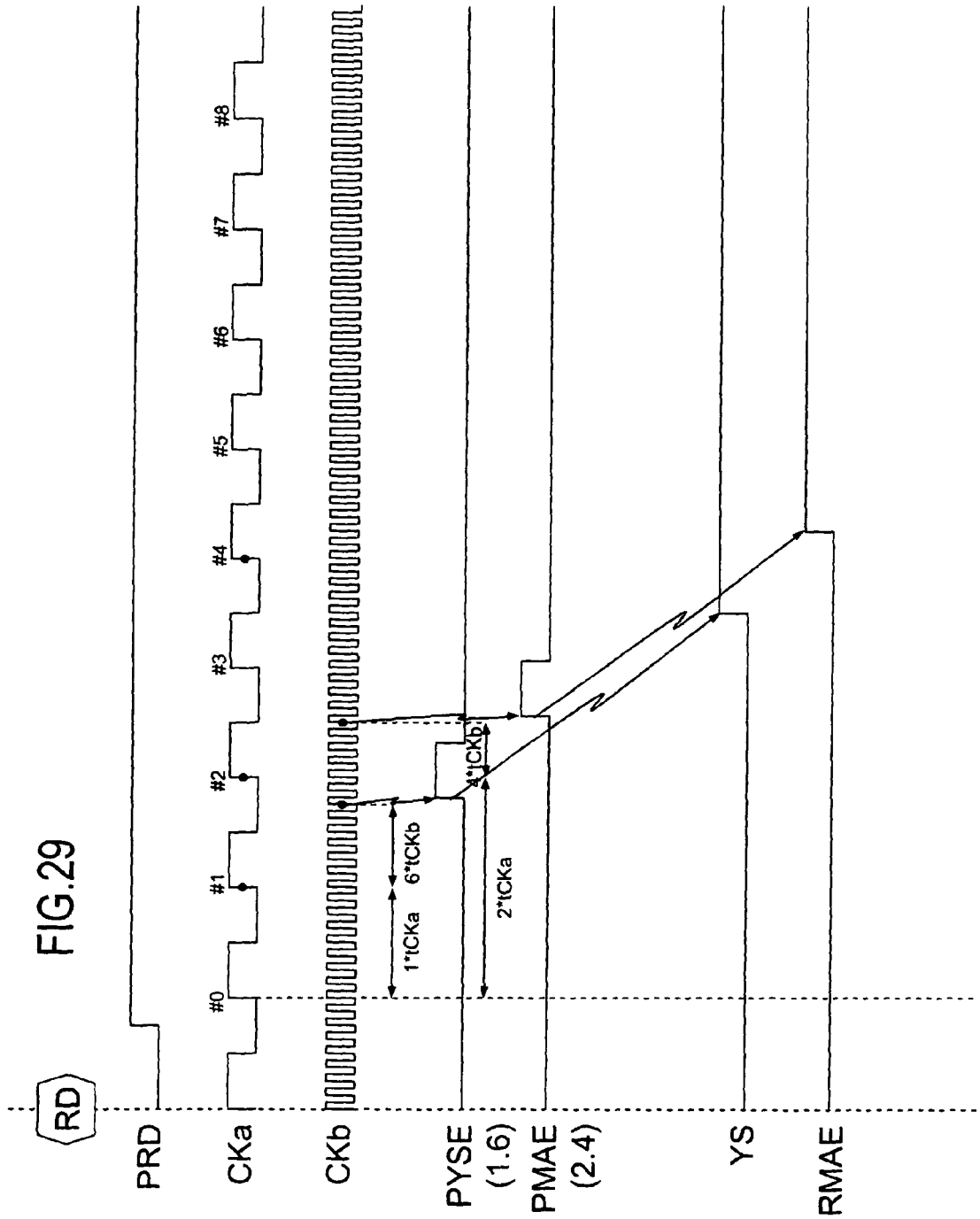
FIG. 29 is a timing diagram at the time of readout of the DRAM chip employing a timing generator and a timing register according to an Example of the present invention.

FIG. 29 shows an operating waveform of the circuit of FIG. 28 at the Read time. In the Example shown in FIG. 29, the operation is that of the respective timing signals under the specifications of 8 clocks for CL. Initially, the Read signal PRD is received by the timing generator. Then, after lapse of time equal to 1·CKa clock as counted from the clock #0 supplied immediately after the reception of the read signal PRD plus 6·CKb clock time, the column decoder timing signal PYSE is output from the timing generator and supplied to the array logic (AL3).

In similar manner, the main amplifier timing signal PMAE is supplied to the array logic (AL4) after lapse of 2·CKa clock time plus 4·CKb clock time.

The respective timing signals are delivered as column address YS to the column decoder (CDEC), while being delivered as the main amplifier timing signal (PMAE) to the main amplifier (Main Amp).

Figure 30:
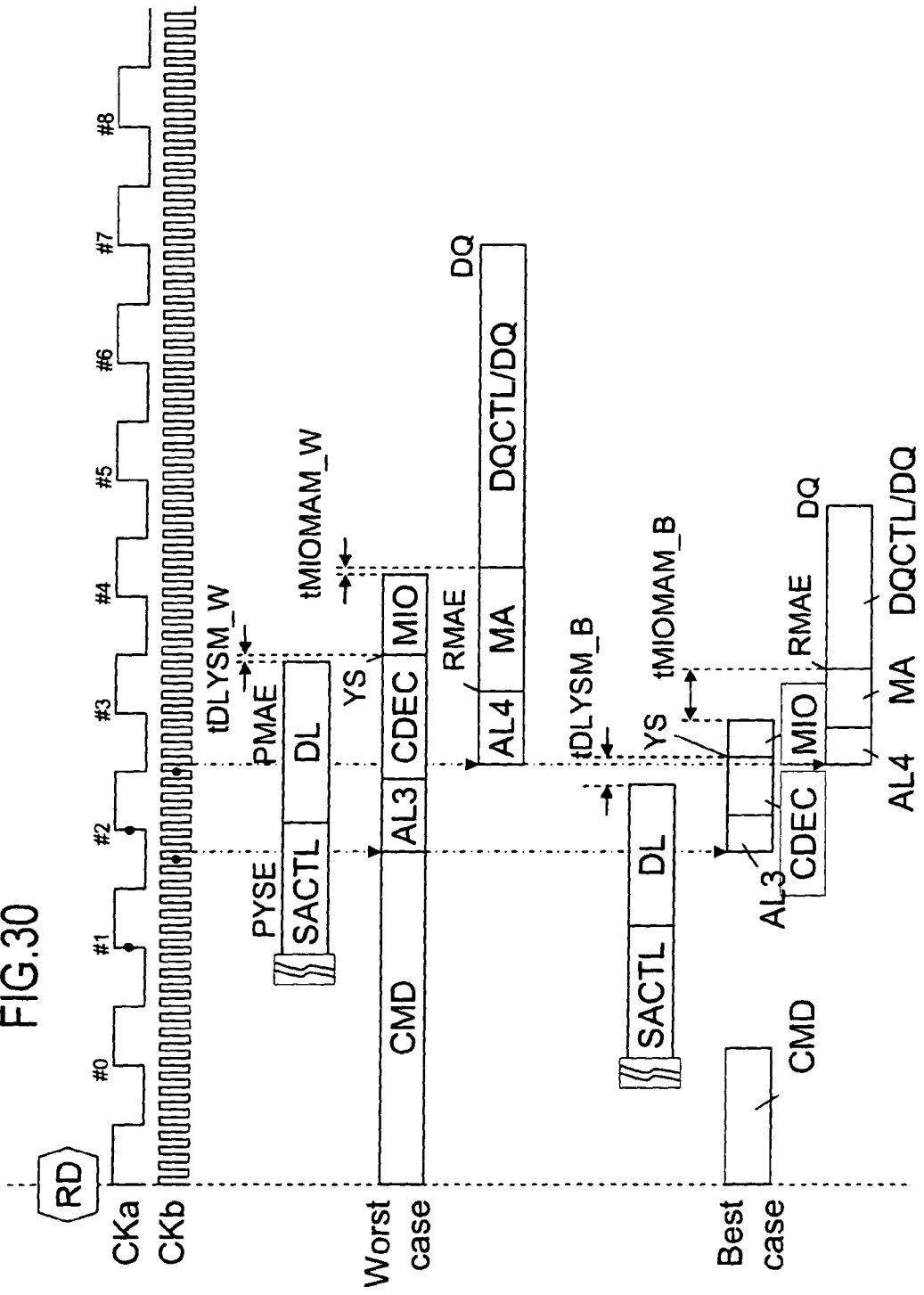
FIG. 30 is a waveform diagram showing an operating timing of various circuit blocks of the column system of the DRAM chip employing a timing generator and a timing register according to an Example of the present invention.
Figure 31:
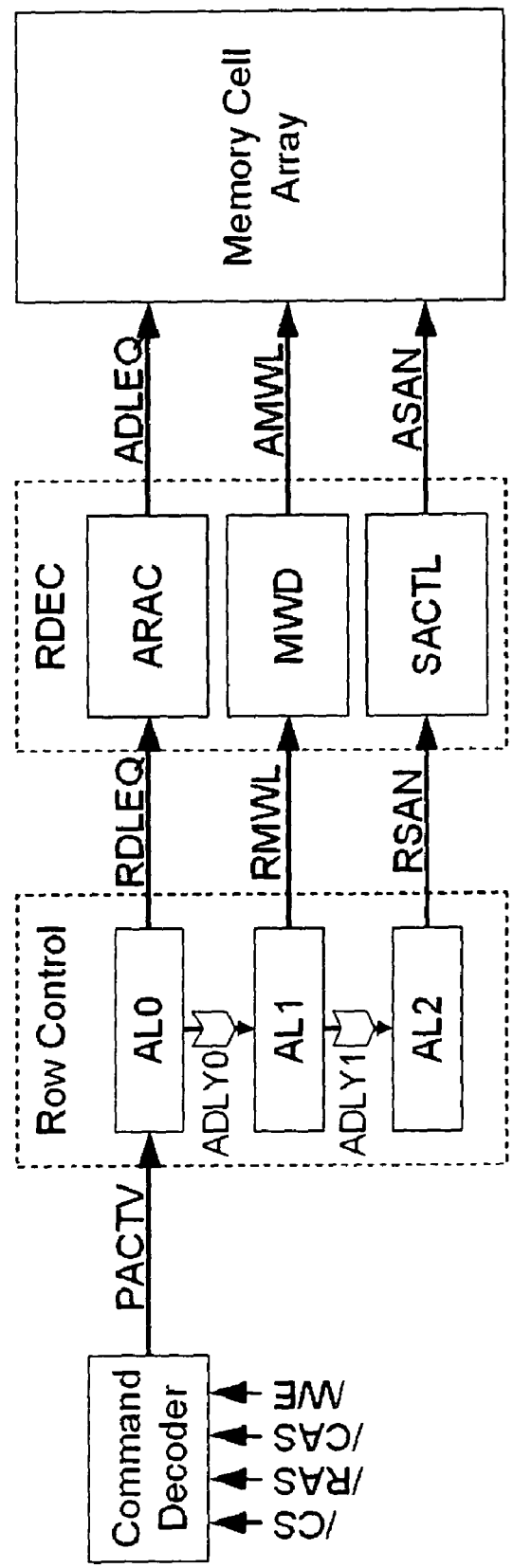
FIG. 31 is a schematic view showing an illustrative timing control of a typical DRAM chip.
Figures 32A, 32B:
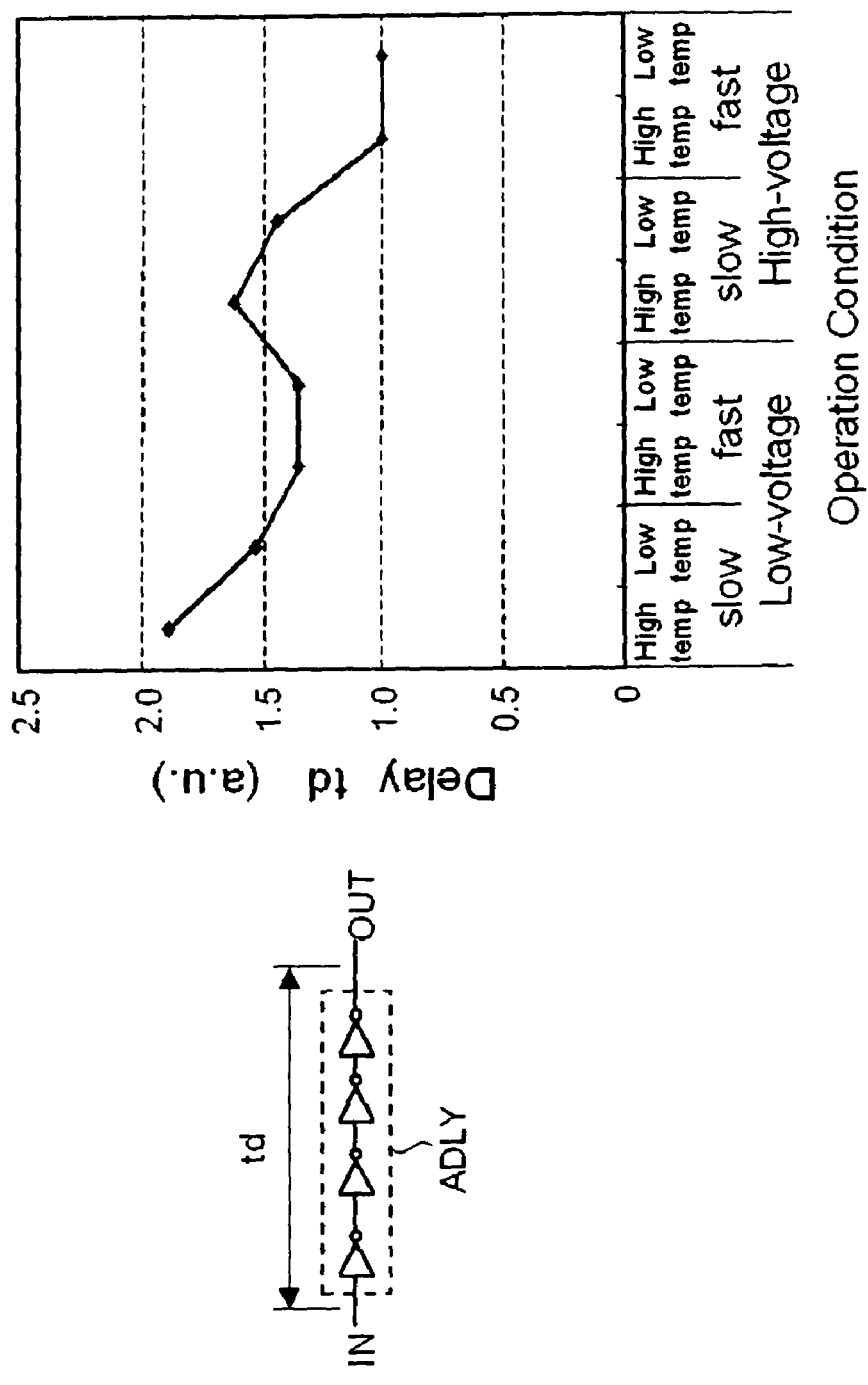
FIG. 32A is a schematic view showing a circuit configuration of an analog delay used in timing control in a typical DRAM.
FIG. 32B is a graph showing a delay time characteristic of the circuit shown in FIG. 32A.
Figure 33:
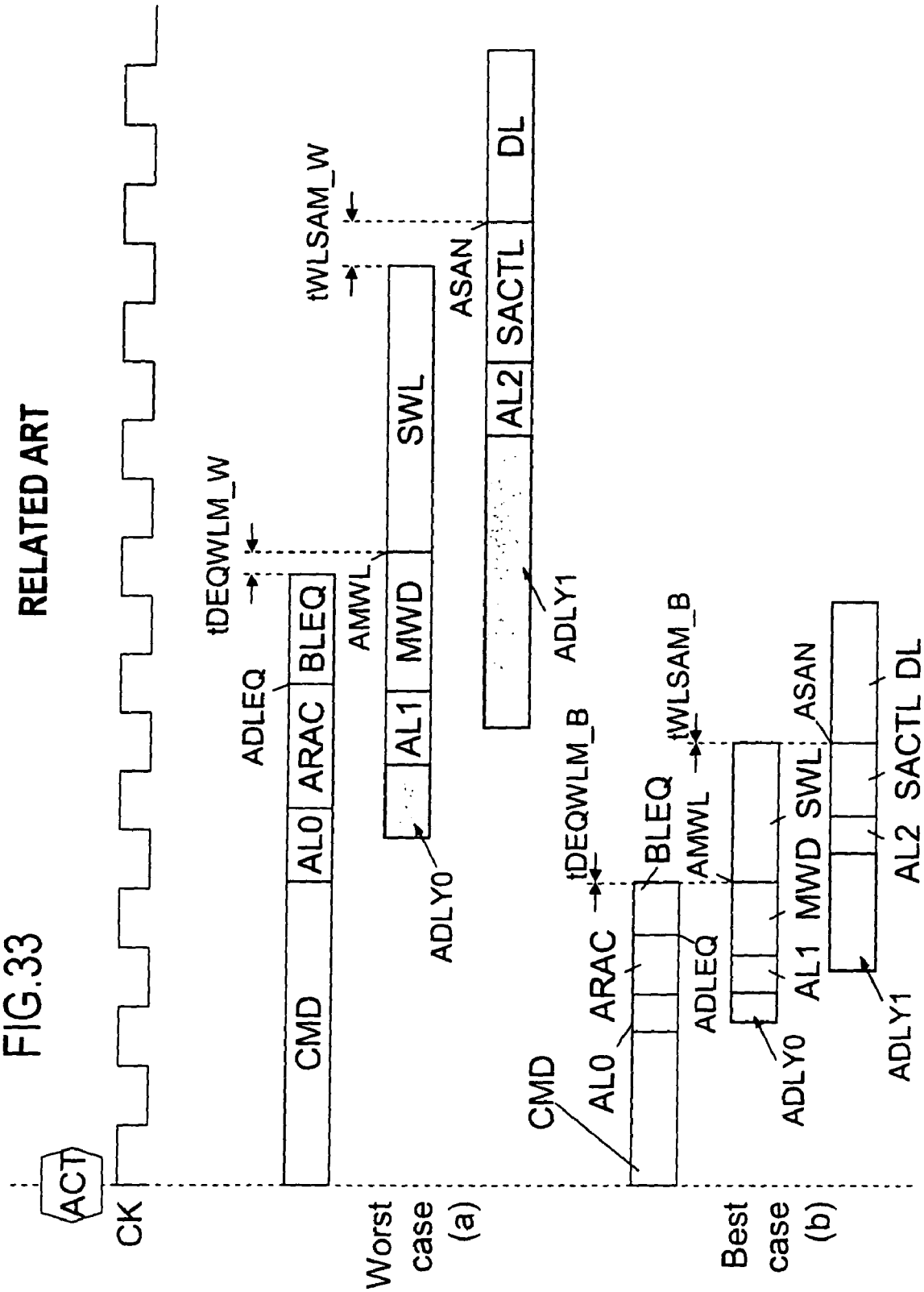
FIG. 33 is a schematic view showing an operating timing of each circuit block of the row system within a chip in timing control of a typical DRAM chip.

FIG. 30 depicts an operating timing of the DRAM circuit block of FIG. 28, in which the operating timings of the command decoder, column system control circuit (Col Control), column decoder (CDEC) and the memory array are plotted on the abscissa. In FIG. 30, MIO indicates the timing since the column address YS is supplied to the memory array until the amplified readout signal is supplied to the vicinity of the main amplifier circuit.

MA denotes time that is to lapse since the main amplifier timing signal RMAE has been delivered until it traverses the logic circuit within the main amplifier circuit to activate the main amplifier circuit.

DQCTL/DQ denotes time that is to lapse for the signal latched by the main amplifier to be transferred via data system control circuit to the DQ pad.

It is noted that FIG. 30 shows two cases, that is, a case where timing designing is made so that the circuitry within the DRAM operates slowest (Worst Case) and a case where a chip timing-designed for the worst case is run under a condition in which the circuitry within the DRAM operates fastest (Best Case).

As may be seen from FIG. 30, with the use of the timing generator of the present Example, the main input and output line-column switch margin tDLYSM_W may be set to the necessary smallest value. It is noted that this main input and output line-column switch margin denotes the margin since the time the readout signal output from the cell is latched by the sense amplifier until activation of the column switch.

In similar manner, the main input and output line-main amplifier margin tMIOMAM_W may also be set to a necessary minimum with the use of the timing generator of the present Example. This main input and output line-main amplifier margin is a margin as from outputting of the readout signal to the vicinity of the main amplifier circuit via the main input and output line until activation of the main amplifier circuit.

As a result, the timing margin may be suppressed to a minimum, thereby shortening the access time of the DRAM (here CL).

With the DRAM chip of the present Example, no mistaken operation occurs even if the DRAM array, timing-designed to the worst case, is run on the best case side. It is because the timing signal has its start timing digitally controlled by a plurality of clocks. Although the operating timing of each circuit block within the DRAM becomes shorter on the best case side, delay time of the timing control signal may not be made shorter because of digital control of the start timing of the timing signal.

Hence, sufficient time margins (tDLYSM_B and tMIOMAM_B) may be assured and effects of variations in production process fluctuations of the power supply voltages or changes in temperature may be minimized, thus accomplishing stabilized readout operations.

The disclosure of the aforementioned Non-Patent Document 1 is incorporated by reference herein. The particular exemplary embodiments or examples may be modified or adjusted within the gamut of the entire disclosure of the present invention, inclusive of claims, based on the fundamental technical concept of the invention. Further, variegated combinations or selection of elements disclosed herein may be made within the framework of the claims. That is, the present invention may encompass various modifications or corrections that may occur to those skilled in the art in accordance with the within the gamut of the entire disclosure of the present invention, inclusive of claim and the technical concept of the present invention.

What is claimed is:

1. A semiconductor device comprising:
a first clock generator generating a first clock signal having a first period, responsive to an input clock signal;
a second clock generator generating a second clock signal having a second period, responsive to the input clock signal; and
a timing generator receiving the first clock signal, the second clock signal, an activation signal and a selection signal that selects the delay time, the timing generator producing a timing signal which is delayed as from the time of activation of the activation signal by a delay corresponding to a sum of a time equal to a preset number prescribed by the selection signal times the first period and a time equal to another preset number prescribed by the selection signal times the second period.

2. The semiconductor device according to claim 1, wherein the timing generator includes:
a coarse delay circuit that receives the first clock signal, the activation signal and a first value m, the coarse delay circuit producing a coarse delay timing signal corresponding to a delay equal to m·T1 as from an effective edge of the first clock signal following the time of activation of the activation signal; and
a fine delay circuit that receives the second clock signal, the coarse delay timing signal from the coarse delay circuit and a second value n, the fine delay circuit producing a fine delay timing signal equal to a delay of n·T2 as from an output timing of the coarse delay timing signal;
where T1 is the first period, T2 is the second period, the first value m is a non-negative integer prescribed by the selection signal and the second value n is another non-negative integer prescribed by the selection signal,
the fine delay timing signal produced by the fine delay circuit with a delay of m·T1+n·T2 as from activation of the activation signal, being the timing signal from the timing generator.

3. The semiconductor device according to claim 1, further comprising:
a control circuit that receives the timing signal, output from the timing generator, to generate a control signal,
the control circuit including:
a flip-flop that samples the activation signal, using the timing signal, output from the timing generator, as a sampling clock;
a delay circuit that delays the activation signal; and
a circuit that delivers an output of the activation signal sampled by the flip-flop, as the control signal, in one operating mode, the circuit delivering the activation signal, delayed by the delay circuit, as the control signal in another operating mode.

4. The semiconductor device according to claim 1, further comprising:
a control circuit that receives the timing signal, output from the timing generator, to generate a control signal,
the control circuit including:
a flip-flop that samples the activation signal, using the timing signal, output from the timing generator, as a sampling clock;
a delay circuit that delays the activation signal;
a first logic circuit that masks an output of the delay circuit based on a preset control signal that controls an operating mode; and
a second logic circuit that receives an output of the flip-flop and an output of the first logic circuit,
wherein, in one operating mode, the first logic circuit masks an output of the delay circuit and when an output of the first logic circuit is set at a preset fixed value, the second logic circuit outputs the activation signal, sampled by the flip-flop with the timing signal, as the control signal, while, in another operating mode, the output of the flip-flop being set at a preset fixed value, the first logic circuit not masking the output of the delay circuit, and the second logic circuit outputs the control signal based on an output of the first logic circuit.

5. The semiconductor device according to claim 1, further comprising:
a control circuit that receives the timing signal, output from the timing generator, to generate a control signal,
the control circuit including
a flip-flop that samples the activation signal, using the timing signal, output from the timing generator, as a sampling clock;
a delay circuit that delays the activation signal;
a first switching circuit that supplies the activation signal to the delay circuit or causes the activation signal to skip the delay circuit, based on a signal that controls the operating mode; and
a second switching circuit that supplies the activation signal received from the first switching circuit to the flip-flop, when the activation signal is caused to skip the delay circuit by the first switching circuit, based on the signal that controls the operating mode,
the second switching circuit delivering the delayed activation signal not via the flip-flop, when the activation signal is supplied by the first switching circuit to the delay circuit.

6. The semiconductor device according to claim 3, wherein the delay circuit includes a plurality of inverters cascade connected.

7. The semiconductor device according to claim 3, wherein the timing generator produces first and second control signals, as the control signals,
the timing generator including the first and second control circuits, as the control circuit,
the first control circuit receiving the activation signal and a first timing signal supplied from the timing generator to produce the first control signal,
the second control circuit receiving the first control signal from the first control circuit, as the activation signal and a second timing signal supplied from the timing generator to produce the second control signal.

8. The semiconductor device according to claim 1, further comprising:
a timing register that stores the selection signal for selecting the delay time, the value of the selection signal being variably set.

9. The semiconductor device according to claim 8, wherein the value of the timing register is set at the time of setting a mode register.

10. The semiconductor device according to claim 1, further comprising:
a circuit that receives the timing signal from the timing generator at a clock terminal thereof to sample the activation signal in response to the timing signal, the timing signal output from the timing generator being used as a control signal needed for activation.

11. The semiconductor device according to claim 1, further comprising:
- a memory array including a plurality of memory cells at intersections of a plurality of bit lines and a plurality of word lines, the timing signal output from the timing generator being used, as a control signal, for at least one of operations of:
- deactivating a precharging circuit for precharging the bit lines;
- activating one of the word line lines; and
- activating a sense amplifier.

12. The semiconductor device according to claim 11, wherein the timing signal output by the timing generator is used as a control signal for read access of the memory array.

13. The semiconductor device according to claim 12, wherein, as the control signal for read access, the timing signal output from the timing generator is used as the control signal for read access for at least one of the operations of activating a column decoder and activating a main amplifier circuit.

14. The semiconductor device according to claim 1, further comprising:
- a delay circuit, a signal delayed by the delay circuit being used in place of the timing signal output by the timing generator to control the timing of an internal operation, when the semiconductor device is in a standby state.

15. The semiconductor device according to claim 14, wherein the delay circuit includes a plurality of inverters cascade connected.

16. The semiconductor device according to claim 11, wherein the access specifications are prescribed based on the input clock signal.

17. The semiconductor device according to claim 1, further comprising:
- a register that controls the timing generator; and
- a circuit that outputs a value of the register to outside the device in a test mode.

18. The semiconductor device according to claim 2, wherein the coarse delay circuit includes:
- a shift register that sequentially transfers a fixed value from a preceding stage to a succeeding stage in response to an input shift clock;
- a gate circuit that receives the first clock signal and the activation signal, the gate circuit transmitting and outputting the first clock signal, when the activation signal is in activated state, while the gate circuit masking the first clock, when the activation signal is in deactivated state, the clock signal output from the gate circuit being used as a shift clock for the shift register; and
- a plurality of switches corresponding to the number of selection signals from a timing register that stores the selection signal for selecting the delay time, the clock signal from the gate circuit being supplied in common to input ends of the switches, output ends of the switches being connected in common to a single node,
- wherein one of the switches selected in association with the first value m of the selection signal stored in the timing register, is turned on, when the fixed value has been shifted to an m'th stage of the shift register associated with the first value m of the selection signal, based on an output of the shift register, in case the activation signal being activated, the clock signal from the gate circuit being output to the node after m cycles which is selected by the selection signal, as from an effective edge of the first clock, to output the coarse delay timing signal.

19. The semiconductor device according to claim 2, wherein the fine delay circuit includes:
- a second shift register that sequentially transfers a fixed value from a preceding stage to a succeeding stage in response to a second shift clock;
- a circuit that activates a second activation signal in response to an output timing of the coarse delay timing signal; and
- a second gate circuit that receives the second clock signal and the second activation signal, the second gate circuit transmitting and outputting the second clock signal, when the activation signal is in activated state, while the second gate circuit masking the second clock signal, when the activation signal is in deactivated state, the clock signal output from the second gate circuit being used as the second shift clock; and
- a second set of a plurality of switches corresponding to the number of selection signals from the timing register, the clock signal from the second gate circuit being supplied in common to input ends of the switches, output ends of which are connected in common to a single node,
- wherein one of the second set switches, selected in association with the second value n of the selection signal from the timing register, being turned on, based on an output of the second shift register, when the fixed value has been shifted to an n'th stage associated with the value of the selection signal of the shift register, the clock signal from the second gate circuit being output to the node after n cycles which is selected by the selection signal, as from an effective edge of the second clock at a time point of activation of the second activation signal to output the fine delay timing signal.

20. A semiconductor memory in which the semiconductor device according to claim 1 constitutes a clock synchronization memory device.

* * * * *